United States Patent
Ritzdorf et al.

(10) Patent No.: US 6,776,892 B1
(45) Date of Patent: Aug. 17, 2004

(54) SEMICONDUCTOR PLATING SYSTEM WORKPIECE SUPPORT HAVING WORKPIECE ENGAGING ELECTRODE WITH PRE-CONDITIONED CONTACT FACE

(75) Inventors: Thomas L. Ritzdorf, Kalispell, MT (US); Jeffrey I. Turner, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 625 days.

(21) Appl. No.: 09/525,930

(22) Filed: Mar. 14, 2000

Related U.S. Application Data

(63) Continuation of application No. 08/940,686, filed on Sep. 30, 1997.

(51) Int. Cl.[7] ............................. C25D 5/02; C25D 7/00; C25D 11/32
(52) U.S. Cl. ...................... 205/118; 205/123; 205/149; 205/157
(58) Field of Search ................................. 205/123, 149, 205/291, 157, 915, 118

(56) References Cited

U.S. PATENT DOCUMENTS

| | | |
|---|---|---|
| 1,308,508 A | 7/1919 | Roedel |
| 3,267,010 A | 8/1966 | Creutz et al. |
| 3,328,273 A | 6/1967 | Creutz et al. |
| 3,770,598 A | 11/1973 | Cruetz |
| 3,832,291 A | 8/1974 | Arcilesi et al. |
| 4,110,176 A | 8/1978 | Creutz et al. |
| 4,118,301 A | 10/1978 | Mayer et al. |
| 4,336,114 A | 6/1982 | Mayer et al. |
| 4,374,709 A | 2/1983 | Combs |
| 5,078,852 A | 1/1992 | Yee et al. |
| 5,167,792 A | 12/1992 | Kamitakahara et al. |
| 5,258,047 A | 11/1993 | Tokisue et al. |
| 5,312,532 A | 5/1994 | Andricacos et al. |
| 5,405,518 A | 4/1995 | Hsieh et al. |
| 5,522,975 A | 6/1996 | Andricacos et al. |
| 5,723,028 A | 3/1998 | Poris |

OTHER PUBLICATIONS

Lowenheim, F.A., Electroplating, (1978), 12 pgs, McGraw–Hill Book Inc., New York.

Primary Examiner—Edna Wong
(74) Attorney, Agent, or Firm—Perkins Coie LLP

(57) ABSTRACT

A semiconductor workpiece holder used in electroplating systems for plating metal layers onto a semiconductor workpieces, and is of particular advantage in connection with plating copper onto semiconductor materials. The workpiece holder includes electrodes which have a contact face which bears against the workpiece and conducts current therebetween. The contact face is provided with a contact face outer contacting surface which is made from a contact face material similar similar to the workpiece plating material which is to be plated onto the semiconductor workpiece. The contact face can be formed by pre-conditioned an electrode contact using a plating metal which is similar to the plating materials which is to be plated onto the semiconductor workpiece.

4 Claims, 38 Drawing Sheets

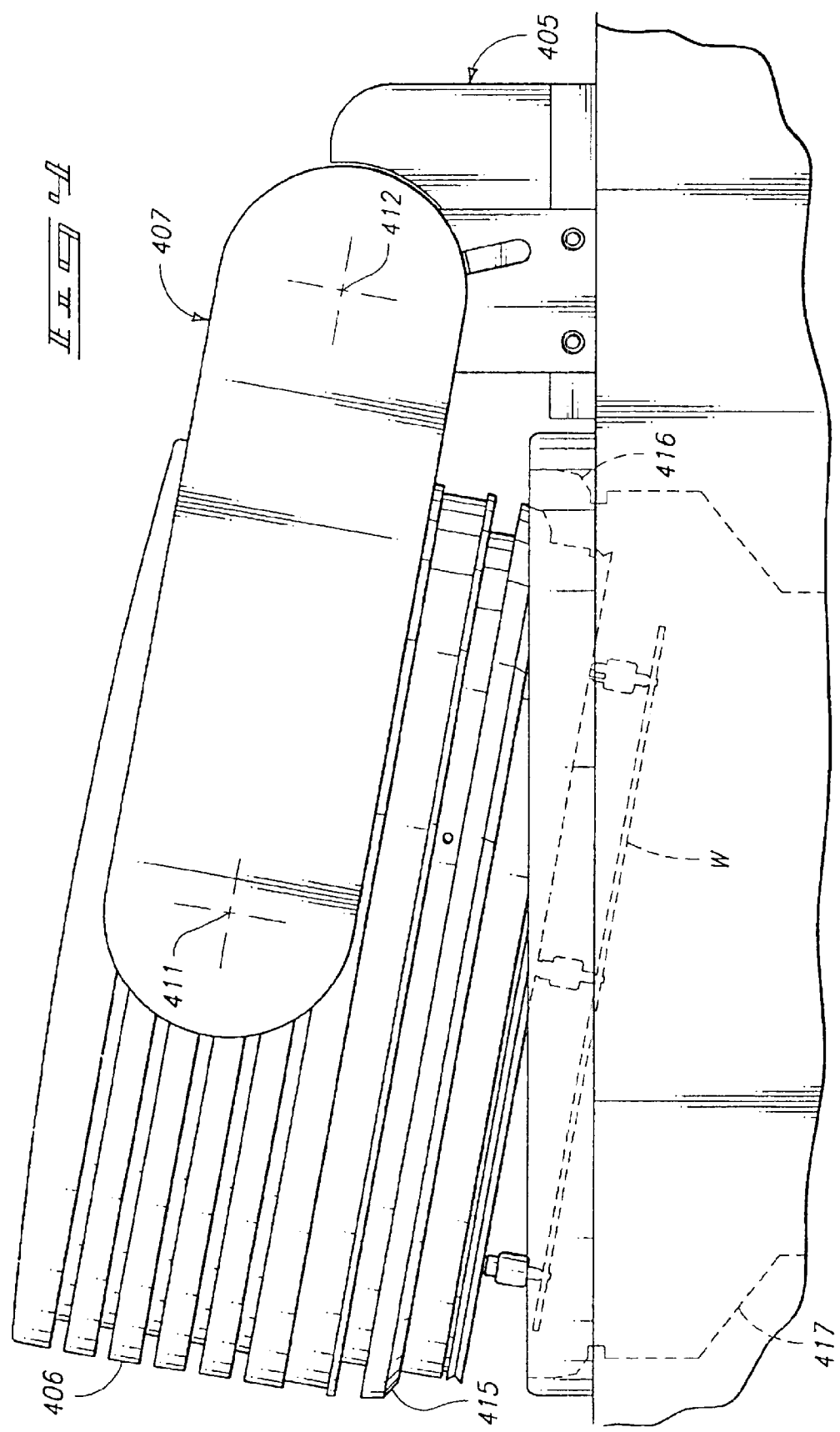

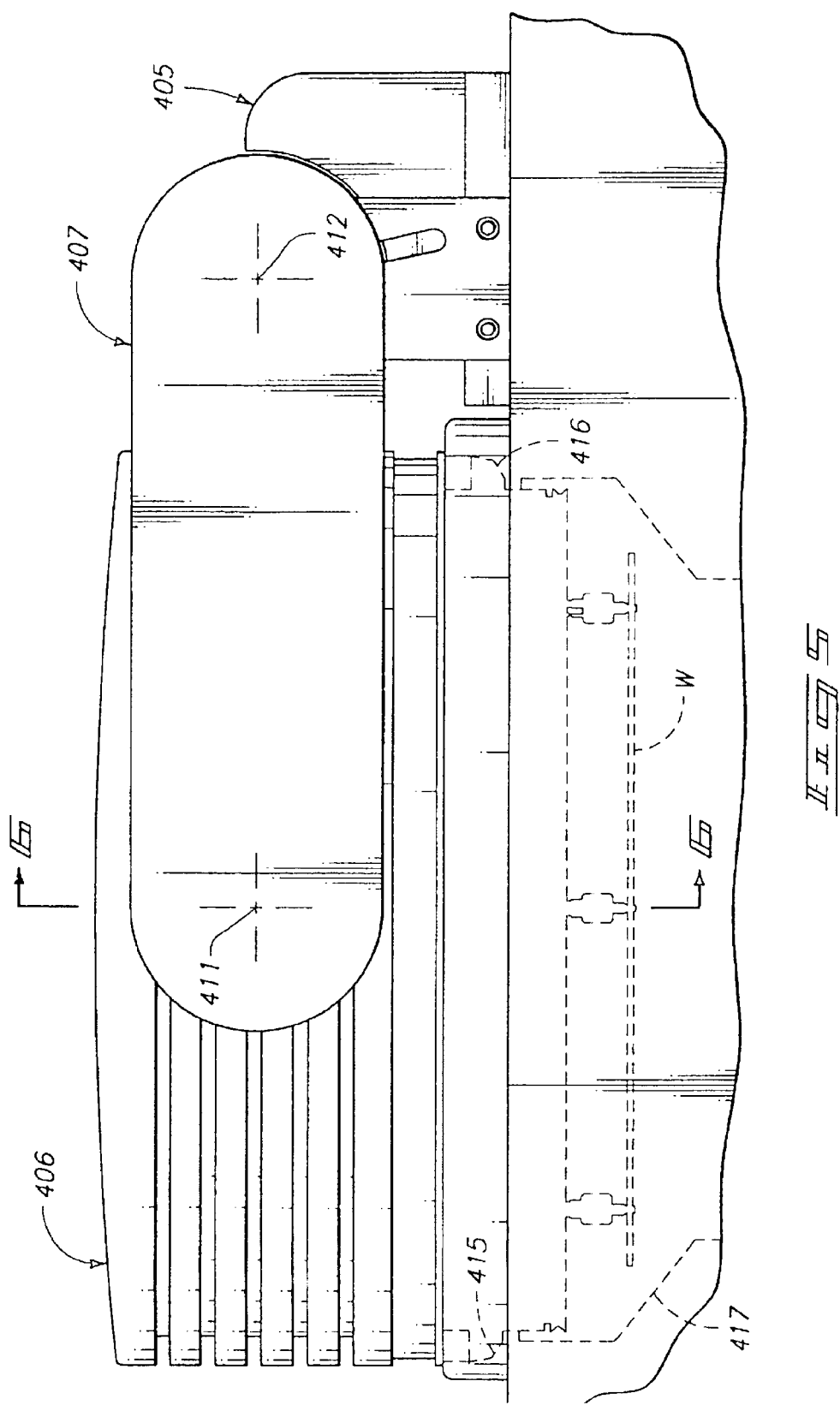

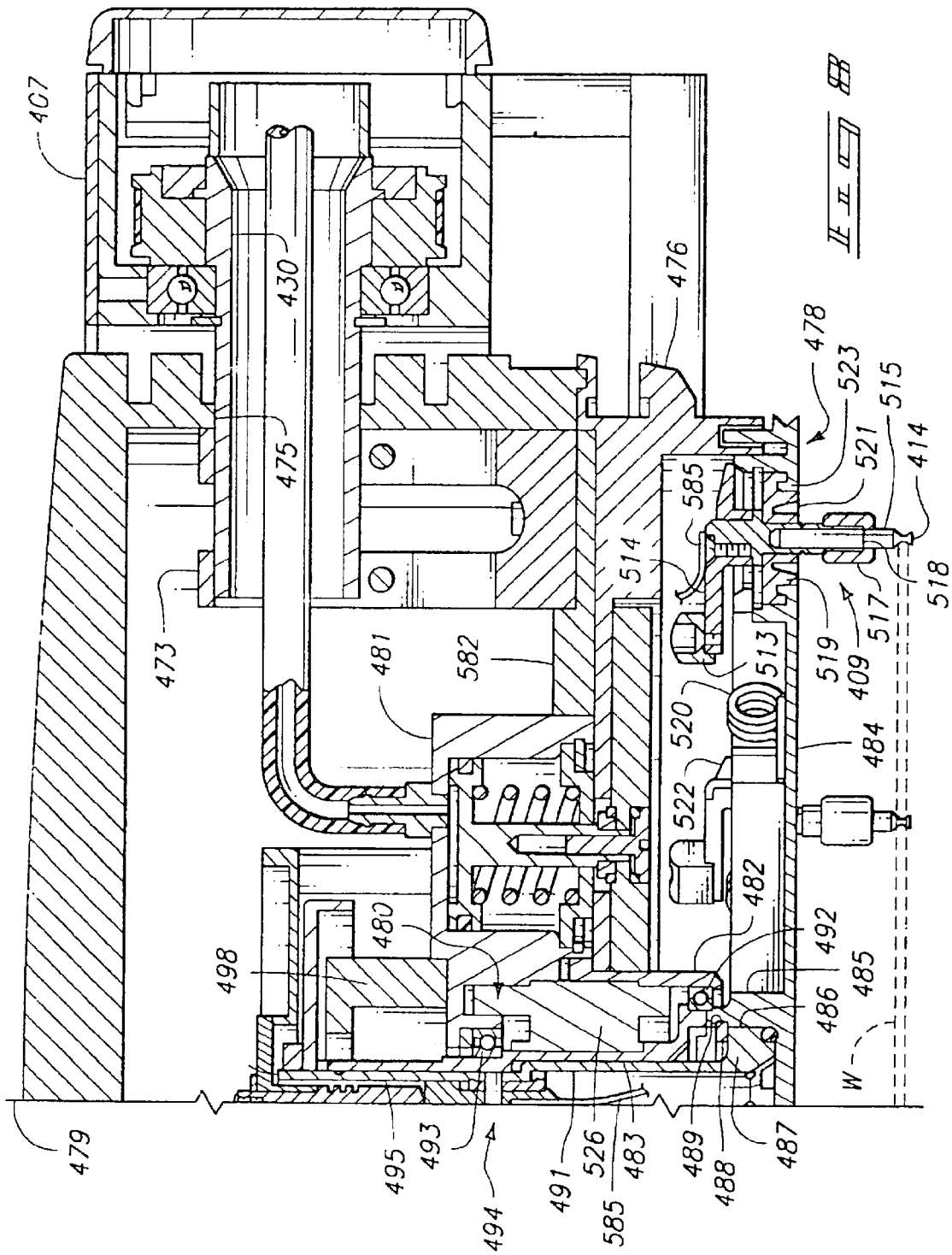

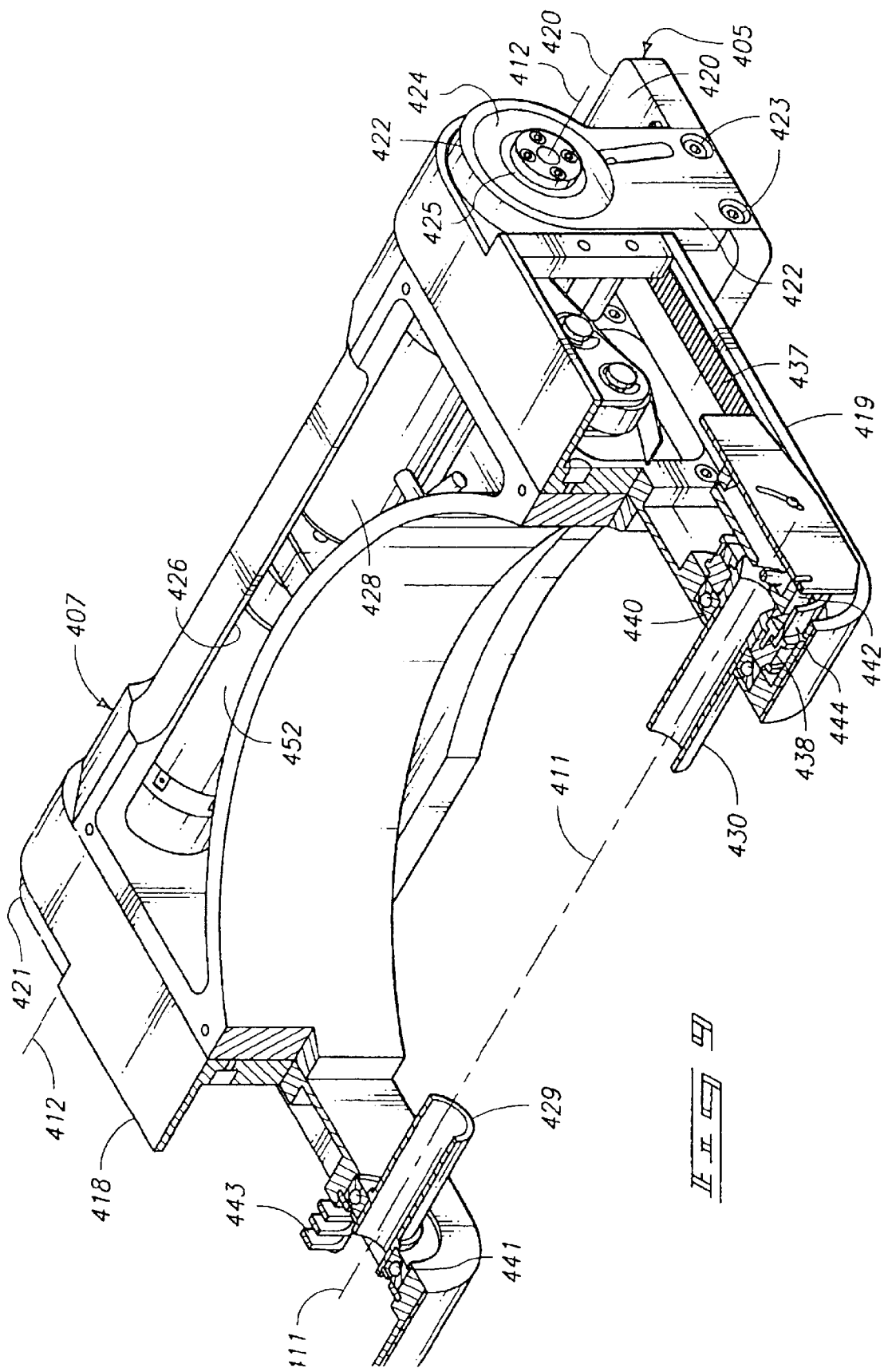

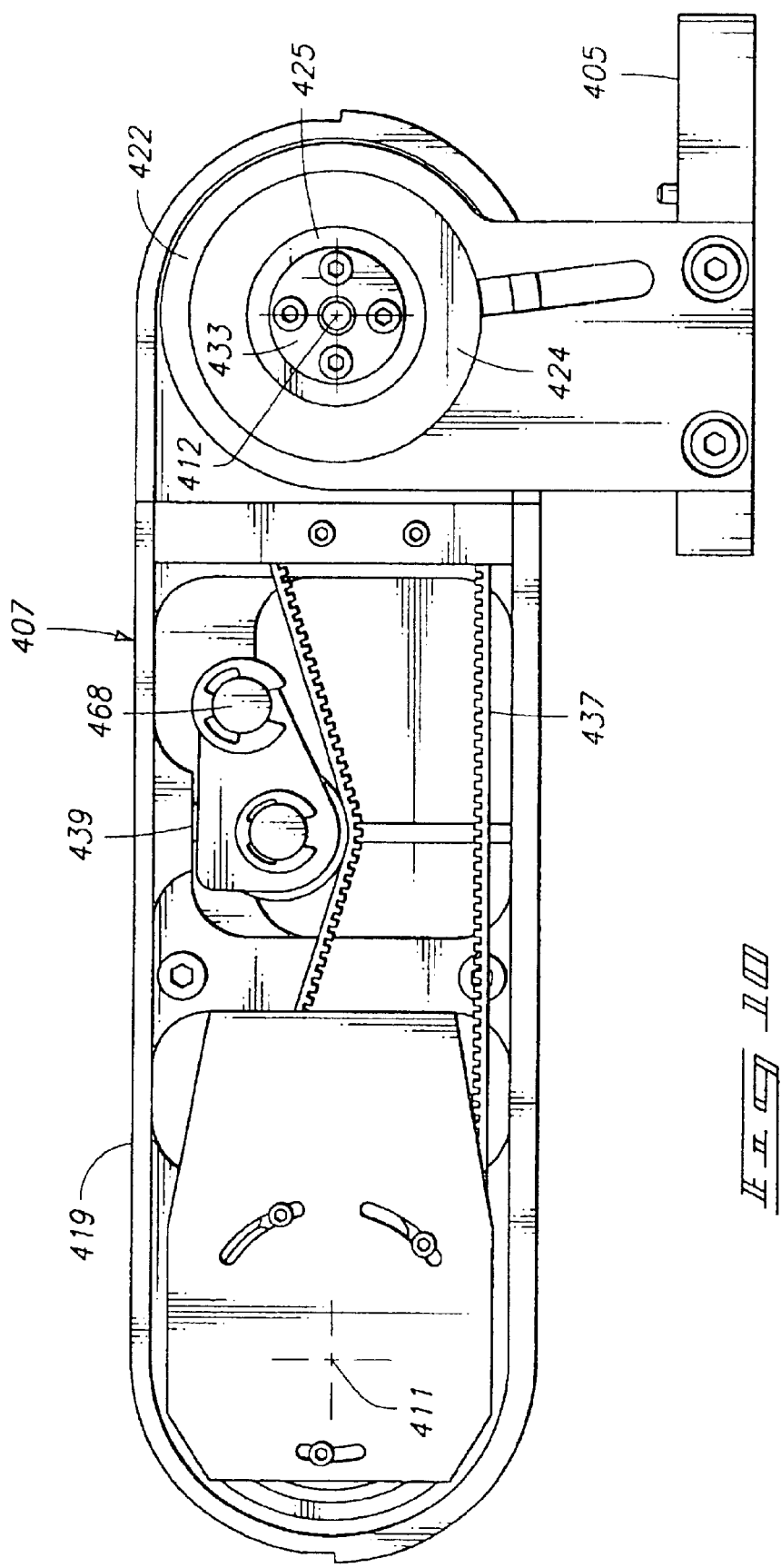

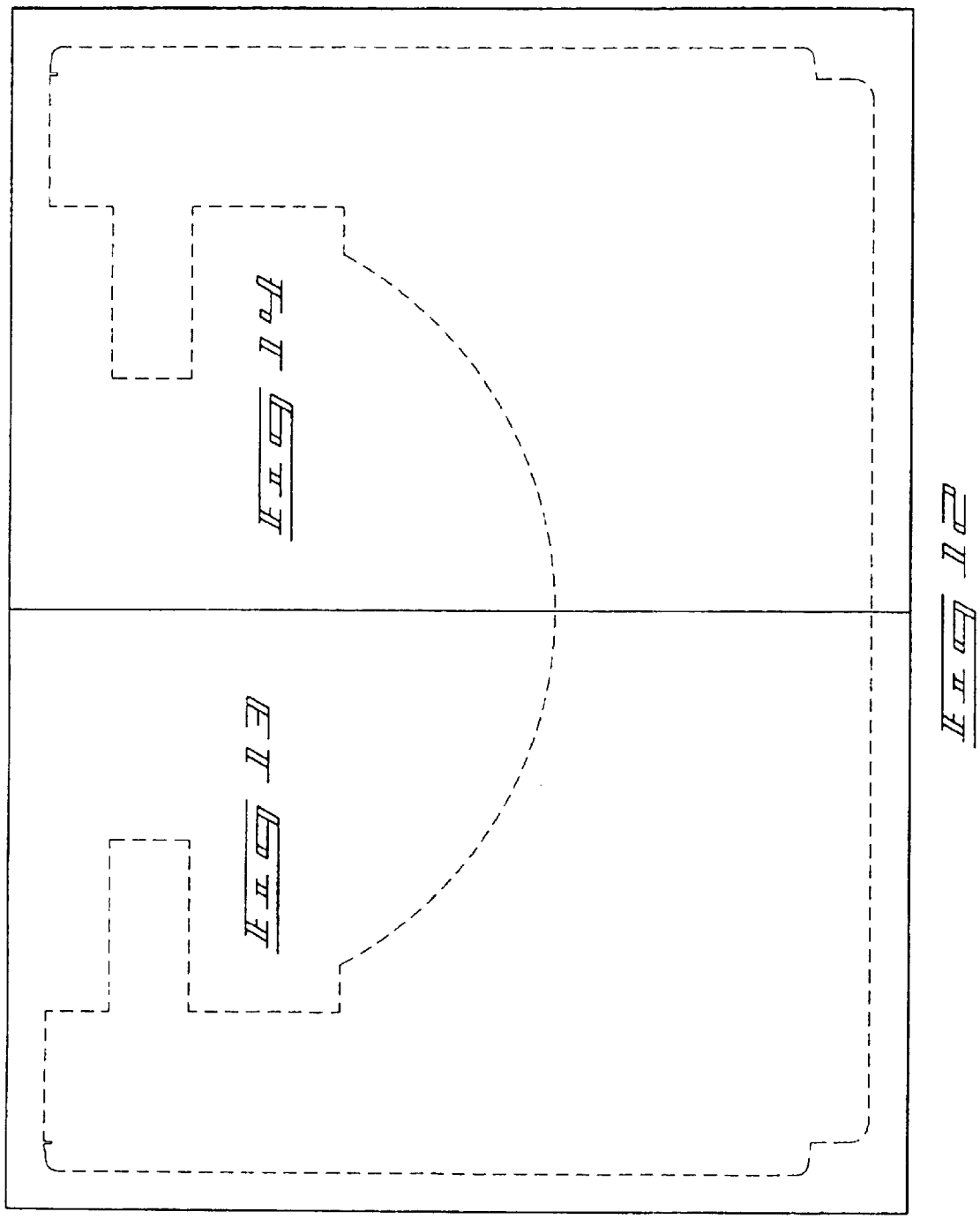

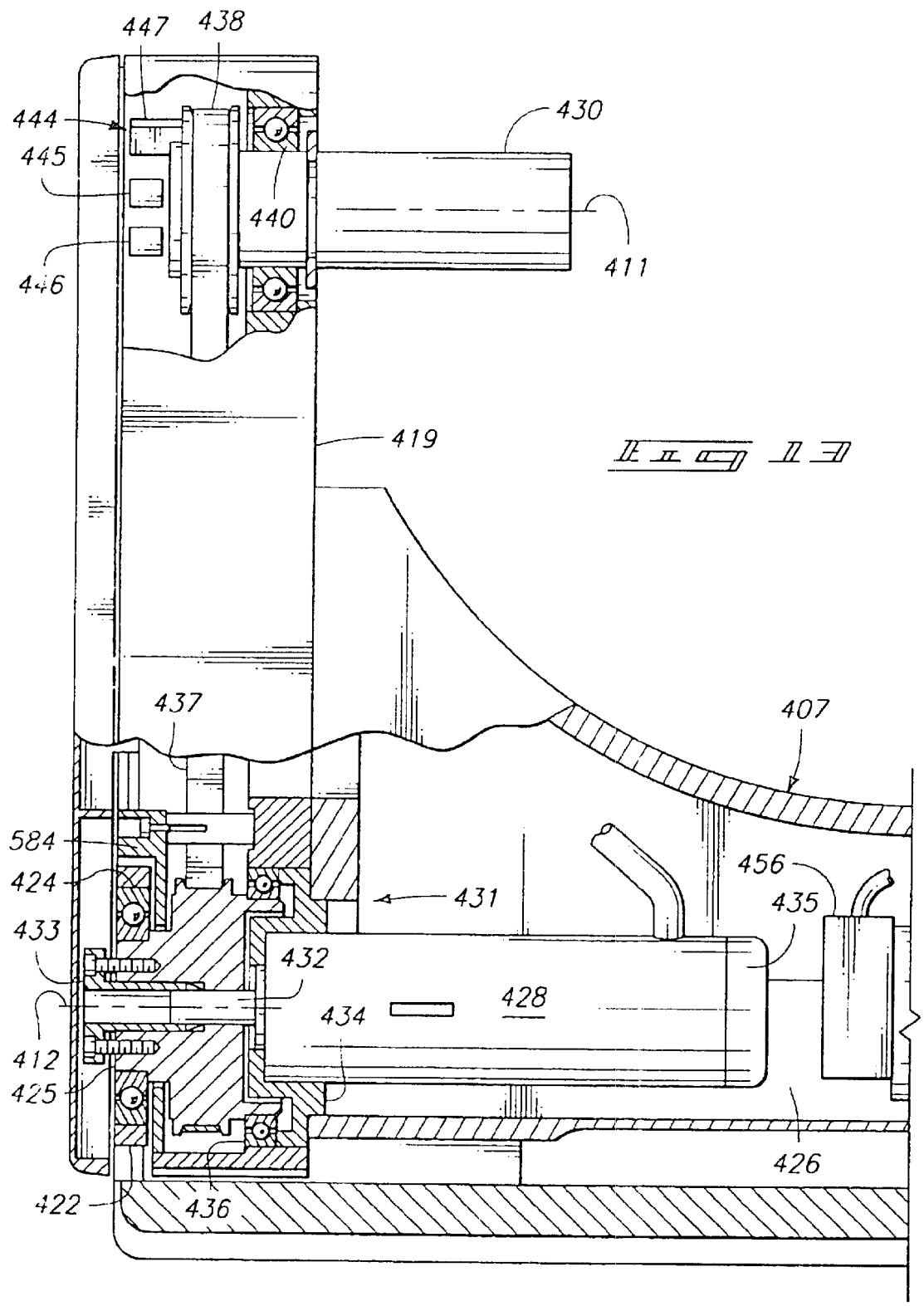

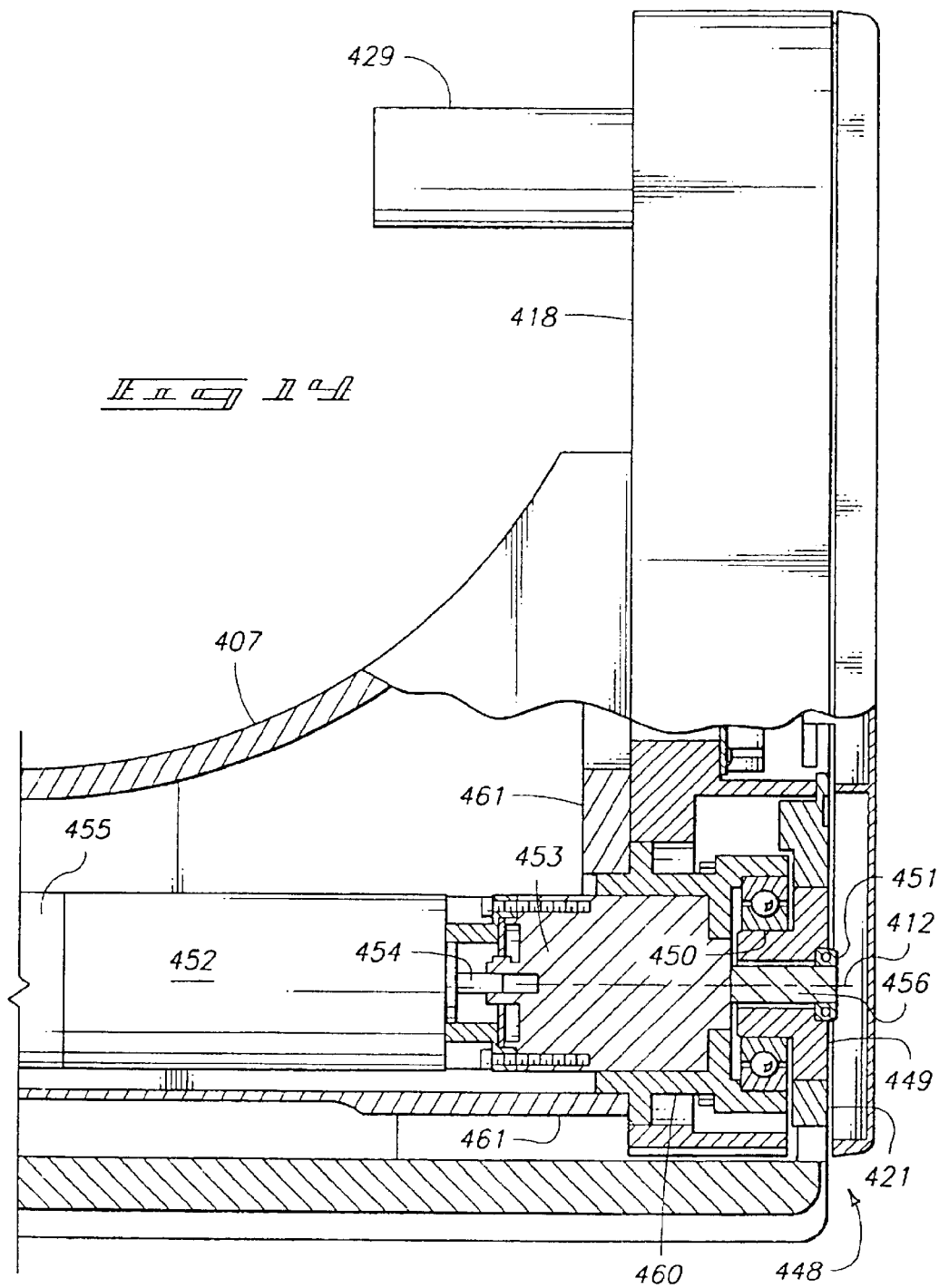

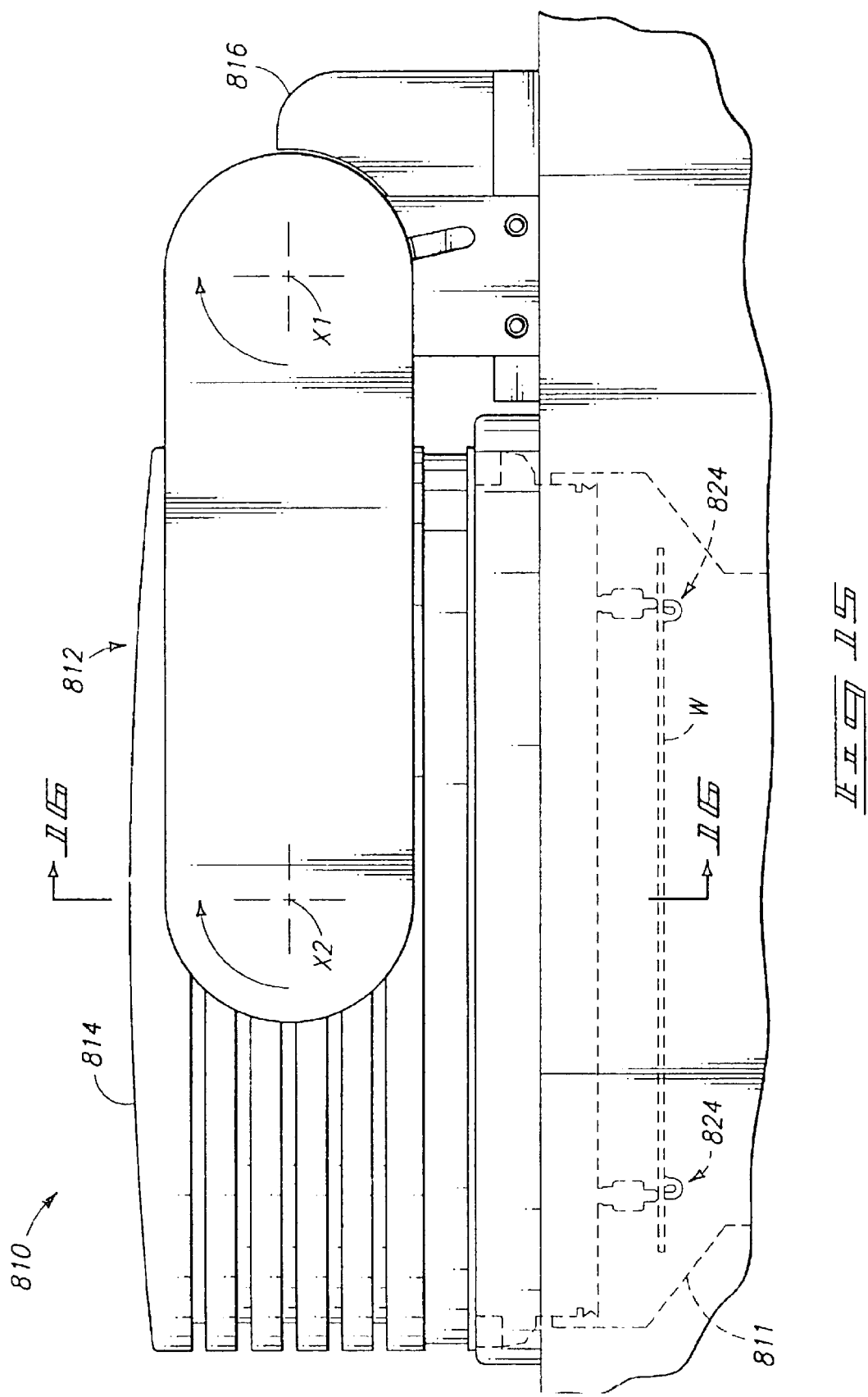

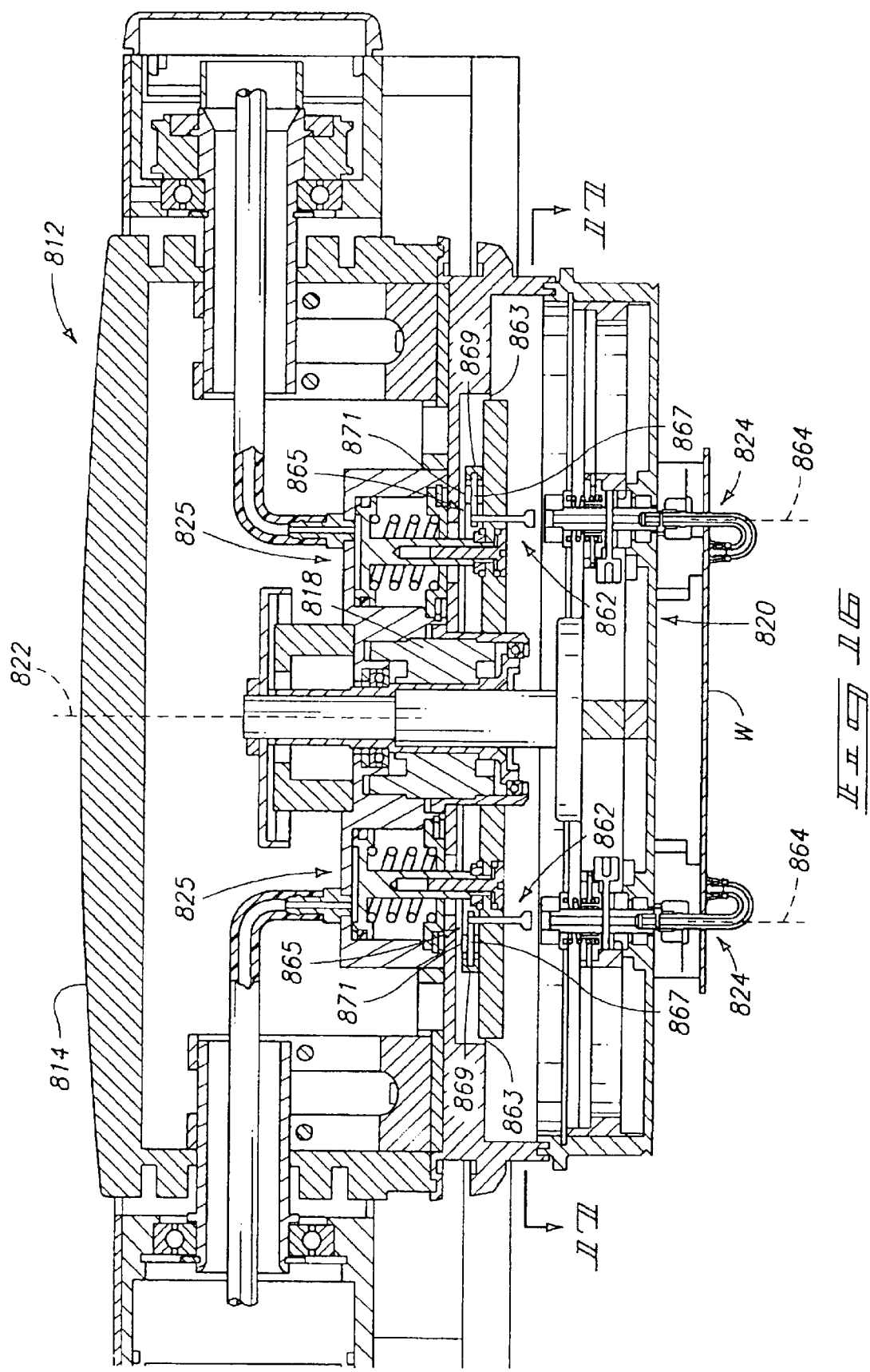

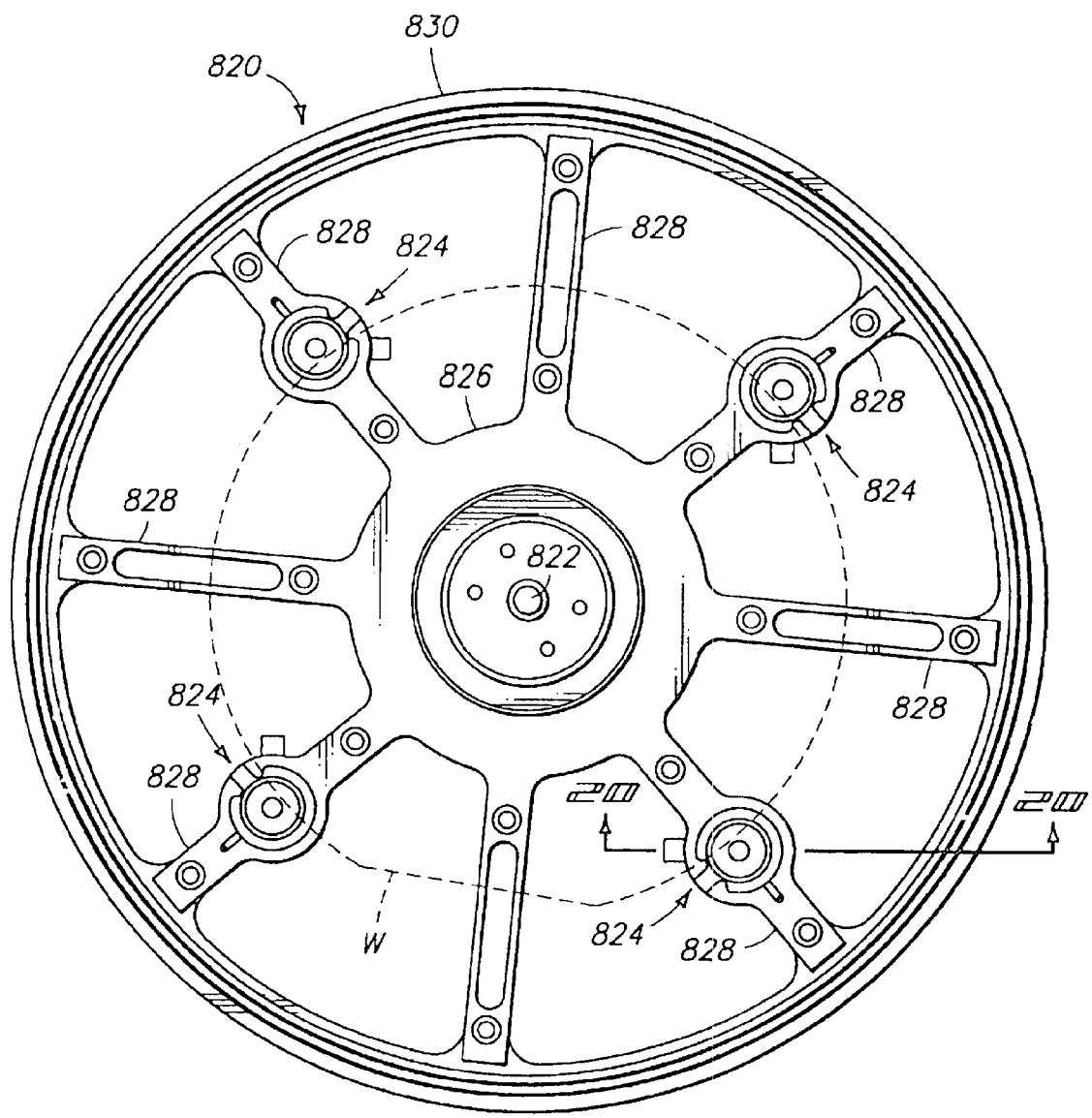

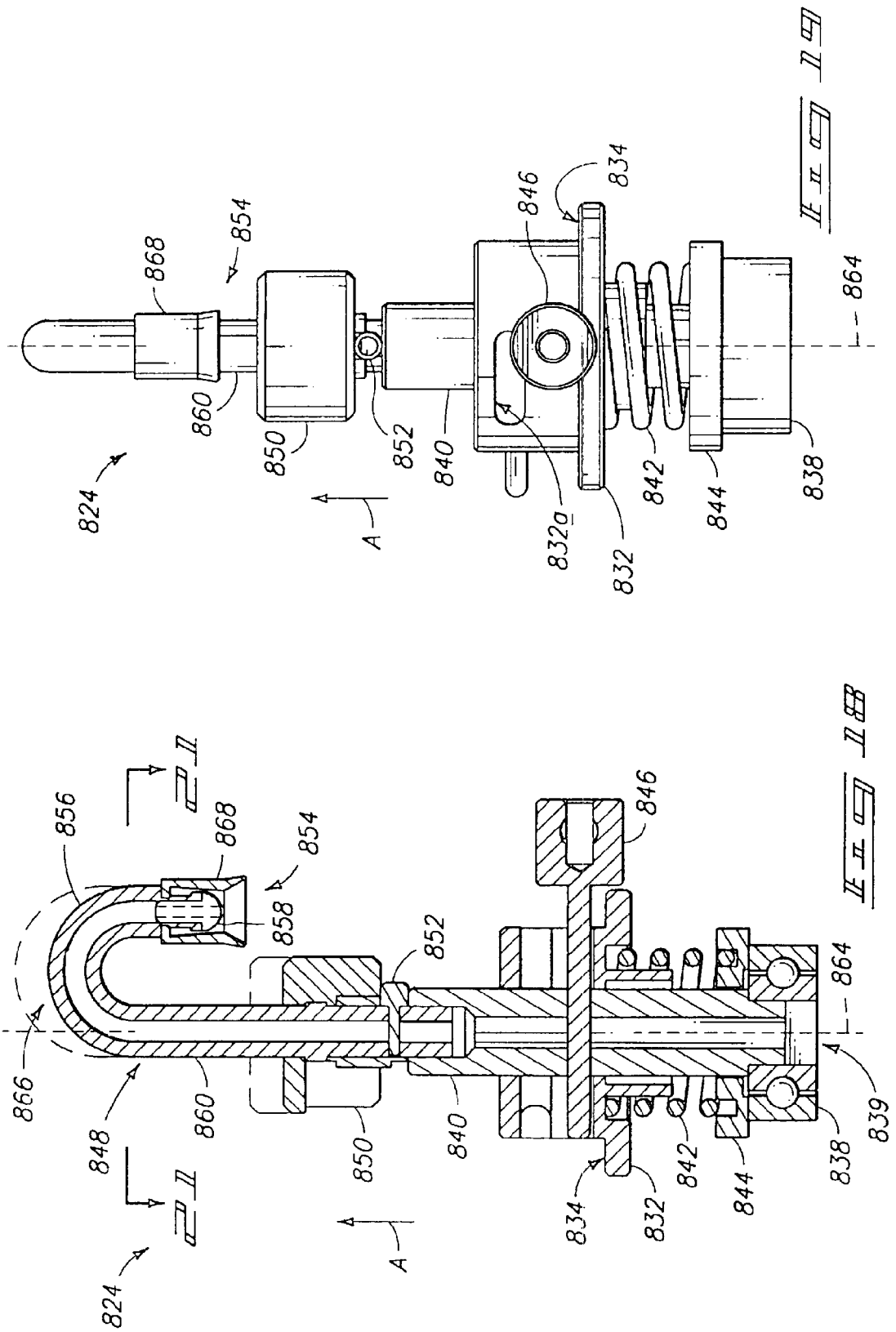

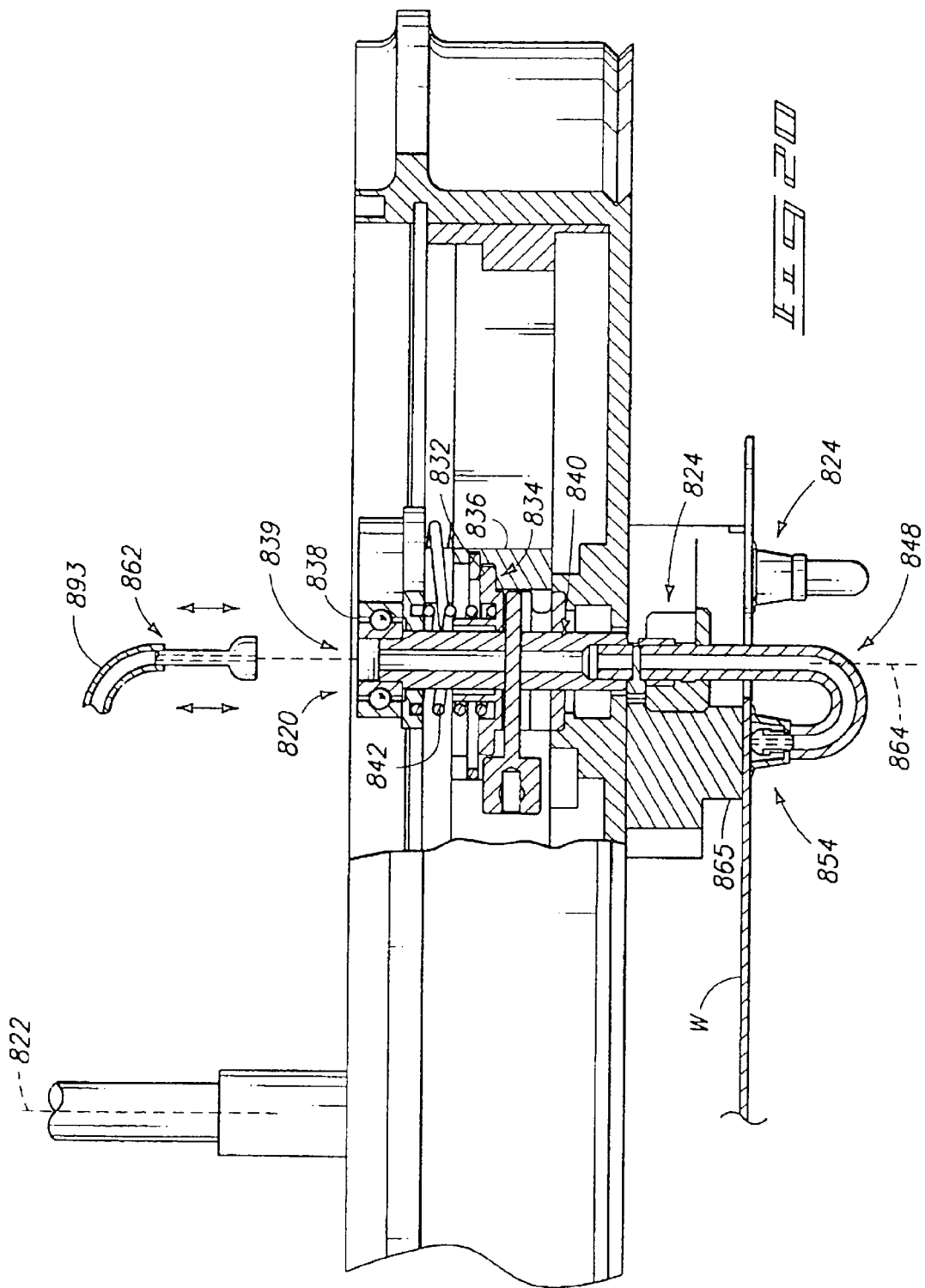

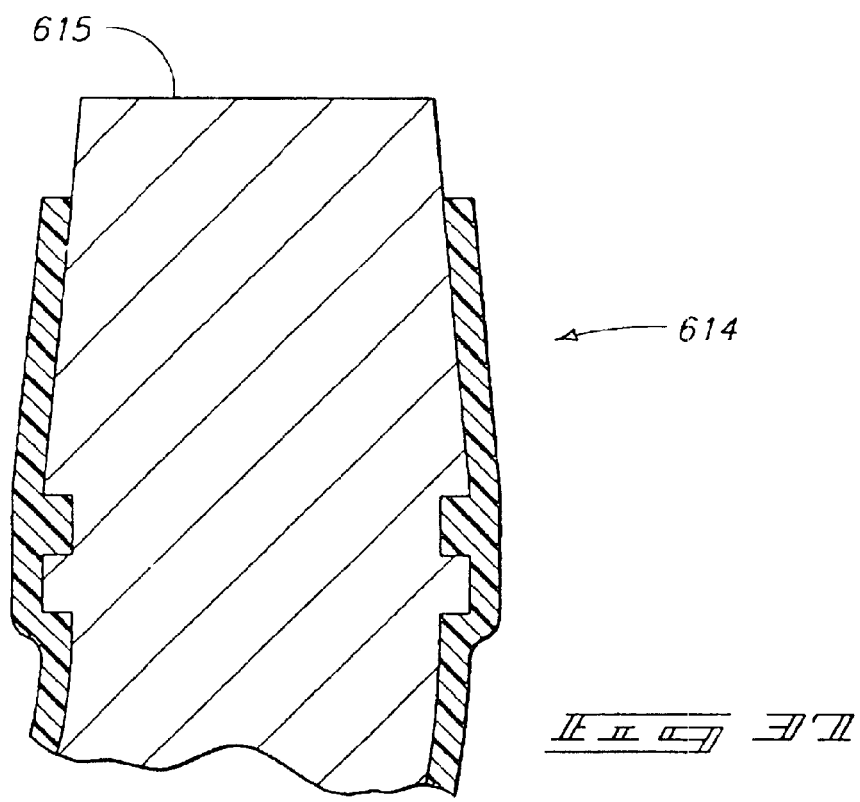
_FIG 37_
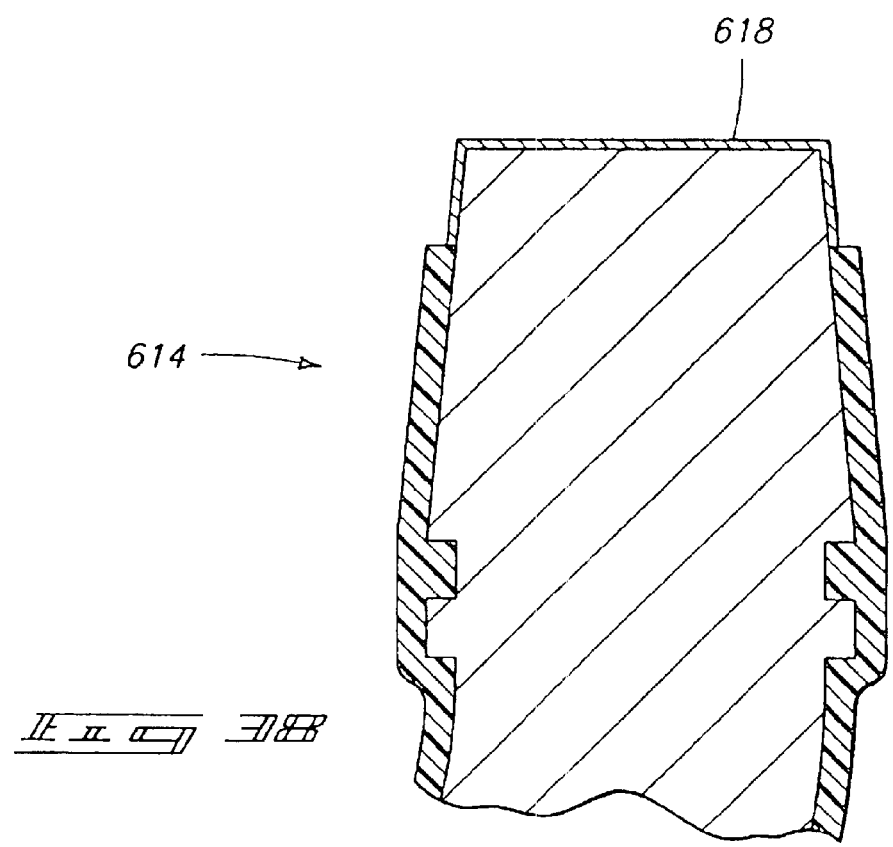
_FIG 38_

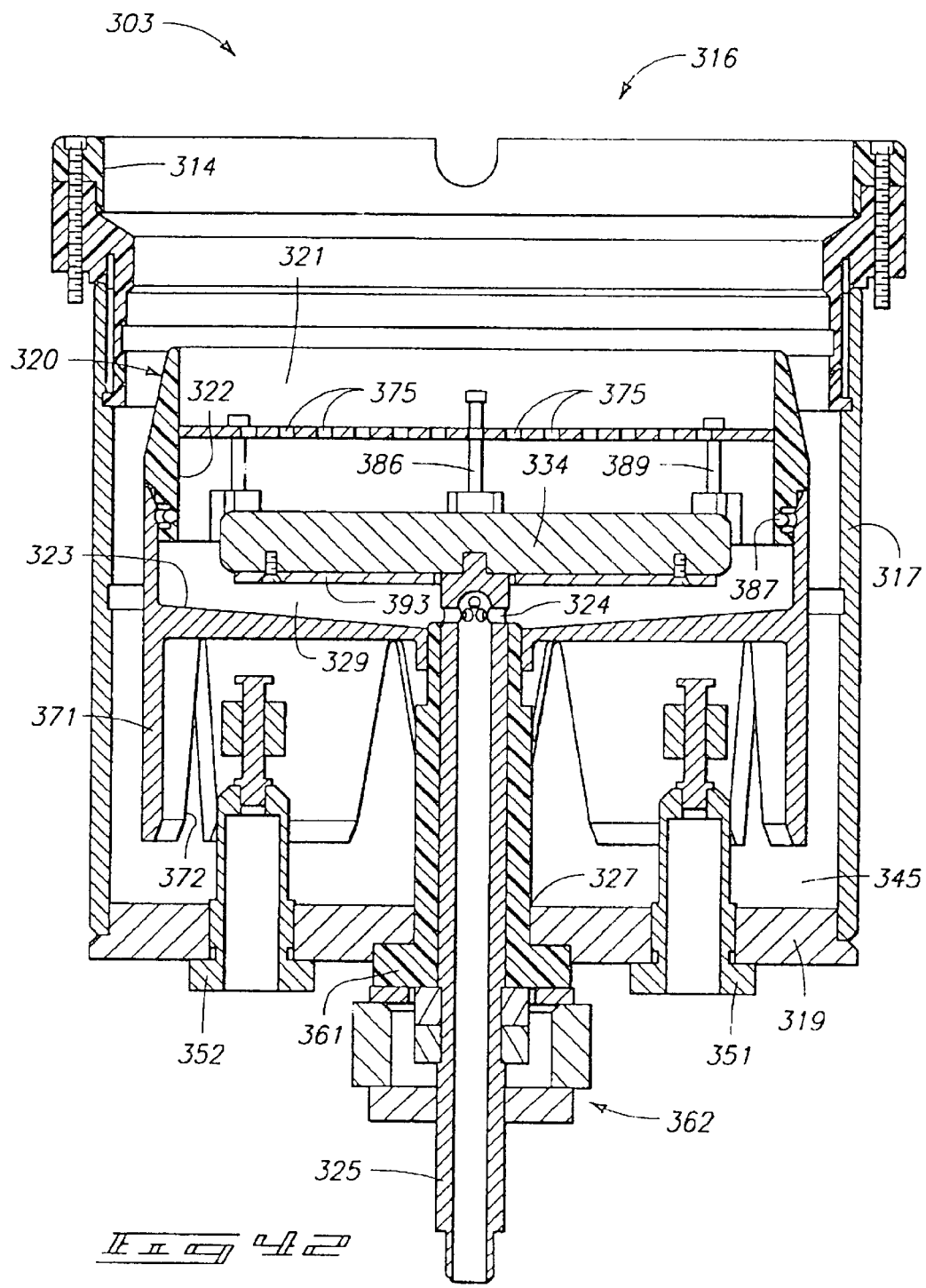

SEMICONDUCTOR PLATING SYSTEM WORKPIECE SUPPORT HAVING WORKPIECE ENGAGING ELECTRODE WITH PRE-CONDITIONED CONTACT FACE

This application is a continuation of U.S. application Ser. No. 08/940,686 filed Sep. 30, 1997, now pending.

TECHNICAL FIELD

The technical field of this invention is plating system electrodes used in the semiconductor plating industry for plating of metals such as copper onto semiconductor wafers and other semiconductor workpieces.

BACKGROUND OF THE INVENTION

In the production of semiconductor wafers and other semiconductor articles it is necessary to plate metals onto the semiconductor surface to provide conductive areas which transfer electrical current. There are two primary types of plating layers formed on the wafer or other workpiece. One is a blanket layer used to provide a metallic layer which covers large areas of the wafer. The other is a patterned layer which is discontinuous and provides various localized areas that form electrically conductive paths within the layer and to adjacent layers of the wafer or other device being formed.

The plating of copper onto semiconductor articles has proven to be a great technical challenge and at this time has not achieved commercial reality due to practical problems of forming copper layers on semiconductor devices in a reliable and cost efficient manner. This is caused in part by the relative difficulty in performing reactive ion etching or other selective removal of copper at reasonable production temperatures. The selective removal of copper is desirable to form patterned layers and provide electrically conductive interconnects between adjacent layers of the wafer or other workpiece.

Because reactive ion etching cannot be efficiently used, the industry has sought to overcome the problem of forming patterned layers of copper by using a damascene process where holes, more commonly called vias, trenches and other recesses are formed in the layer of semiconductor material in which the pattern of copper is desired. In the damascene processes the wafer is first provided with a metallic seed layer which is used to conduct electrical current during a subsequent metal electroplating step. The seed layer is a very thin layer of metal which can be laid down using several processes. The seed layer of metal can be laid down using physical vapor deposition or chemical vapor deposition processes to produce a layer on the order of 1000 angstroms thick. The seed layer can advantageously be formed of copper, gold, nickel, palladium, and most or all other metals. The seed layer is formed over a surface which is convoluted by the presence of vias, trenches, or other device features which are recessed. This convoluted nature of the exposed surface provides increased difficulties in forming the seed layer in a uniform manner. Nonuniformities in the seed layer can result in variations in the electrical current passing from the exposed surface of the wafer during the subsequent electroplating process. This in turn can lead to nonuniformities in the blanket layer electroplated onto the seed layer. Such nonuniformities can cause deformities and failures in the resulting semiconductor device being formed.

In the damascene processes, after the seed layer is laid down, then it is typical to plate additional metal onto the seed layer in the form of a blanket layer formed thereon. The blanket layer is typically electroplated and is used to fill the vias and trenches. The blanket layer is also typically plated to an extent which forms an overlying layer. Such a blanket layer will typically be formed in thicknesses on the order of 10,000–15,000 angstroms (1–1.5 microns).

The damascene processes also involve the removal of excess metal material present outside of the vias, trenches or other recesses. The metal is removed to provide a resulting patterned metal layer in the semiconductor device being formed. The excess plated material can be removed using chemical mechanical planarization. Chemical mechanical planarization is a processing step which uses the combined action of a chemical removal agent and an abrasive which remove and polish the exposed surface to remove undesired parts of the metal layer applied in the electroplating step.

The above process has been found very difficult to perform in a reliable and uniform manner when the electroplating process is performed using copper. Thus, the semiconductor industry has not as of this time been able to efficiently and economically produce semiconductor devices using copper metal as the principal conductive material of the device.

These challenges have in the past resulted in the use of aluminum and a variety of aluminum alloys as the metals of choice for forming metallized layers on semiconductor devices. Aluminum and its alloys have been acceptable because they can typically be removed in a defined and selective manner by reactive ion etch technology. This ion etch production technology uses a patterned photoresist layer which acts as a shield or stencil covering portions of an aluminum or alloy blanket layer which are to remain.

Despite the greater manufacturing ease, the performance of a semiconductor devices can be significantly enhanced by using copper since copper is significantly more conductive than aluminum. The frequent use of aluminum alloys further emphasizes the advantages of copper because the alloying introduces additional constituents to the matrix of the aluminum which further increases resistivity and decreases conductivity. Copper provides for more efficient and faster conduction of electrical signals within the semiconductor devices.

Thus, there has been a long-felt need in the art for improved semiconductor plating systems which can produce copper layers upon semiconductor articles which are uniform and can be produced in an efficient and cost-effective manner.

BRIEF DESCRIPTION OF THE DRAWINGS

Preferred embodiments of the invention are described below with reference to the accompanying drawings, which are briefly described below.

FIG. 4 is a side elevation view of the processing head of FIG. 5 showing the head in a rotated position ready to lower the wafer into the processing station.

FIG. 5 is a side elevation view of the processing head of FIG. 5 showing the head operator pivoted to deploy the processing head and wafer into the bowl of the processing station.

FIG. 6 is a schematic front elevation view of the processing head indicating the portions detailed in FIGS. 7 and 8.

FIG. 10 is a right side elevation view of the operator arm of the present invention showing the processing head pivot drive mechanism.

FIG. 12 is schematic plan view of the operator arm indicating the portions detailed in FIGS. 13 and 14.

FIG. 13 is a partial sectional plan view of the right side of the operator arm showing the processing head drive mechanism.

FIG. 14 is a partial sectional plan views of the left side of the operator arm showing the operator arm drive mechanism.

FIG. 15 is a side elevational view of a semiconductor workpiece holder constructed according to a preferred aspect of the invention.

FIG. 16 is a front sectional view of the FIG. 1 semiconductor workpiece holder.

FIG. 17 is a top plan view of a rotor which is constructed in accordance with a preferred aspect of this invention, and which is taken along line 3—3 in FIG. 16.

FIG. 18 is an isolated side sectional view of a finger assembly constructed in accordance with a preferred aspect of the invention and which is configured for mounting upon the FIG. 17 rotor.

FIG. 19 is a side elevational view of the finger assembly of FIG. 18.

FIG. 20 is a fragmentary cross-sectional enlarged view of a finger assembly and associated rotor structure.

FIG. 37 is a sectional view showing an enlarged distal tip portion of a further electrode before being pre-conditioned in accordance with another aspect of the invention.

FIG. 38 is a sectional view showing the enlarge distal tip portion of the previous figure after being pre-conditioned.

FIG. 42 is a longitudinal sectional view showing the plating station bowl shown in FIG. 23.

DETAILED DESCRIPTION OF THE PREFERRED EMBODIMENTS

Figure 1:
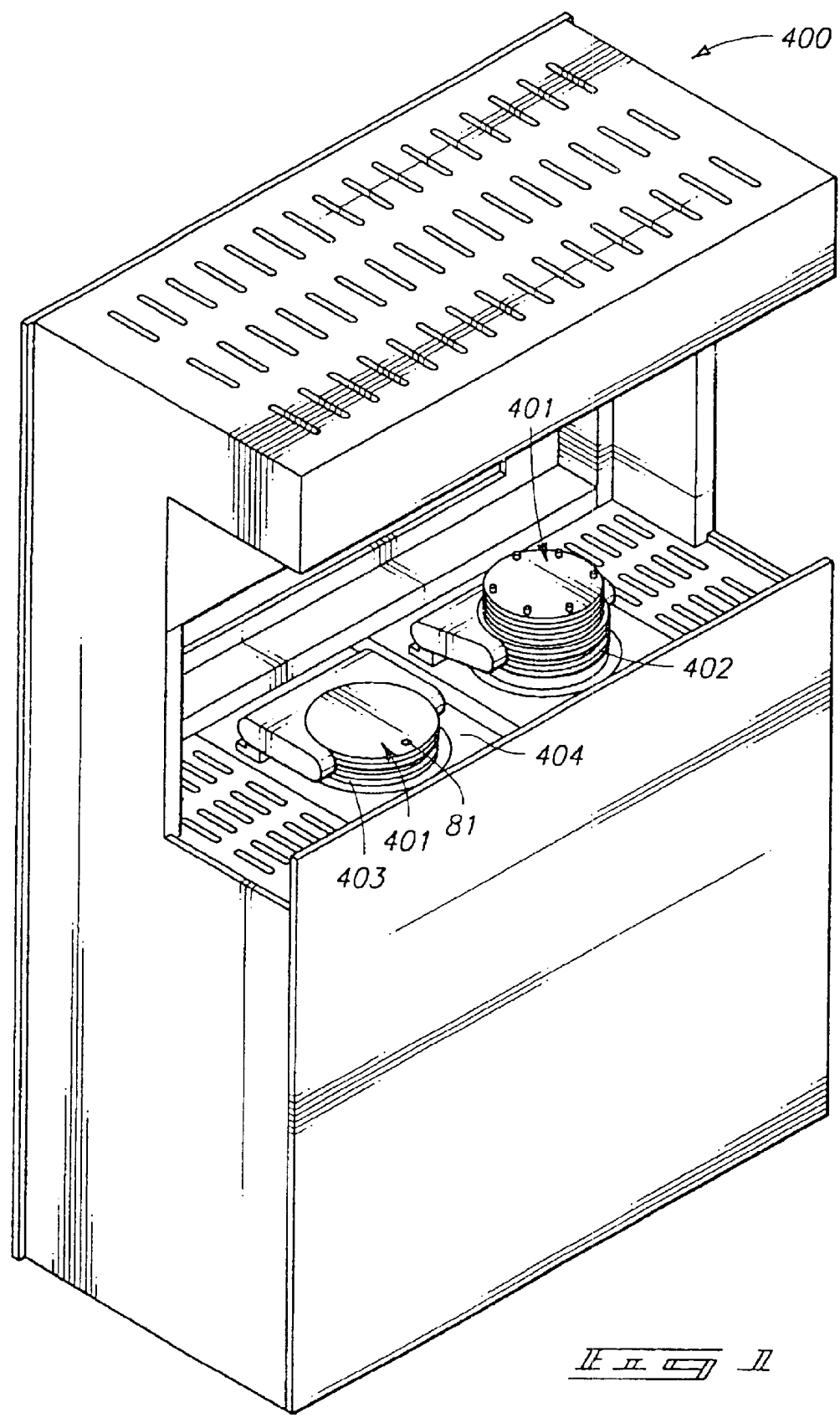
FIG. 1 is an environmental view of the semiconductor processing head of the present invention showing two processing heads in a processing station, one in a deployed, "closed" or "processing" position, and one in an "open" or "receive wafer" position.

This disclosure of the invention is submitted in furtherance of the constitutional purposes of the U.S. Patent Laws "to promote the progress of science and useful arts" (Article 1, Section 8).

TABLE 1

Listing of Subsections of Detailed Description and
Pertinent Items with Reference Numerals and Page Numbers

| | |
|---|---|
| Workpiece Support | 13 |
| semiconductor processing machine 400 | 13 |
| workpiece supports 401 | 13 |
| Workpiece support 402 | 13 |
| Workpiece support 403 | 13 |
| semiconductor manufacturing chamber 404 | 13 |
| beam emitter 81 | 13 |
| operator base 405 | 13 |
| processing head 406 | 13 |
| operator arm 407 | 13 |
| wafer holder 408 | 13 |
| fingers 409 | 13 |
| Workpiece holder 408 | 13 |
| workpiece spin axis 410 | 13 |
| process pivot axis 411 | 13 |

TABLE 1-continued

Listing of Subsections of Detailed Description and Pertinent Items with Reference Numerals and Page Numbers

| Item | Page |
|---|---|
| operator pivot axis 412 | 14 |
| workpiece W | 14 |
| fingertips 414 | 14 |
| processing bowl 417 | 14 |
| left and right forks 418 and 419 | 15 |
| Operator Base | 15 |
| operator base back portion 420 | 15 |
| operator base left yoke arm 421 | 16 |
| operator base right yoke arm 422 | 16 |
| yoke arm fasteners 423 | 16 |
| operator arm bearings 424 | 16 |
| operator arm 425 | 16 |
| Operator Arm | 16 |
| process arm rear cavity 426 | 17 |
| lift motor 452 | 17 |
| rotate motor 428 | 17 |
| processing head left pivot shaft 429 | 17 |
| processing head right pivot shaft 430 | 17 |
| Operator Arm-Processing Head Rotate Mechanism | 17 |
| Processing head rotate mechanism 431 | 17 |
| rotate shaft 432 | 17 |
| securing collar 433 | 18 |
| rotate motor support 434 | 18 |
| rotate encoder 435 | 18 |
| rotate pulley inboard bearing 436 | 19 |
| rotate belt 437 | 19 |
| processing head pulley 438 | 19 |
| rotate belt tensioner 439 | 19 |
| tensioner hub 468 | 20 |
| processing head shaft bearing 440 | 20 |
| processing head rotate bearing 469 | 20 |
| processing head shaft bearing 441 | 20 |
| cable brackets 442 and 443 | 20 |
| rotate overtravel protect 444 | 21 |
| rotate flag 447 | 21 |
| Rotate optical switches 445 and 446 | 21 |
| Operator Arm-Lift Mechanism | 22 |
| operator arm lift mechanism 448 | 22 |
| lift motor shaft 454 | 22 |
| lift gear drive 453 | 23 |
| lift drive shaft 456 | 23 |
| lift bushing 449 | 23 |
| anchor plate 458 | 23 |
| anchor fasteners 457 | 23 |
| Lift bearing 450 | 23 |
| lift bearing support 460 | 23 |
| operator arm frame 461 | 23 |
| lift anchor 451 | 23 |
| lift overtravel protect 462 | 24 |
| lift optical switch low 463 | 24 |
| lift optical switch high 464 | 24 |
| lift flag 465 | 24 |
| lift motor encoder 455 | 24 |
| lift motor 452 | 25 |
| slotted lift flag mounting slots 467 | 25 |
| lift flag fasteners 466 | 25 |
| Processing Head | 25 |
| processing head housing 470 | 25 |
| circumferential grooves 471 | 25 |
| rotate shaft openings 474 and 475 | 26 |
| left and right processing head mounts 472 | 26 |
| processing head door 476 | 26 |
| processing head void 477 | 26 |
| Processing Head Spin Motor | 26 |
| workpiece holder 478 | 27 |
| spin axis 479 | 27 |
| spin motor 480 | 27 |
| top motor housing 481 | 27 |
| spin motor shaft 483 | 28 |
| workpiece holder rotor 484 | 28 |
| rotor hub 485 | 28 |
| rotor hub recess 486 | 28 |
| workpiece shaft snap-ring 488 | 28 |
| rotor recess groove 489 | 28 |
| spin encoder 498 | 29 |
| optical tachometer 499 | 29 |
| Processing Head Finger Actuators | 31 |
| Pneumatic piston 502 | 31 |
| actuator spring 505 | 31 |
| cavity end cap 507 | 31 |
| retaining ring 508 | 31 |
| pneumatic inlet 503 | 31 |
| pneumatic supply line 504 | 31 |
| actuator plate 509 | 32 |
| actuator plate connect screw 510 | 32 |
| Wave springs 529 | 32 |
| bushing 512 | 32 |
| pneumatic piston recess 511 | 32 |
| finger actuator contacts 513 | 32 |
| Processing Head Workpiece Holder | 33 |
| finger actuator lever 514 | 33 |
| finger stem 515 | 33 |
| finger diaphragm 519 | 33 |
| workpiece holder rotor 484 | 33 |
| finger opening 521 | 33 |
| rotor diaphragm lip 523 | 33 |
| finger spring 520 | 33 |
| finger actuator tab 522 | 33 |
| finger collar or nut 517 | 34 |
| shoulder 518 | 34 |
| finger actuator mechanism 500 | 34 |
| cavity 501 | 34 |
| Semiconductor Workpiece Holder - Electroplating Embodiment | 35 |
| semiconductor workpiece holder 810 | 35 |
| bottom half or bowl 811 | 35 |
| Processing Head and Processing Head Operator | 35 |
| workpiece support 812 | 35 |
| spin head assembly 814 | 36 |
| lift/rotate assembly 816 | 36 |
| motor 818 | 37 |
| rotor 820 | 37 |
| rotor spin axis 822 | 37 |
| finger assembly 824 | 37 |
| actuator 825 | 37 |
| rotor center piece 826 | 37 |
| spokes 828 | 37 |
| rotor perimeter piece 830 | 38 |
| Finger Assembly | 38 |
| finger assembly frame 832 | 39 |
| angled slot 832a | 39 |
| finger assembly frame outer flange 834 | 39 |
| inner drive plate portion 836 | 39 |
| Finger Assembly Drive System | 40 |
| bearing 838 | 40 |
| collet 840 | 40 |
| bearing receptacle 839 | 40 |
| spring 842 | 40 |
| spring seat 844 | 40 |
| Finger Assembly Electrical System | 41 |
| pin connector 846 | 41 |
| finger 848 | 41 |
| nut 850 | 41 |
| anti-rotation pin 852 | 41 |
| finger tip 854 | 42 |
| electrode contact 858 | 42 |
| Finger Assembly Drive System Interface | 42 |
| finger actuator 862 | 42 |
| actuation ring 863 | 43 |
| first movement path axis 864 | 43 |
| secondary linkage 865 | 43 |
| link arm 867 | 43 |
| actuator torque ring 869 | 43 |
| pneumatic operator 871 | 43 |
| Engaged and Disengaged Positions | 44 |
| arrow A | 44 |
| workpiece standoff 865 | 45 |
| bend 866 | 45 |
| Finger Assembly Seal | 46 |
| seal 868 | 46 |
| rim portion 870 | 46 |
| Methods and Operation | 47 |
| Second Embodiment Processing Station - Generally | 53 |

TABLE 1-continued

Listing of Subsections of Detailed Description and Pertinent Items with Reference Numerals and Page Numbers

| | |
|---|---|
| second semiconductor processing station 900 | 53 |
| workpiece support assembly 901 | 53 |
| processing bowl 917 | 53 |
| processing or manufacturing chamber 904 | 53 |
| Workpiece Support Generally | 54 |
| rotor assembly 984 | 54 |
| Workpiece Support Head Operator | 54 |
| processing head 906 | 54 |
| head operator 907 | 54 |
| upper portion 908 | 54 |
| head connection shaft 909 | 54 |
| horizontal pivot axis 910 | 54 |
| Workpiece Support Main Part | 55 |
| processing head housing 970 | 55 |
| processing head frame 982 | 55 |
| door plate 983 | 55 |
| door ring member 984 | 55 |
| frame-pivot shaft connection 985 | 55 |
| pivot shaft connection base 935 | 55 |
| first housing part 971 | 55 |
| housing cap 972 | 55 |
| main part mechanism chamber 973 | 55 |
| peripheral groove 986 | 56 |
| inflatable door seal 987 | 56 |
| annular rotor receiving groove 988 | 56 |
| Workpiece Support Rotor Drive | 56 |
| workpiece spin motor 980 | 57 |
| stator armatures 916 | 57 |
| motor shaft 918 | 57 |
| bottom motor bearing 921 | 57 |
| bottom motor housing 922 | 57 |
| top motor housing 923 | 57 |
| top motor bearing 927 | 57 |
| fasteners 924 | 57 |
| frame extensions 925 | 57 |
| top frame piece 926 | 57 |
| Workpiece Support Rotor Assembly | 57 |
| rotor assembly 930 | 58 |
| rotor shaft 931 | 58 |
| rotor shaft hub 932 | 58 |
| shaft hub receptacle 933 | 58 |
| inner rotor part 934 | 58 |
| inner rotor part hub 935 | 58 |
| peripheral band 936 | 58 |
| snap-ring 937 | 58 |
| transmission receptacles 937 | 58 |
| fasteners 941 | 58 |
| rotor face panel 943 | 58 |
| apertures 787 | 58 |
| support standoffs 721 | 59 |
| workpiece peripheral guide pins 722 | 59 |
| reinforcing ribs 942 | 59 |
| side wall 944 | 59 |
| finger passageways 949 | 59 |
| rotor shaft mounting nut 888 | 59 |
| angular position encoder 498 | 60 |
| Workpiece Detection Subsystem | 61 |
| mounting 738 | 61 |
| detector 739 | 61 |
| workpiece detector windows 741 | 61 |
| Workpiece Support Finger Actuator | 63 |
| finger pivot axes 953 | 63 |
| workpiece standoff supports 721 | 64 |
| finger actuator transmission 960 | 64 |
| finger head mounting receptacle 954 | 64 |
| locking pin groove 955 | 65 |
| finger mounting pin 956 | 65 |
| transmission base 961 | 65 |
| mounting cutout 962 | 65 |
| transmission shaft 963 | 65 |
| shaft channel or groove 964 | 65 |
| shaft camming control member 965 | 65 |
| ball 966 | 65 |
| ball support fastener 967 | 65 |
| interior shaft passageway 968 | 66 |
| spring retainer 969 | 66 |

TABLE 1-continued

Listing of Subsections of Detailed Description and Pertinent Items with Reference Numerals and Page Numbers

| | |
|---|---|
| finger mounting spring 938 | 66 |
| set screw 939 | 66 |
| transmission head 656 | 66 |
| bearing 657 | 66 |
| head pieces 658 and 659 | 66 |
| head fasteners 660 | 66 |
| head guide rods 661 | 66 |
| two guide passageways 662 | 66 |
| head bias springs 664 | 66 |
| shaft seal 667 | 66 |
| transmission head depression ring 683 | 67 |
| operator output connection ring 684 | 67 |
| pneumatic actuator engines 691 | 67 |
| pneumatic manifolds 692 | 67 |
| Electrode Fingers With Submerged Conductive Current Transfer Areas | 67 |
| finger assembly 631 | 67 |
| finger shaft 632 | 67 |
| finger head 633 | 67 |
| locking pin 956 | 67 |
| dielectric sheathing 634 and 635 | 68 |
| contact head 636 | 68 |
| contact face 637 | 68 |
| submersion line 639 | 68 |
| first electrically conductive segment 642 | 68 |
| second electrically conductive segment 643 | 69 |
| third electrically conductive segment 644 | 69 |
| third dielectric segment 653 | 69 |
| third dielectric sheath 654 | 69 |
| distal contact insert part 655 | 70 |
| insert receptacle 616 | 70 |
| contact face 617 | 70 |
| electrode finger 979 | 70 |
| dielectric sheath 621 | 70 |
| Electrode Fingers With Dielectric Sheaths Covering Submerged Areas | 71 |
| electrode finger 681 | 71 |
| dielectric sheath 682 | 72 |
| contact insert side walls 619 | 72 |
| insert contact part or tip 655 | 72 |
| Pre-Conditioning of Electrode Contact Faces | 73 |
| electrode 614 | 73 |
| distal exposed surface 615 | 73 |
| dielectric sheath 616 | 73 |
| Methods Using Workpiece Engaging Electrode Assembly With Sealing Boot | 75 |
| electrode finger 583 | 75 |
| electrode shaft 584 | 75 |
| head 633 | 75 |
| cover or boot 585 | 75 |
| distal contact lip 586 | 75 |
| contact insert part 655 | 75 |
| skirt portion 587 | 75 |
| electrode shaft distal end surface 588 | 75 |
| contact face 617 | 75 |
| substrate or other subjacent layer 561 | 76 |
| thin metallic seed layer 562 | 76 |
| via or other opening 563 | 76 |
| photoresist layer 564 | 76 |
| Plating Bowl Assembly | 78 |
| electroplating bowl assembly 303 | 78 |
| process bowl or plating vessel 316 | 78 |
| outer bowl side wall 617 | 79 |
| bowl bottom 319 | 79 |
| bowl rim assembly 314 | 79 |
| cup assembly 320 | 79 |
| fluid cup portion 321 | 79 |
| cup side 322 | 79 |
| cup bottom 323 | 79 |
| flutes 372 | 79 |
| cup main joint 387 | 79 |
| riser tube 361 | 79 |
| fitting 362 | 79 |
| fluid inlet line 325 | 80 |
| bowl bottom opening 327 | 80 |
| cup fluid inlet openings 324 | 80 |

TABLE 1-continued

Listing of Subsections of Detailed Description and
Pertinent Items with Reference Numerals and Page Numbers

| | |
|---|---|
| overflow chamber 345 | 80 |
| level detectors 351 and 352 | 80 |
| diffuser height adjustment mechanisms 386 | 81 |
| mounting fasteners 389 | 81 |
| Plating Anode Shield | 81 |
| anode shield 393 | 81 |
| anode shield fasteners 394 | 81 |

\* \* \* (End of Table 1) \* \* \*

Workpiece Support

Turning now to FIG. 1, a semiconductor processing machine 400 having two workpiece supports 401 is shown. Workpiece support 402 is shown in a "open" or "receive wafer" position in order to receive a workpiece or semiconductor wafer for further processing. Workpiece support 403 is shown in a "closed" or "deployed" position wherein the semiconductor wafer has been received by the workpiece support and is being exposed to the semiconductor manufacturing process in the semiconductor manufacturing chamber 404. FIG. 1 also shows an optional beam emitter 81 for emitting a laser beam detected by robotic wafer conveyors to indicate position of the unit.

Figure 2:
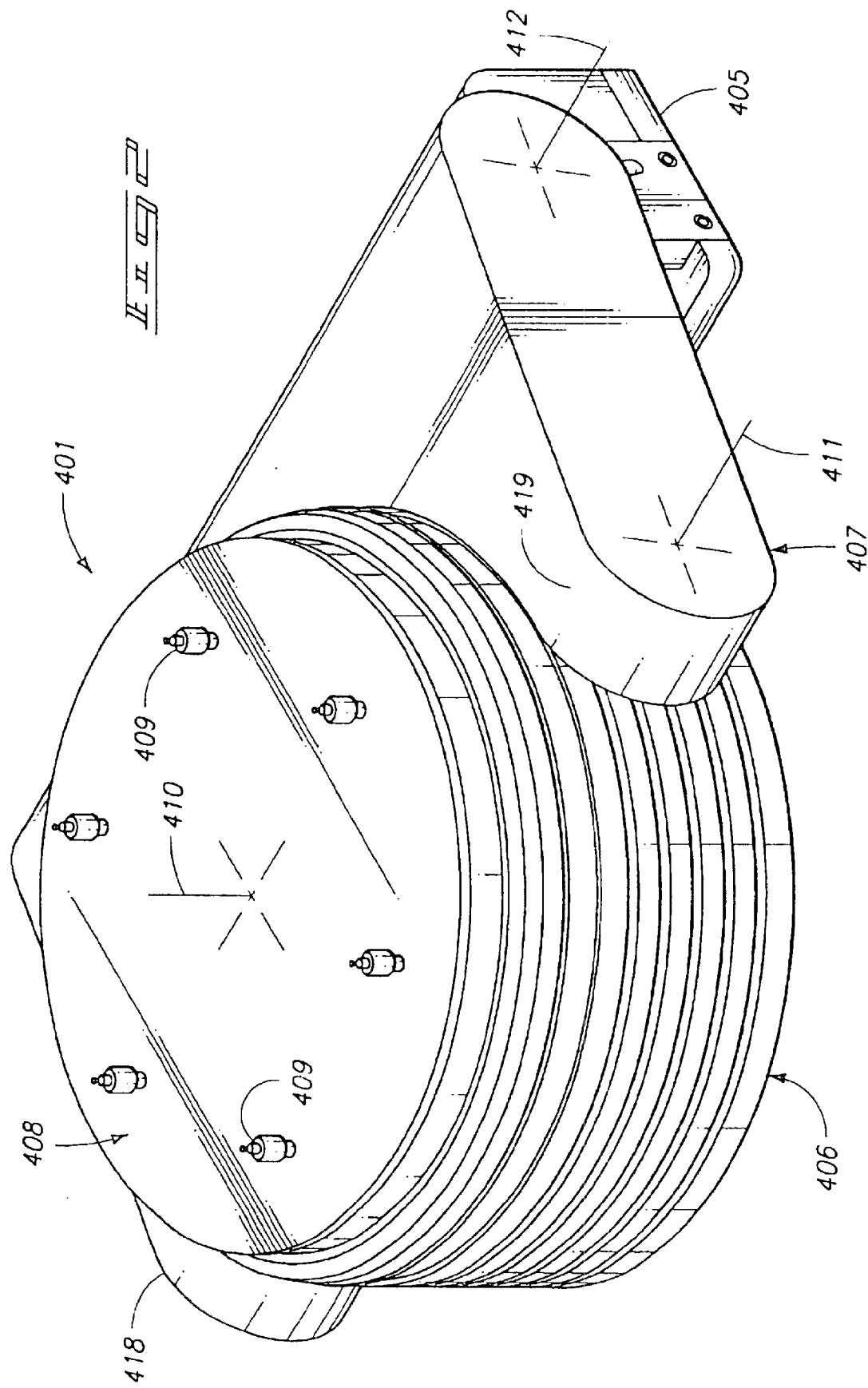
FIG. 2 is an isometric view of the semiconductor processing head of the present invention.

Turning now to FIG. 2, an enlarged view of the workpiece support 401 is shown. Workpiece support 401 advantageously includes operator base 405, a processing head 406, and an operator arm 407. Processing head 406 preferably includes workpiece holder or wafer holder 408 and which further includes fingers 409 for securely holding the workpiece during further process and manufacturing steps. Workpiece holder 408 more preferably spins about workpiece spin axis 410.

The processing head is advantageously rotatable about processing head pivot axis or, more briefly termed, process pivot axis 411. In this manner, a workpiece (not shown) may be disposed between and grasped by the fingers 409, at which point the processing head is preferably rotated about process head pivot axis 411 to place the workpiece in a position to be exposed to the manufacturing process.

In the preferred embodiment, operator arm 407 may be pivoted about operator pivot axis 412. In this manner, the workpiece is advantageously lowered into the process bowl (not shown) to accomplish a step in the manufacture of the semiconductor wafer.

Figure 3:
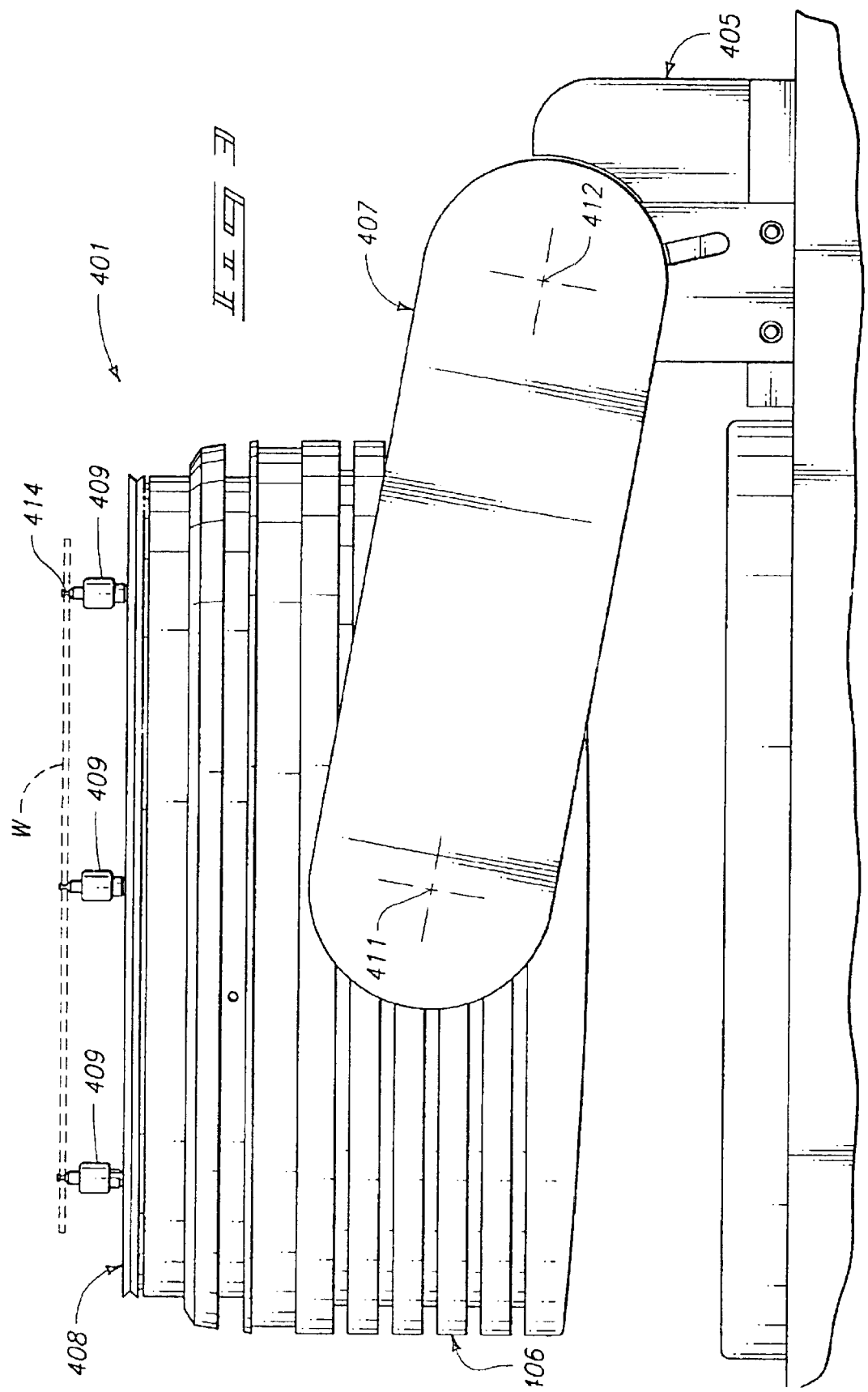
FIG. 3 is a side elevation view of the processing head of the present invention showing the head in a "receive wafer" position.

Turning now to FIGS. 3–5, the sequence of placing a workpiece on the workpiece support and exposing the workpiece to the semiconductor manufacturing process is shown. In FIG. 3, a workpiece W is shown as being held in place by fingertips 414 of fingers 409. Workpiece W is grasped by fingertips 414 after being placed in position by robot or other means.

Once the workpiece W has been securely engaged by fingertips 414, processing head 406 can be rotated about process head pivot axis 411 as shown in FIG. 4. Process head 406 is preferably rotated about axis 411 until workpiece W is at a desired angle, such as approximately horizontal. The operator arm 407 is pivoted about operator arm pivot axis 412 in a manner so as to coordinate the angular position of processing head 406. In the closed position, the processing head is placed against the rim of bowl 416 and the workpiece W is essentially in a horizontal plane. Once the workpiece W has been secured in this position, any of a series of various semiconductor manufacturing process steps may be applied to the workpiece as it is exposed in the processing bowl 417.

Since the processing head 406 is engaged by the operator arm 407 on the left and right side by the preferably horizontal axis 411 connecting the pivot points of processing head 406, a high degree of stability about the horizontal plane is obtained. Further, since the operator arm 407 is likewise connected to the operator base 405 at left and right sides along the essentially horizontal line 412 connecting the pivot points of the operator arm, the workpiece support forms a structure having high rigidity in the horizontal plane parallel to and defined by axes 411 and 412. Finally, since operator base 405 is securely attached to the semiconductor process machine 400, rigidity about the spin axis 410 is also achieved.

Similarly, since processing head 406 is nested within the fork or yoke shaped operator arm 407 having left and right forks 418 and 419, respectively, as shown in FIG. 2, motion due to cantilevering of the processing head is reduced as a result of the reduced moment arm defined by the line connecting pivot axes 411 and 412.

In a typical semiconductor manufacturing process, the workpiece holder 408 will rotate the workpiece, having the process head 406 secured at two points, that is, at the left and right forks 418 and 419, respectively, the vibration induced by the rotation of the workpiece holder 408 will be significantly reduced along the axis 411.

A more complete description of the components of the present invention and their operation and interrelation follows.

Operator Base

Figures 7, 8, 9:
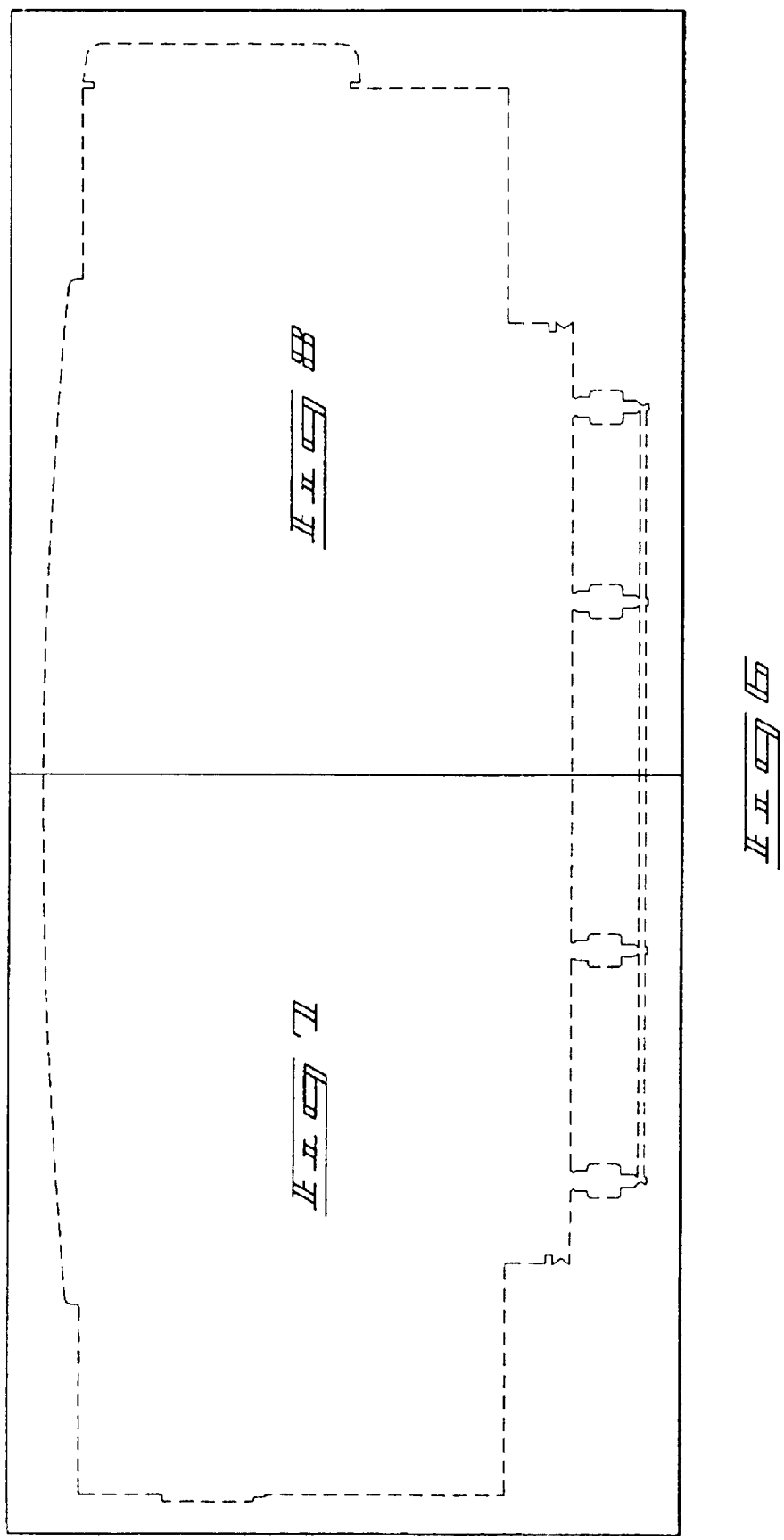
FIG. 7 is a front elevation sectional view of the left half of the processing head of the apparatus of the present invention also showing a first embodiment of the wafer holding fingers.
FIG. 8 is a front elevation sectional view of the left half of the processing head of the apparatus of the present invention also showing a first embodiment of the wafer holding fingers.
FIG. 9 is an isometric view of the operator base and operator arm of the apparatus of the present invention with the protective cover removed.
Figure 7:
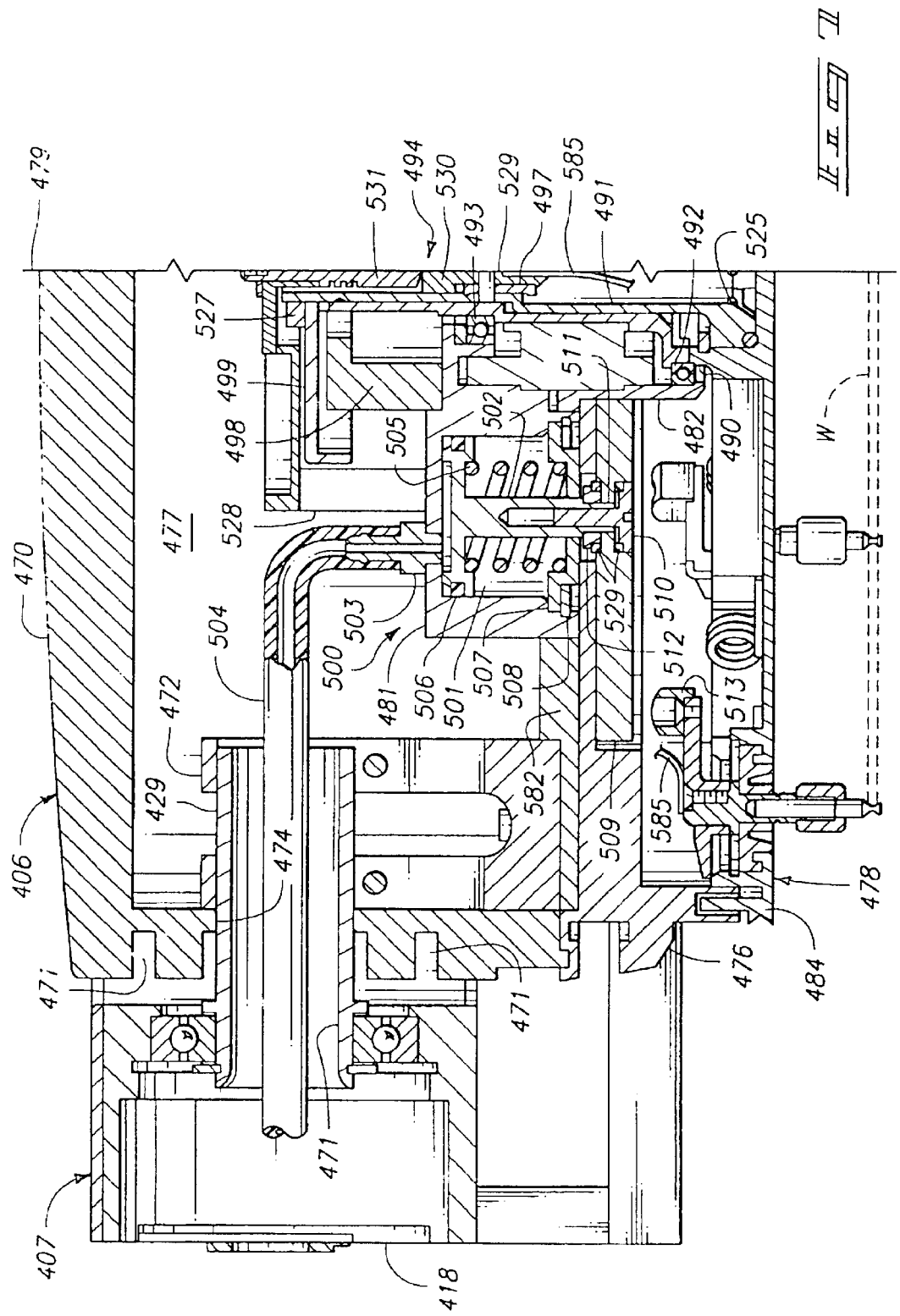

Turning now to FIG. 9, operator base 405 is shown. The present invention advantageously includes an operator base 405 which forms an essentially yoke-shaped base having an operator base back portion 420, an operator base left yoke arm 421, and an operator base right yoke arm 422. Yoke arms 421 and 422 are securely connected to the base of the yoke 420. In the preferred embodiment, the yoke arms are secured to the yoke base by the yoke arm fasteners 423. The yoke arm base in turn is advantageously connected to the semiconductor process machine 400 as shown in FIG. 1.

The upper portions of the yoke arm advantageously include receptacles for housing the operator arm bearings 424 which are used to support the pivot shafts of the operator arm 425, described more fully below.

Operator Arm

Still viewing FIG. 9, the present invention advantageously includes an operator arm 407. As described previously, operator arm 407 preferably pivots about the operator arm pivot axis 412 which connects the center line defined by the centers of operator arm pivot bearings 424.

Operator arm or pivot arm 407 is advantageously constructed in such a manner to reduce mass cantilevered about operator arm pivot axis 412. This allows for quicker and more accurate positioning of the pivot arm as it is moved about pivot arm axis 412.

Figure 11:
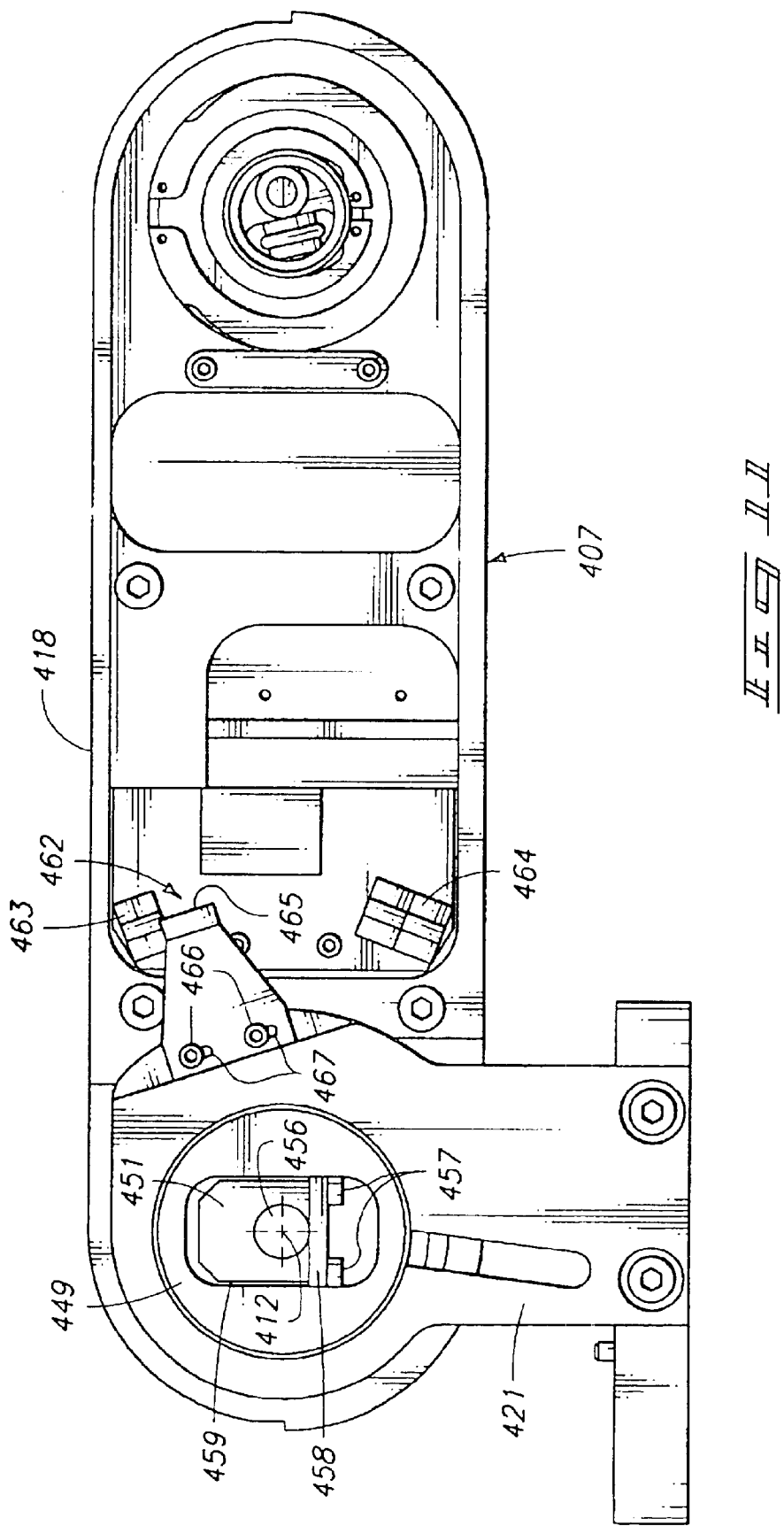
FIG. 11 is a left side elevation view of the operator arm of the present invention showing the operator arm drive mechanism.

The left fork of the pivot arm 418, shown more clearly in FIG. 11, houses the mechanism for causing the pivot arm to lift or rotate about pivot arm pivot axis 412. Pivot arm right fork 419, shown more clearly in FIG. 10, houses the mechanism for causing the processing head 406 (not shown) to rotate about the process head pivot axis 411.

The process arm rear cavity 426, shown in FIG. 9, houses the lift motor 452 for causing the operator arm 407 to rotate about pivot arm axis 412. Process arm rear cavity 426 also houses rotate motor 428 which is used to cause the processing head 406 to rotate about the processing head pivot axis 411. The rotate motor 428 may more generally be described as a processing head pivot or rotate drive. Processing head 406 is mounted to operator arm 407 at processing head left pivot shaft 429 and processing head right pivot shaft 430.

Operator arm 407 is securely attached to left yoke arm 421 and right yoke arm 422 by operator arm pivot shafts 425 and operator arm pivot bearings 424, the right of which such bearing shaft and bearings are shown in FIG. 9.

Operator Arm-Processing Head Rotate Mechanism

Turning now to FIG. 13, a sectional plan view of the right rear corner of operator arm 407 is shown. The right rear section of operator arm 407 advantageously contains the rotate mechanism which is used to rotate processing head 406 about processing head pivot shafts 430 and 429. Processing head rotate mechanism 431 preferably consists of rotate motor 428 which drives rotate shaft 432, more generally described as a processing head drive shaft. Rotate shaft 432 is inserted within rotate pulley 425 which also functions as the operator arm pivot shaft. As described previously, the operator arm pivot shaft/lift pulley is supported in operator arm pivot bearings 424, which are themselves supported in operator base yoke arm 422. Rotate shaft 432 is secured within left pulley 424 by securing collar 433. Securing collar 433 secures rotate pulley 425 to rotate shaft 432 in a secure manner so as to assure a positive connection between rotate motor 428 and rotate pulley 425. An inner cover 584 is also provided.

Rotate motor 428 is disposed within process arm rear cavity 426 and is supported by rotate motor support 434. Rotate motor 428 preferably is a servo allowing for accurate control of speed and acceleration of the motor. Servo motor 428 is advantageously connected to rotate encoder 435 which is positioned on one end of rotate motor 428. Rotate encoder 435, more generally described as a processing head encoder, allows for accurate measurement of the number of rotations of rotate motor 428, as well as the position, speed, and acceleration of the rotate shaft 432. The information from the rotate encoder may be used in a rotate circuit which may then be used to control the rotate motor when the rotate motor is a servo. This information is useful in obtaining the position and rate of travel of the processing head, as well as controlling the final end point positions of the processing head as it is rotated about process head rotate axis 411.

The relationship between the rotate motor rotations, as measured by rotate encoder 435, may easily be determined once the diameters of the rotate pulley 425 and the processing head pulley 438 are known. These diameters can be used to determine the ratio of rotate motor relations to processing head rotations. This may be accomplished by a microprocessor, as well as other means.

Rotate pulley 425 is further supported within operator arm 407 by rotate pulley in board bearing 436 which is disposed about an extended flange on the rotate pulley 425. Rotate pulley in board bearing 436 is secured by the body of the operator arm 407, as shown in FIG. 13.

Rotate pulley 425 advantageously drives rotate belt 437, more generally described as a flexible power transmission coupling. Referring now to FIG. 10, rotate belt 437 is shown in the side view of the right arm 419 of the operator arm 407. Rotate belt 437 is preferably a toothed timing belt to ensure positive engagement with the processing head drive wheel, more particularly described herein as the processing head pulley 438, (not shown in this view). In order to accommodate the toothed timing belt 437, both the rotate pulley 425 and the processing head pulley 438 are advantageously provided with gear teeth to match the tooth pattern of the timing belt to assure positive engagement of the pulleys with the rotate belt.

Rotate mechanism 431 is preferably provided with rotate belt tensioner 439, useful for adjusting the belt to take up slack as the belt may stretch during use, and to allow for adjustment of the belt to assure positive engagement with both the rotate pulley and the processing head pulley. Rotate belt tensioner 439 adjusts the tension of rotate belt 437 by increasing the length of the belt path between rotate pulley 425 and processing head pulley 438, thereby accommodating any excess length in the belt. Inversely, the length of the belt path may also be shortened by adjusting rotate belt tensioner 439 so as to create a more linear path in the upper portion of rotate belt 437. The tensioner 439 is adjusted by rotating it about tensioner hub 468 and securing it in a new position.

Turning now to FIG. 13, processing head pulley 438 is mounted to processing head rotate shaft 430 in a secured manner so that rotation of processing head pulley 438 will cause processing head rotate shaft 430 to rotate. Processing head shaft 430 is mounted to operator arm right fork 419 by processing head shaft bearing 440, which in turn is secured in the frame of the right fork 419 by processing head rotate bearing 469. In a like manner, processing head shaft 429 is mounted in operator arm left fork 418 by processing head shaft bearing 441, as shown in FIG. 9.

Processing head pivot shafts 430 and 429 are advantageously hollow shafts. This feature is useful in allowing electrical, optical, pneumatic, and other signal and supply services to be provided to the processing head. Service lines such as those just described which are routed through the hollow portions of processing head pivot shafts 429 and 430 are held in place in the operator arms by cable brackets 442 and 443. Cable brackets 442 and 443 serve a dual purpose. First, routing the service lines away from operating components within the operator arm left and right forks. Second, cable brackets 442 and 443 serve a useful function in isolating forces imparted to the service cables by the rotating action of processing head 406 as it rotates about processing head pivot shafts 429 and 430. This rotating of the processing head 406 has the consequence that the service cables are twisted within the pivot shafts as a result of the rotation, thereby imparting forces to the cables. These forces are preferably isolated to a particular area so as to minimize the effects of the forces on the cables. The cable brackets 442 and 443 achieve this isolating effect.

The process head rotate mechanism 431, shown in FIG. 13, is also advantageously provided with a rotate overtravel protect 444, which functions as a rotate switch. Rotate overtravel protect 444 preferably acts as a secondary system to the rotate encoder 435 should the control system fail for some reason to stop servo 428 in accordance with a predetermined position, as would be established by rotate encoder 435. Turning to FIG. 13, the rotate overtravel protect 444 is shown in plan view. The rotate overtravel protect preferably consists of rotate optical switches 445 and 446, which are configured to correspond to the extreme (beginning and end point) portions of the processing head, as well as the primary switch component which preferably is a rotate flag 447. Rotate flag 447 is securely attached to processing head pulley 438 such that when processing head shaft 430 (and consequently processing head 406) are rotated by virtue of drive forces imparted to the processing head pulley 425 by the rotate belt 437, the rotate flag 447 will rotate thereby tracking the rotate motion of processing head 406. Rotate optical switches 445 and 446 are positioned such that rotate flag 447 may pass within the optical path generated by each optical switch, thereby generating a switch signal. The switch signal is used to control an event such as stopping rotate motor 428. Rotate optical switch 445 will guard against overtravel of processing head 406 in one direction, while rotate optical switch 446 will provide against overtravel of the processing head 406 in the opposite direction.

Operator Arm-Lift Mechanism

Operator arm 407 is also advantageously provided with an operator arm lift mechanism 448 which is useful for causing the operator arm to lift, that is, to pivot or rotate about operator arm pivot axis 412. Turning to FIG. 14, the operator arm lift mechanism 448 is shown in the sectional plan view of the right rear corner of operator arm 407.

Operator arm lift mechanism 448 is advantageously driven by lift motor 452. Lift motor 452 may be more generally described as an operator arm drive or operator arm pivot drive. Lift motor 452 is preferably a servo motor and is more preferably provided with an operator encoder, more specifically described as lift motor encoder 456. When lift motor 452 is a servo motor coupled with lift encoder 456, information regarding the speed and absolute rotational position of the lift motor shaft 454 may be known from the lift encoder signal. Additionally, by virtue of being a servo mechanism, the angular speed and acceleration of lift motor 452 may be easily controlled by use of the lift signal by an electrical circuit. Such a lift circuit may be configured to generate desired lift characteristics (speed, angle, acceleration, etc.). FIG. 14 shows that the lift operator may also include a brake 455 which is used to safely stop the arm if power fails.

Lift motor 452 drives lift motor shaft 454 which in turn drives lift gear drive 453. Lift gear drive 453 is a gear reduction drive to produce a reduced number of revolutions at lift drive shaft 456 as the function of input revolutions from lift motor shaft 454.

Lift drive gear shaft 456 is secured to lift anchor 451 which is more clearly shown in FIG. 11. Lift anchor 451 is preferably shaped to have at least one flat side for positively engaging lift bushing 449. Lift anchor 451 is secured to lift drive shaft 456 by anchor plate 458 and anchor fasteners 457. In this manner, when lift drive shaft 456 is rotated, it will positively engage lift bushing 449. Returning to FIG. 14, it is seen that lift bushing 449 is mounted in operator left yoke arm 421, and is thus fixed with respect to operator base 405. Lift bearing 450 is disposed about the lift bushing shank and is supported in operator arm 407 by lift bearing support 460 which is a bushing configured to receive lift bearing 450 on a first end and to support lift gear drive 453 on a second end. Lift bearing support 460 is further supported within operator arm 407 by operator arm frame 461. The lift arm is thus free to pivot about lift bushing 449 by virtue of lift bearing 450.

In operation, as lift motor 452 causes lift gear drive 453 to produce rotations at gear drive shaft 456, lift anchor 451 is forced against lift bushing 449 which is securely positioned within right operator yoke arm 421. The reactive force against the lift anchor 451 will cause lift bearing support 460 to rotate relative to lift bushing 449. Since lift bushing 449 is fixed in operator base 405, and since operator base 405 is fixed to processing machine 400, rotation of lift bearing support 460 will cause lift arm 407 to pivot about operator arm pivot axis 412, thereby moving the processing head 406. It is advantageous to consider the gear drive shaft (or "operator arm shaft") as being fixed with respect to operator base 405 when envisioning the operation of the lift mechanism.

Operator lift mechanism 448 is also advantageously provided with a lift overtravel protect 462 or lift switch. The lift rotate protect operates in a manner similar to that described for the rotate overtravel protect 444 described above. Turning now to FIG. 11, a left side view of the operator arm 407 is shown which shows the lift overtravel protect in detail.

The lift overtravel protect preferably includes a lift optical switch low 463 and a lift optical switch high 464. Other types of limit switches can also be used. The switch high 464 and switch low 463 correspond to beginning and endpoint travel of lift arm 407. The primary lift switch component is lift flag 465, which is firmly attached to left operator base yoke arm 421. The lift optical switches are preferably mounted to the movable operator arm 407. As operator arm 407 travels in an upward direction in pivoting about operator arm pivot axis 412, lift optical switch high 464 will approach the lift flag 465. Should the lift motor encoder 455 fail to stop the lift motor 454 as desired, the lift flag 465 will break the optical path of the lift optical switch high 464 thus producing a signal which can be used to stop the lift motor. In like manner, when the operator arm 407 is being lowered by rotating it in a clockwise direction about the operator arm pivot axis 412, as shown in FIG. 11, overtravel of operator arm 407 will cause lift optical switch low 463 to have its optical path interrupted by lift flag 465, thus producing a signal which may be used to stop lift motor 452. As is shown in FIG. 11, lift flag 465 is mounted to left operator base yoke arm 421 with slotted lift flag mounting slots 467 and removable lift flag fasteners 466. Such an arrangement allows for the lift flag to be adjusted so that the lift overtravel protect system only becomes active after the lift arm 407 has traveled beyond a preferred point.

Processing Head

Turning now to FIG. 6, a front elevation schematic view of the processing head 406 is shown. Processing head 406 is described in more detail in FIGS. 7 and 8. Turning now to FIG. 7, a sectional view of the left front side of processing head 406 is shown. Processing head 406 advantageously includes a processing head housing 470 and frame 582. Processing head 406 is preferably round in shape in plan view allowing it to easily pivot about process head pivot axis 411 with no interference from operator arm 407, as demonstrated in FIGS. 3–5. Returning to FIG. 7, processing head housing 470 more preferably has circumferential grooves 471 which are formed into the side of process head housing 470. Circumferential grooves 471 have a functional benefit of increasing heat dissipation from processing head 406.

The sides of processing head housing 470 are advantageously provided with rotate shaft openings 474 and 475 for receiving respectively left and right processing head pivot shafts 429 and 430. Processing head pivot shafts 429 and 430 are secured to the processing head 406 by respective left and right processing head mounts 472 and 473. Processing head mounts 472 and 473 are affirmative connected to processing head frame 582 which also supports processing head door 476 which is itself securely fastened to processing head housing 470. Consequently, processing head pivot shafts 429 and 430 are fixed with respect to processing head 407 and may therefore rotate or pivot with respect to operator arm 407. The details of how processing head pivot shafts 429 and 430 are received within operator arm 407 were discussed supra.

Processing head housing, 470 forms a processing head void 477 which is used to house additional processing head components such as the spin motor, the pneumatic finger actuators, and service lines, all discussed more fully below.

The processing head also advantageously includes a workpiece holder and fingers for holding a workpiece, as is also more fully described below.

Processing Head Spin Motor

In a large number of semiconductor manufacturing processes, is desirable to spin the semiconductor wafer or workpiece during the process, for example to assure even distribution of applied process fluids across the face of the semiconductor wafer, or to aid drying of the wafer after a wet chemistry process. It is therefore desirable to be able to rotate the semiconductor workpiece while it is held by the processing head.

The semiconductor workpiece is held during the process by workpiece holder 478 described more fully below. In order to spin workpiece holder 478 relative to processing head 406 about spin axis 479, an electric, pneumatic, or other type of spin motor or workpiece spin drive is advantageously provided.

Turning to FIG. 8, spin motor 480 has armatures 526 which drive spin motor shaft 483 in rotational movement to spin workpiece holder 478. Spin motor 480 is supported by bottom motor bearing 492 in bottom motor housing 482. Bottom motor housing 482 is secured to processing head 406 by door 476. Spin motor 480 is thus free to rotate relative to processing head housing 470 and door 476. Spin motor 480 is preferably additionally held in place by top motor housing 481 which rests on processing head door 476. Spin motor 480 is rotationally isolated from top motor housing 481 by top motor bearing 493, which is disposed between the spin motor shaft 483 and top motor housing 481.

The spin motor is preferably an electric motor which is provided with an electrical supply source through pivot shaft 429 and/or 430. Spin motor 480 will drive spin motor shaft 483 about spin axis 479.

To secure workpiece holder rotor 484 to spin motor shaft 433, workpiece holder rotor 484 is preferably provided with a rotor hub 485. Rotor hub 485 defines a rotor hub recess 486 which receives a flared end of workpiece bolder shaft 491. The flared end 487 of workpiece holder shaft 491 is secured within the rotor hub recess 486 by workpiece shaft snap-ring 488 which fits within rotor recess groove 489 above the flared portion 437 of workpiece holder shaft 491.

The workpiece holder shaft 491 is fitted inside of spin motor shaft 483 and protrudes from the top of the spin motor shaft. The top of workpiece holder shaft 491 is threaded to receive thin nut 527 (see FIG. 7). Thin nut 527 is tightened against optical tachometer 499 (describe more fully below). Optical tachometer 499 is securely attached to spin motor shaft 483 such that as the spin motor 480 rotationally drives the spin motor shaft 483, the workpiece holder shaft 491 is also driven.

Workpiece holders may be easily changed out to accommodate various configurations which may be required for the various processes encountered in manufacturing of the semiconductors. This is accomplished by removing spin encoder 498 (described below), and then thin nut 527. Once the thin nut has been removed the workpiece holder 478 will drop away from the processing head 406.

The processing head is also advantageously provided with a spin encoder 498, more generally described as a workpiece holder encoder, and an optical tachometer 499. As shown in FIG. 7, spin encoder 498 is mounted to top motor housing 481 by encoder support 528 so as to remain stationary with respect to the processing head 406. Optical tachometer 499 is mounted on spin motor shaft 483 so as to rotate with the motor 480. When operated in conjunction, the spin encoder 498 and optical tachometer 499 allow the speed, acceleration, and precise rotational position of the spin motor shaft (and therefore the workpiece holder 478) to be known. In this manner, and when spin motor 480 is provided as a servo motor, a high degree of control over the spin rate, acceleration, and rotational angular position of the workpiece with respect to the process head 407 may be obtained.

In one application of the present invention the workpiece support is used to support a semiconductor workpiece in an electroplating process. To accomplish the electroplating an electric current is provided to the workpiece through an alternate embodiment of the fingers (described more fully below). To provide electric current to the finger, conductive wires are run from the tops of the fingers inside of the workpiece holder 478 through the electrode wire holes 525 in the flared lower part of workpiece holder shaft 491. The electrode wires are provided electric current from electrical lines run through processing pivot shaft 429 and/or 430.

The electrical line run through pivot shaft 430/429 will by nature be stationary with respect to processing head housing 470. However, since the workpiece holder rotor is intended to be capable of rotation during the electroplating process, the wires passing into workpiece support shaft 491 through electrode wire holes 525 may rotate with respect to processing head housing 470. Since the rotating electrode wires within workpiece shaft 491 and the stationary electrical supply lines run through pivot shaft 430/429 must be in electrical communication, the rotational/stationary problem must be overcome. In the preferred embodiment, this is accomplished by use of electrical slip ring 494.

Electrical slip ring 494, shown in FIG. 7, has a lower wire junction 529 for receiving the conductive ends of the electrical wires passing into workpiece holder shaft 491 by electrode wire holes 525. Lower wire junction 529 is held in place within workpiece holder shaft 491 by insulating cylindrical collar 497 and thus rotates with spin motor shaft 483. The electrode wires terminate in a single electrical contact 531 at the top of the lower wire junction 529. Electrical slip ring 494 further has a contact pad 530 which is suspended within the top of workpiece holder shaft 491. Contact pad 530 is mechanically fastened to spin encoder 498, which, as described previously, remains stationary with respect to processing head housing 470. The stationary-to-rotational transition is made at the tip of contact pad 530, which is in contact with the rotating electrical contact 531. Contact pad 530 is electrically conductive and is in electrical communication with electrical contact 531. In the preferred embodiment, contact pad 530 is made of copper-beryllium. A wire 585 carries current to finger assemblies when current supply is needed, such as on the alternative embodiment described below.

Processing Head Finger Actuators

Workpiece holder 478, described more fully below, advantageously includes fingers for holding the workpiece W in the workpiece holder, as shown in FIGS. 7 and 8. Since the workpiece holder 478 may be removed as described above, it is possible to replace one style of workpiece holder with another. Since a variety of workpiece holders with a variety of fingers for holding the workpiece is possible, it is desirable to have a finger actuator mechanism disposed within processing head 407 which is compatible with any given finger arrangement. The invention is therefore advantageously provided with a finger actuator mechanism.

Turning to FIG. 7, a finger actuator mechanism 500 is shown. Finger actuator mechanism 500 is preferably a pneumatically operated mechanism. A pneumatic cylinder is formed by a cavity 501 within top motor housing 481. Pneumatic piston 502 is disposed within cavity 501. Pneumatic piston 502 is biased in an upward position within cavity 501 by actuator spring 505. Actuator spring 505 is confined within cavity 501 by cavity end cap 507, which is itself constrained by retaining ring 508. Pneumatic fluid is provided to the top of pneumatic piston 502 via pneumatic inlet 503. Pneumatic fluid is provided to pneumatic inlet 503 by pneumatic supply line 504 which is routed through processing head pivot shaft 429 and hence through the left fork 418 of the operator arm 407. Turning to FIG. 8, it can be seen that a second pneumatic cylinder which is identical to the pneumatic cylinder just describes is also provided.

Pneumatic piston 502 is attached to actuator plate 509 by actuator plate connect screw 510. Wave springs 529 provide flexibility to the connecting at screws 510. Actuator plate 509 is preferably an annular plate concentric with the spin motor 580 and disposed about the bottom motor housing 482, and is symmetrical about spin axis 479. Actuator plate 509 is secured against pneumatic piston 502 by bushing 512 which is disposed in pneumatic piston recess 511 about pneumatic piston 502. Bushing 512 acts as a support for wave springs 529 to allow a slight tilting of the actuator plate 509. Such an arrangement is beneficial for providing equal action against the finger actuator contracts 513 about the entire actuator plate or ring 509.

When pneumatic fluid is provided to the space above the pneumatic piston 502, the pneumatic piston 502 travels in a downward direction compressing actuator spring 505. As pneumatic piston 502 travels downward, actuator plate 509 is likewise pushed downward by flexible bushing 512. Actuator plate 509 will contact finger actuator contacts 513 causing the fingers to operate as more fully described below.

Actuator seals 506 are provided to prevent pneumatic gas from bypassing the top of the pneumatic piston 502 and entering the area occupied by actuator spring 505.

Processing Head Workpiece Holder

Workpiece holder 478 is used to hold the workpiece W, which is typically a semiconductor wafer, in position during the semiconductor manufacturing process.

Turning now to FIG. 8, a finger 409 is shown in cross section. Finger 409 advantageously includes a finger actuator contact 513 which is contacted by actuator plate 509, as described above. Finger actuator contact 513 is connected to finger actuator lever 514 (more generally, "finger extension") which is cantilevered from and connected to the finger stem 515. Finger stem 515 is inserted into finger actuator lever 514. Disposed about the portion of the finger actuator lever which encompasses and secures finger stem 515 is finger diaphragm 519. Finger diaphragm 519 is preferably made of a flexible material such as Tetrafluoroethylene, also known as Teflon® (registered trademark of E. I. DuPont de Nemours Company). Finger 409 is mounted to workpiece holder rotor 484 using finger diaphragm 519. Finger diaphragm 519 is inserted into the finger opening 521 in rotor 484. The finger diaphragm 519 is inserted into the rotor from the side opposite that to which the workpiece will be presented. Finger diaphragm 519 is secured to rotor 484 against rotor diaphragm lip 523. Forces are intentionally imparted as a result of contact between the actuator plate 509 and the finger actuator contact 513 when the finger actuator mechanism 500 is actuated.

Finger actuator lever 514 is advantageously biased in a horizontal position by finger spring 520 which acts on finger actuator tab 522 or which in turn is connected to finger actuator lever 514. Finger spring 520 is preferably a torsion spring secured to the workpiece holder rotor 484.

Finger stem 515 is also preferably provided with finger collar or nut 517 which holds the finger stem 515 against shoulder 518. Finger collar 517 threads or otherwise securely fits over the lower end of finger actuator lever 514. Below the finger collar 517, finger stem 515 extends for a short distance and terminates in fingertip 414. Fingertip 414 contains a slight groove or notch which is beneficially shaped to receive the edge of the workpiece W.

In actuation, finger actuator plate 509 is pushed downward by finger actuator mechanism 500. Finger actuator plate 509 continues its downward travel contacting finger actuator contacts 513. As actuator plate 509 continues its downward travel, finger actuator contacts are pushed in a downward direction. As a result of the downward direction, the finger actuator levers 514 are caused to pivot.

In the preferred embodiment, a plurality of fingers are used to hold the workpiece. In one example, six fingers were used. Once the actuator plate 509 has traveled its full extent, the finger stems 515 will be tilted away from the spin axis 479. The circumference described by the fingertips in this spread-apart position should be greater than the circumference of the workpiece W. Once a workpiece W has been positioned proximate to the fingertips, the pneumatic pressure is relieved on the finger actuator and the actuator spring 505 causes the pneumatic piston 502 to return to the top of the cavity 501. In so doing, the actuator plate 509 is retracted and the finger actuator levers are returned to their initial position by virtue of finger springs 520.

Semiconductor Workpiece Holder—Electroplating Embodiment

FIG. 15 is a side elevational view of a semiconductor workpiece holder 810 constructed according to a preferred aspect of the invention.

Workpiece holder 810 is used for processing a semiconductor workpiece such as a semiconductor wafer shown in phantom at W. One preferred type of processing undertaken with workpiece holder 810 is a workpiece electroplating process in which a semiconductor workpiece is held by workpiece holder 810 and an electrical potential is applied to the workpiece to enable plating material to be plated thereon. Such can be, and preferably is accomplished utilizing a processing enclosure or chamber which includes a bottom half or bowl 811 shown in phantom lines in FIG. 1. Bottom half 811 together with workpiece holder 810 forms a sealed, protected chamber for semiconductor workpiece processing. Accordingly, preferred reactants can be introduced into the chamber for further processing. Another preferred aspect of workpiece holder 810 is that such moves, rotates or otherwise spins the held workpiece during processing as will be described in more detail below.

Processing Read and Processing Head Operator

Turning now to FIG. 15, semiconductor workpiece holder 810 includes a workpiece support 812. Workpiece support 812 advantageously supports a workpiece during processing. Workpiece support 812 includes a processing head or spin head assembly 814. Workpiece support 812 also includes a head operator or lift/rotate assembly 816. Spin head assembly 814 is operatively coupled with lift/rotate assembly 816. Spin head assembly 814 advantageously enables a held workpiece to be spun or moved about a defined axis during processing. Such enhances conformal coverage of the preferred plating material over the held workpiece. Lift/rotate assembly 816 advantageously lifts spin head assembly 814 out of engagement with the bottom half 811 of the enclosure in which the preferred processing takes place. Such lifting is preferably about an axis $x_1$. Once so lifted, lift/rotate assembly 816 also rotates the spin head and held workpiece about an axis $x_2$ so that the workpiece can be presented face-up and easily removed from workpiece support 812. In the illustrated and preferred embodiment, such rotation is about 180° from the disposition shown in FIG. 15. Advantageously, a new workpiece can be fixed or otherwise attached to the workpiece holder for further processing as described in detail below.

The workpiece can be removed from or fixed to workpiece holder 810 automatically by means of a robotically controlled arm. Alternatively, the workpiece can be manually removed from or fixed to workpiece holder 810. Additionally, more than one workpiece holder can be provided to support processing of multiple semiconductor workpieces. Other means of removing and fixing a semiconductor workpiece are possible.

FIG. 16 is a front sectional view of the FIG. 15 semiconductor workpiece holder. As shown, workpiece support 812 includes a motor 818 which is operatively coupled with a rotor 820. Rotor 820 is advantageously mounted for rotation about a rotor spin axis 822 ad serves as a staging platform upon which at least one finger assembly 824 is mounted. Preferably, more than one finger assembly is mounted on rotor 820, and even more preferably, four or more such finger assemblies are mounted thereon and described in detail below although only two are shown in FIG. 16. The preferred finger assemblies are instrumental in fixing or otherwise holding a semiconductor workpiece on semiconductor workpiece holder 810. Each finger assembly is advantageously operatively connected or associated with a actuator 825. The actuator is preferably a pneumatic linkage which serves to assist in moving the finger assemblies between a disengaged position in which a workpiece may be removed from or added to the workpiece holding, and an engaged position in which the workpiece is fixed upon the workpiece holder for processing. Such is described in more detail below.

FIG. 17 is a top or plan view of rotor 820 which is effectively taken along line 3—3 in FIG. 16. FIG. 16 shows the preferred four finger assemblies 824. As shown, rotor 820 is generally circular and resembles from the top a spoked wheel with a nearly continuous bottom surface. Rotor 820 includes a rotor center piece 826 at the center of which lies rotor axis 822. A plurality of struts or spokes 828 are joined or connected to rotor center 826 and extend outwardly to join with and support a rotor perimeter piece 830. Advantageously, four of spokes 828 support respective preferred finger assemblies 824. Finger assemblies 824 are advantageously positioned to engage a semiconductor workpiece, such as a wafer W which is shown in phantom lines in the position such would occupy during processing. When a workpiece is so engaged, it is fixedly held in place relative to the rotor so that processing can be effected. Such processing can include exposing the workpiece to processing conditions which are effective to form a layer of material on one or more surfaces or potions of a wafer or other workpiece. Such processing can also include moving the workpiece within a processing environment to enhance or improve conformal coverage of a layering material. Such processing can, and preferably does include exposing the workpiece to processing conditions which are effective to form an electroplated layer on or over the workpiece.

Finger Assembly

Referring now to FIGS. 18–20, various views of a preferred finger assembly are shown. The preferred individual finger assemblies are constructed in accordance with the description below. FIG. 18 is an isolated side sectional view of a finger assembly constructed in accordance with a preferred aspect of the invention. FIG. 19 is a side elevational view of the finger assembly turned 90° from the view of FIG. 18. FIG. 20 is a fragmentary cross-sectional enlarged view of a finger assembly and associated rotor structure. The finger assembly as set forth in FIGS. 18 and 19 is shown in the relative position such as it would occupy when processing head or spin head assembly 814 (FIGS. 15 and 16) is moved or rotated by head operator or lift/rotate assembly 816 into a position for receiving a semiconductor workpiece.

The finger assembly is shown in FIGS. 18 and 20 in an orientation of about 180° from the position shown in FIG. 20. This typically varies because spin head assembly 814 is rotated 180° from the position shown in FIGS. 15 and 16 in order to receive a semiconductor workpiece. Accordingly, finger assemblies 824 would be so rotated. Lesser degrees of rotation are possible.

Finger assembly 824 includes a finger assembly frame 832. Preferably, finger assembly frame 832 is provided in the form of a sealed contact sleeve which includes an angled slot 832*a*, only a portion of which is shown in FIG. 19. Angled slot 832*a* advantageously enables the finger assembly to be moved, preferably pneumatically, both longitudinally and rotationally as will be explained below. Such preferred movement enables a semiconductor workpiece to be engaged, electrically contacted, and processed in accordance with the invention.

Finger assembly frame 832 includes a finger assembly frame outer flange 834 which, as shown in FIG. 20, engages an inner drive plate portion 836 of rotor 820. Such engagement advantageously fixes or seats finger assembly frame 832 relative to rotor 820. Such, in turn, enables the finger assembly, or a portion thereof, to be moved relative to the rotor for engaging the semiconductor workpiece.

Finger Assembly Drive System

Referring to FIGS. 16 and 18–20, the finger assembly includes a finger assembly drive system which is utilized to move the finger assembly between engaged and disengaged positions. The finger assembly drive system includes a bearing 838 and a collet 840 operatively adjacent the bearing. Bearing 838 includes a bearing receptacle 839 for receiving a pneumatically driven source, a fragmented portion of which is shown directly above the receptacle in FIG. 20. The pneumatically driven source serves to longitudinally reciprocate and rotate collet 840, and hence a preferred portion of finger assembly 824. A preferred pneumatically driven source is described below in more detail in connection with the preferred longitudinal and rotational movement effectuated thereby. Such longitudinal reciprocation is affected by a biasing mechanism in the form of a spring 842 which is operatively mounted between finger assembly frame 832 and a spring seat 844. The construction develop a bias between finger assembly frame 832 and spring seat 844 to bias the finger into engagement against a wafer. Advantageously, the cooperation between the above mentioned pneumatically driven source as affected by the biasing mechanism of the finger assembly drive system, enable collet 840 to be longitudinally reciprocated in both extending and retracting modes of movement. As such, finger assembly 824 includes a biased portion which is biased toward a first position and which is movable to a second position away from the first position. Other manners of longitudinally reciprocating the finger assembly are possible.

Finger Assembly Electrical System

Referring to FIGS. 16 and 19, the finger assembly preferably includes a finger assembly electrical system which is utilized to effectuate an electrical bias to a held workpiece and supply electrical current relative thereto. The finger assembly electrical system includes a pin connector 846 and a finger 848. Pin connector 846 advantageously provides an electrical connection to a power source (not shown) via wire 585 and associate slip ring mechanism, described above in connection with FIG. 7 and other Figs. This is for delivering an electrical bias and current to an electrode which is described below. Pin connector 846 also rides within angled slot 832*a* thereby mechanically defining the limits to which the finger assembly may be both longitudinally and rotationally moved.

Finger 848 is advantageously fixed or secured to or within collet 840 by a nut 850 which threadably engages a distal end portion of collet 840 as shown best in FIG. 18. An anti-rotation pin 852 advantageously secures finger 848 within collet 840 and prevents relative rotation therebetween. Electrical current is conducted from connector 846 through collet 840 to finger 860, all of which are conductive, such as from stainless steel. The finger and collet can be coated with a suitable dielectric coating 856, such as TEFLON or others. The collet 840 and finger member 860 are in one form of the invention made hollow and tubular to conduct a purge gas therethrough.

Finger assembly 824 may also optionally include a distal tip or finger tip 854. Tip 854 may also have a purge gas passage formed therethrough. Finger tip 854 advantageously engages against a semiconductor workpiece (see FIG. 20) and assists in holding or fixing the position of the workpiece relative to workpiece holder 810. Finger tip 854 also assists in providing an operative electrical connection between the finger assembly and a workpiece to which an electrical biased is to be applied and through which current can move. Finger tip 85 can include an electrode contact 858 for electrically contacting a surface of a semiconductor workpiece once such workpiece is secured as describe below.

Finger Assembly Drive System Interface

A finger assembly drive system interface is operatively coupled with the finger assembly drive system to effectuate movement of the finger assembly between the engaged and disengaged positions. A preferred finger assembly drive system interface is described with reference to FIGS. 16 and 20. One component of the finger assembly drive system interface is a finger actuator 862. Finger actuator 862 is advantageously provided for moving the finger assembly between the engaged and disengaged position. Finger actuator 862 acts by engaging bearing receptacle 839 and moving finger assembly 824 between an engaged position and a disengaged position. In the engaged position, finger tip 854 is engaged against a semiconductor workpiece. In the disengaged position finger tip 854 is moved away from the workpiece.

The finger assembly drive system interface includes pneumatic actuator 825 (FIG. 16). Pneumatic actuators 825 are operatively connected to an actuation ring 863 and operates thereupon causing the drive plate to move reciprocally in the vertical direction as viewed in FIG. 16. Finger actuator 862 is operatively connected to actuation ring 863 in a manner which, upon pneumatic actuation, moves the finger actuator into engagement with bearing receptacle 839 along the dashed line in FIG. 20. Such allows or enables the finger assembly to be moved longitudinally along a first movement path axis 864.

Pneumatic actuator linkage 825 also includes a secondary linkage 865. Secondary linkage 865 is pneumatic as well and includes a link arm 867. Link arm 867 is connected or joined to an actuator torque ring 869. Preferably, torque ring 869 is concentric with rotor 820 (FIG. 17) and circuitously links each of the finger actuators together. A pneumatic operator 871 is advantageously linked with the secondary linkage 865 for applying force and operating the linkage by angularly displacing torque ring 869. This in turn rotates the finger assemblies into and away from the engaged position.

Preferably finger actuator engagement bits 862, under the influence of pneumatic linkage 825, moves the finger assembly, and more specifically collet 840 and finger 848 along a first axial movement path along axis 864. The finger actuator engagement bits 862, then under the influence of pneumatic operator 871 are turned about the axes of each bit like a screwdriver. This moves collet 840 and finger 848 in a second angular movement. Such second movement turns the fingers sufficiently to produce the angular displacement shown in FIG. 21. According to a preferred aspect of this invention, such movement of the finger assemblies between the engaged and disengaged positions takes place when spin head assembly 814 has been moved 180° from its FIG. 15 disposition into a face-up condition.

The engagement bits 862 can be provided with a purge gas passage therethrough. Gas is supplied via tube 893 and is passed through the finger assemblies.

Engaged and Disengaged Positions

Figure 21:
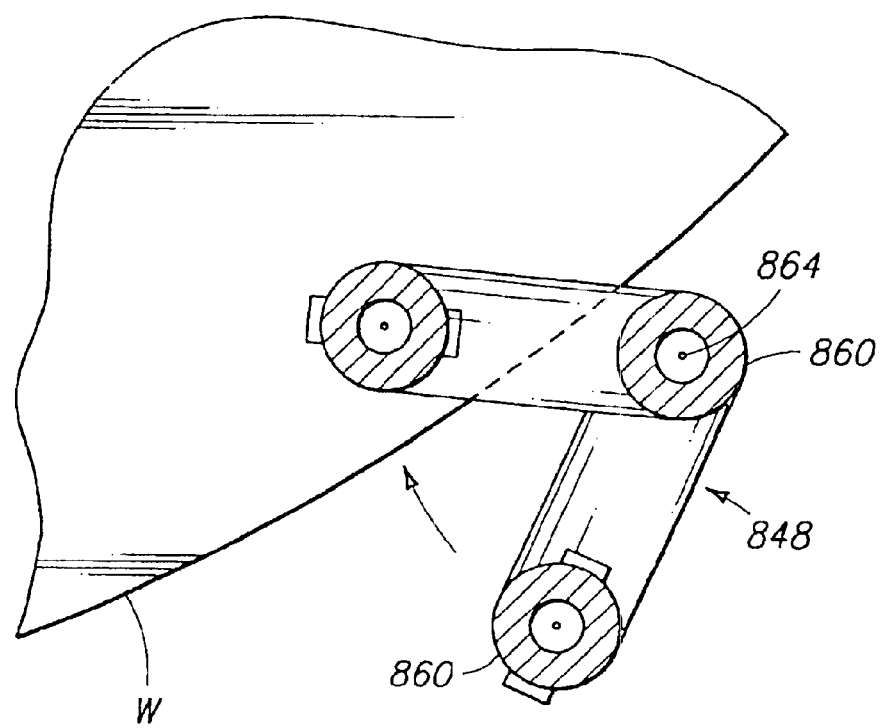
FIG. 21 is a view taken along line 7—7 in FIG. 4 and shows a portion of the preferred finger assembly moving between an engaged and disengaged position.

FIG. 21 is a view of a portion of a finger assembly, taken along line 7—7 in FIG. 18. Such shows in more detail the above-described engaged and disengaged positions and movement therebetween relative to a workpiece W. In the disengaged position, finger 848 is positioned adjacent the semiconductor workpiece and the finger tip and electrode contact do not overlap with workpiece W. In the engaged position, the finger tip overlaps with the workpiece and the electrode is brought to bear against the workpiece. From the disengaged position, finger assembly 824, upon the preferred actuation, is moved in a first direction away from the disengaged position. Preferably, such first direction is longitudinal and along first movement path axis 864. Such longitudinal movement is linear and in the direction of arrow A as shown in FIGS. 18 and 19. The movement moves the finger assembly to the position shown in dashed lines in FIG. 18. Such movement is effectuated by pneumatic operator 825 which operates upon actuation ring 863 (FIG. 16). This in turn, causes finger actuator 862 to engage with finger assembly 824. Such linear movement is limited by angled slot 832a. Thereafter, the finger assembly is preferably moved in a second direction which is different from the first direction and preferably rotational about the first movement path axis 864. Such is illustrated in FIG. 21 where the second direction defines a generally arcuate path between the engaged and disengaged positions. Such rotational movement is effectuated by secondary linkage 865 which pneumatically engages the finger actuator to effect rotation thereof. As so moved, the finger assembly swings into a ready position in which a semiconductor workpiece is ready to be engaged and held for processing. Once the finger assembly is moved or swung into place overlapping a workpiece, the preferred finger actuator is spring biased and released to bear against the workpiece. An engaged workpiece is shown in FIG. 20 after the workpiece has been engaged by finger tip 854 against a workpiece standoff 865, and spin head assembly 814 has been rotated back into the position shown in FIG. 15. Such preferred pneumatically assisted engagement takes place preferably along movement path axis 864 and in a direction which is into the plane of the page upon which FIG. 21 appears.

As shown in FIG. 18, finger 848 extends away from collet 840 and preferably includes a bend 866 between collet 840 and finger tip 854. The preferred bend is a reverse bend of around 180° which serves to point finger tip 854 toward workpiece W when the finger assembly is moved toward or into the engaged position (FIG. 21). Advantageously, the collet 840 and hence finger 848 are longitudinally reciprocally movable into and out of the engaged position.

Finger Assembly Seal

The finger assembly preferably includes a finger assembly seal 868 which is effectuated between finger 848 and a desired workpiece when the finger assembly is moved into the engaged position. Preferably, adjacent finger tip 854. A seal 868 is mounted adjacent electrode contact 858 and effectively seals the electrode contact therewithin when finger assembly 824 is moved to engage a workpiece. The seal can be made of a suitable flexible, preferably elastomeric material, such as VITON.

Figure 22:
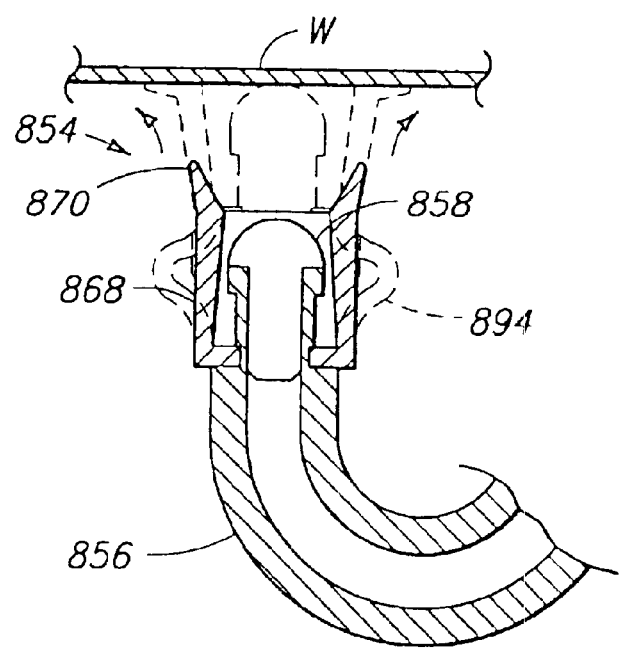
FIG. 22 is a view of a finger tip of the preferred finger assembly and shows an electrode tip in a retracted or disengaged position (solid lines) and an engaged position (phantom lines) against a semiconductor workpiece.

More specifically, and referring to FIG. 22, seal 868 can include a rim portion 870 which engages workpiece surface W and forms a sealing contact therebetween when the finger assembly is moved to the engaged position. Such seal advantageously isolates finger electrode 860 from the processing environment and materials which may plate out or otherwise be encountered therein. Seal 868 can be provided with an optional bellows wall structure 894 (FIG. 22), that allows more axial flexibility of the seal.

FIG. 22 shows, in solid lines, seal 868 in a disengaged position in which rim portion 870 is not engaged with workpiece W. FIG. 22 also shows, in phantom lines, an engaged position in which rim portion 870 is engaged with and forms a seal relative to workpiece W. Preferably and advantageously, electrode contact 858 is maintained in a generally retracted position within seal 868 when the finger assembly is in the disengaged position. However, when the finger assembly is moved into the engaged position, seal 868 and rim portion 870 thereof splay outwardly or otherwise yieldably deform to effectively enable the electrode and hence electrode contact 858 to move into the engaged position against the workpiece. One factor which assists in forming the preferred seal between the rim portion and the workpiece is the force which is developed by spring 842 which advantageously urges collet 840 and hence finger 860 and finger tip 858 in the direction of and against the captured workpiece. Such developed force assists in maintaining the integrity of the seal which is developed in the engaged position. Another factor which assists in forming the preferred seal is the yieldability or deformability of the finger tip when it is brought into contact with the workpiece. Such factors effectively create a continuous seal about the periphery of electrode contact 858 thereby protecting it from any materials, such as the preferred plating materials which are used during electroplate processing.

Methods and Operation

In accordance with a preferred processing aspect of the present invention, and in connection with the above-described semiconductor workpiece holder, a sheathed electrode, such as electrode 860, is positioned against a semiconductor workpiece surface in a manner which permits the electrode to impart a voltage bias and current flow to the workpiece to effectuate preferred electroplating processing of the workpiece. Such positioning not only allows a desired electrical bias to be imparted to a held workpiece, but also allows the workpiece itself to be mechanically held or fixed relative to the workpiece holder. That is, finger assembly 824 provides an electrical/mechanical connection between a workpiece and the workpiece holder as is discussed in more detail below.

Electrode 856 includes an electrode tip or electrode contact 858 which engages the workpiece surface. A seal is thus formed about the periphery of the electrode tip or contact 858 so that a desired electrical bias may be imparted to the workpiece to enable plating material to be plated thereon. According to a preferred aspect of the processing method, the electrode is moved in a first direction, preferably longitudinally along a movement axis, away from a disengaged position in which the workpiece surface is not engaged by the electrode tip or contact 858. Subsequently, the electrode is rotated about the same movement axis and toward an engaged position in which the electrode tip may engage, so as to fix, and thereafter bias the workpiece surface. Such preferred movement is effectuated by pneumatic linkage 825 and pneumatic operator 871 as described above.

According to a preferred aspect of the invention, the seal which is effectuated between the electrode member and the workpiece is formed by utilizing a yieldable, deformable seal member 868 which includes a rim portion 870. The rim portion 870 serves by contacting the workpiece surface to form a continuous seal as shown in FIG. 8. The preferred electrode tip is brought into engagement with the workpiece surface by advancing the electrode tip from a retracted position within the seal or other sheath to an unretracted position in which the workpiece surface is engaged thereby. Such movement of the electrode tip between the retracted and unretracted positions is advantageously accommodated by the yieldable features of the seal 868.

In addition to providing the preferred electrical contact between the workpiece and the electrode tip, the finger assembly also forms a mechanical contact or connection between the assembly and the workpiece which effectively fixes the workpiece relative to the workpiece holder. Such is advantageous because one aspect of the preferred processing method includes rotating the workpiece about rotor axis 822 while the workpiece is exposed to the preferred plating material. Such not only ensures that the electrical connection and hence the electrical bias relative to the workpiece is maintained during processing, but that the mechanical fixation of the workpiece on the workpiece holder is maintained as well.

The above described pneumatically effectuated movement of the preferred finger assemblies between the engaged and disengaged positions is but one manner of effectuating such movement. Other manners of effectuating such movement are possible.

The invention also includes novel methods for presenting a workpiece to a semiconductor process. In such methods, a workpiece is first secured to a workpiece holder. The methods work equally well for workpiece holders known in the art and for the novel workpiece holders disclosed herein.

In the next step in the sequence, the workpiece holder is rotated about a horizontal axis from an initial or first position where the workpiece holder was provided with the workpiece to a second position. The second position will be at an angle to the horizontal. The angle of the workpiece holder to the horizontal is defined by the angle between the plane of the workpiece and the horizontal. In the method, the workpiece holder is advantageously suspended about a second horizontal axis which is parallel to the first horizontal axis of the workpiece holder. At this point in the method, the angle between the first and second horizontal axes and a horizontal plane corresponds to the angle between the workpiece holder and the horizontal. The workpiece holder is then pivoted about the second horizontal axis to move the workpiece and the workpiece holder from its initial location to a final location in a horizontal plane. Advantageously, when the workpiece holder is pivoted about the second horizontal axis, the first horizontal axis also pivots about the second horizontal axis.

Preferably, during the step of rotating the workpiece holder about the first horizontal axis, the angle of the workpiece holder with respect to some known point, which is fixed with respect to the workpiece holder during the rotation process, is continually monitored. Monitoring allows for precise positioning of the workpiece holder with respect to the horizontal surface.

Likewise, during pivoting of the workpiece holder about the second horizontal axis, it is preferable that the angle defined by the line connecting the first and second horizontal axes and the horizontal plane be continually monitored. In this manner, the absolute position of the workpiece holder (and hence the workpiece itself) will be known with respect to the horizontal plane. This is important since the horizontal plane typically will contain the process to which the workpiece will be exposed.

It should be noted that in the above and following description, while the workpiece is described as being presented to a horizontal plane, it is possible that the workpiece may also be presented to a vertical plane or a plane at any angle between the vertical and the horizontal. Typically, the processing plane will be a horizontal plane due to the desire to avoid gravitational effects on process fluids to which the workpiece is exposed. In one embodiment after the workpiece has been presented to the processing plane, the workpiece holder is rotated about a spin axis to cause the workpiece to spin in the horizontal plane. Although not required in all semiconductor manufacturing processes, this is a common step which may be added in the appropriate circumstance.

The next advantageous step in the method consists of pivoting the workpiece holder about the second horizontal axis back along the path that the workpiece holder was initially pivoted along when presenting the workpiece to the horizontal process plane. There is no requirement that the workpiece holder be pivoted back to the same position whence it began, although doing so may have certain advantages as more fully described below.

The method advantageously further consists of the step of rotating the workpiece holder about the first horizontal axis to return the workpiece to the position when it was initially presented to and engaged by the workpiece holder. It is advantageous to rotate the workpiece holder about the first axis in a direction opposite from the initial rotation of the workpiece holder.

The advantage of having the workpiece holder terminate at an end position which corresponds to the initial position when the workpiece was loaded into the workpiece holder is efficiency. That is, additional machine movements are not required to position the workpiece holder to receive a new workpiece.

The method more preferably includes the step of rotating the workpiece holder about the first horizontal axis at least two support points along the first horizontal axis. This beneficially provides support and stability to the workpiece holder during the rotation process and subsequent movement of the apparatus.

The method also more preferably includes the step of pivoting the workpiece holder along with the first horizontal axis about the second horizontal axis at least two support points along the second horizontal axis. This beneficially provides additional support for the workpiece holder while allowing the workpiece holder to be moved in a vertical or "Z-axis" direction.

Importantly, the only motion described in the above method is rotational motion about several axes. In the method described, there is no translational motion of the workpiece holder in a X-, Y-, or Z-axis without corresponding movement in another axis as a result of rotating through an arc.

Second Embodiment Processing Station—General

Figure 23:
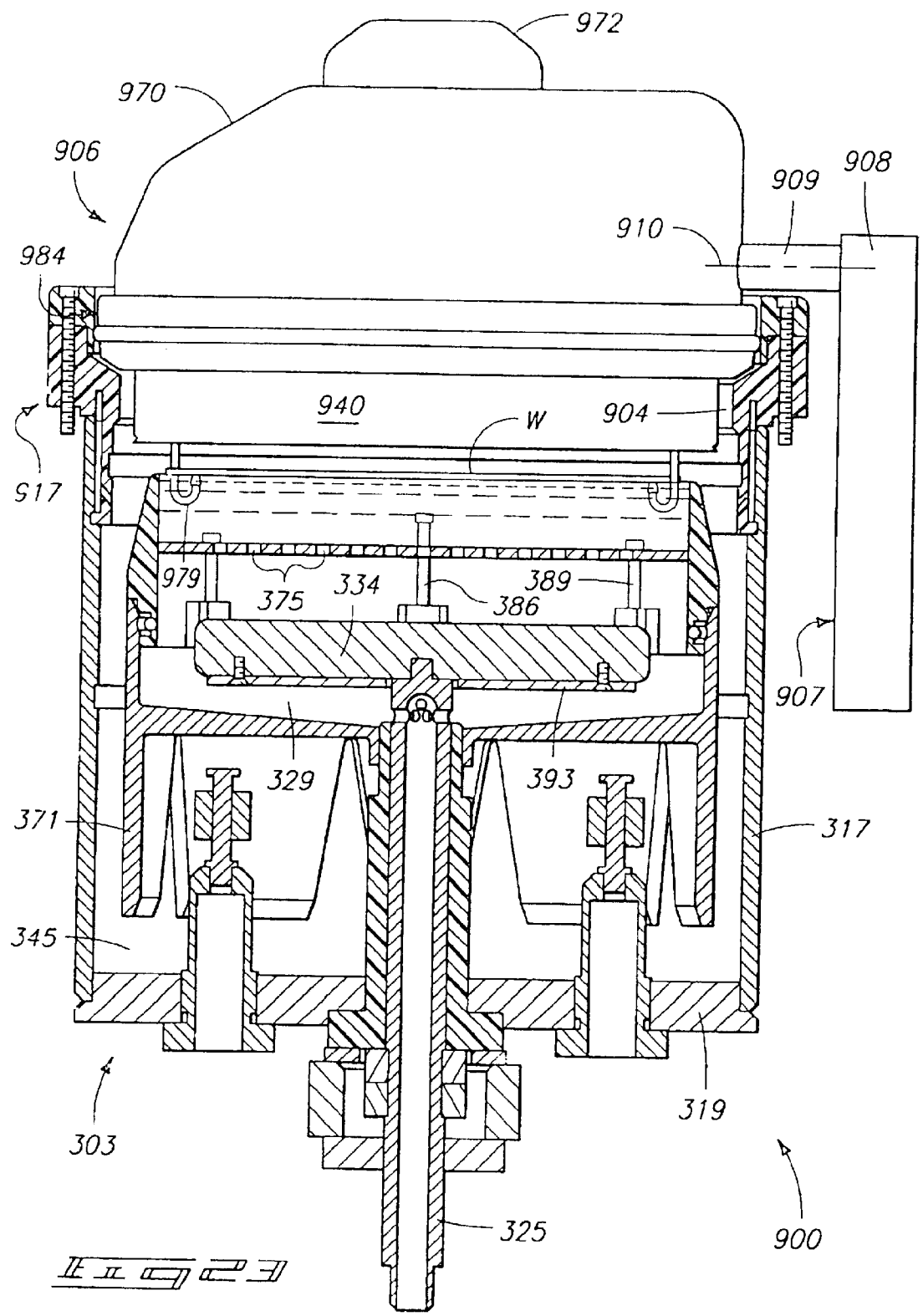
FIG. 23 is a sectional view showing a second embodiment semiconductor processing station having a workpiece support assembly and a plating station bowl assembly.

FIG. 23 shows principal components of a second semiconductor processing station 900 incorporating features of the invention. Processing station 900 as shown is specifically adapted and constructed to serve as an electroplating station similar to electroplating station 400 described hereinabove. To reduce unnecessary replication, only the principal parts showing differences and features of the invention are shown and described. Other aspects of the invention are as described above or can be done in a variety of constructions.

The two principal parts of processing station 900 are the workpiece support assembly 901 and the processing bowl 917. The workpiece support 401 will be considered first and the processing bowl and its features will be described in further detail later in this description. As FIG. 23 indicates, portions of the workpiece support 401 mate with the processing bowl to provide a substantially closed processing vessel which encloses a substantially enclosed processing or manufacturing chamber 904.

Workpiece Support Generally

The workpiece support processing head holds a wafer W for rotation within the processing chamber 904. A rotor assembly 984 has a plurality of workpiece-engaging fingers 979 that hold the wafer against features of the rotor. Fingers 979 are also preferably adapted to conduct current between the wafer and a plating electrical power supply (not shown).

Workpiece Support Head Operator

The workpiece support assembly 901 includes a processing head 906 which is supported by an head operator 907. Head operator 907 includes an upper portion 908 which is adjustable in elevation to allow height adjustment of the processing head. Head operator 907 also has a head connection shaft 909 which is operable to pivot about a horizontal pivot axis 910. Pivotal action of the processing head using operator 907 allows the processing head to be placed in an open or face-up position (not shown) for loading and unloading wafer W. FIG. 23 shows the processing head pivoted into a face-down position in preparation for processing.

A variety of suitable head operators which provide both elevational and horizontal pivoting action are possible for use in this system. The preferred operators are also fitted with positional encoders (not shown) which indicate both the elevation of the processing head and its angular position as pivoted about horizontal head pivot axis 910.

Workpiece Support Main Part

Figure 24:
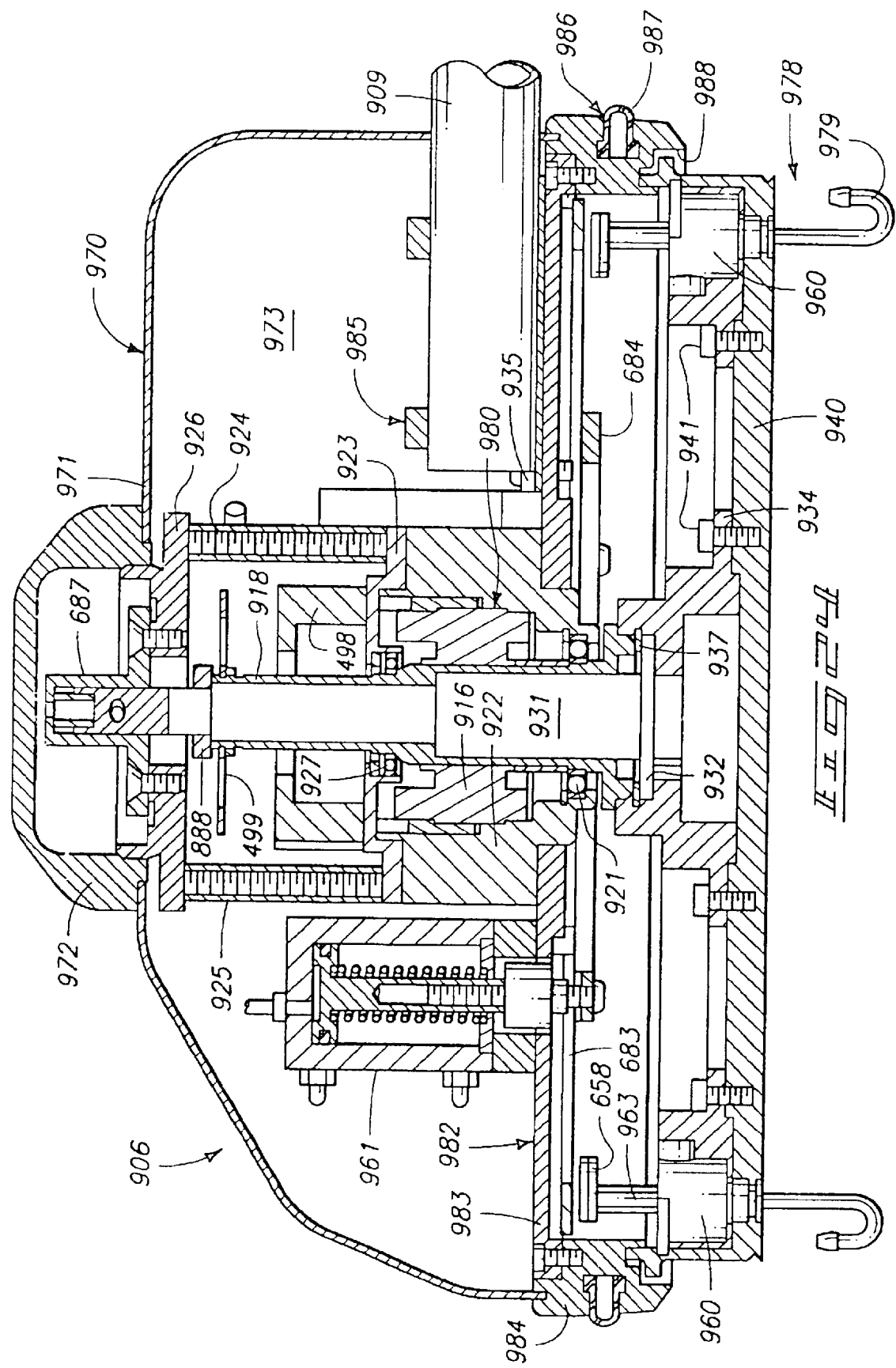
FIG. 24 is an enlarged sectional view similar to FIG. 23 showing only portions of the workpiece support.
Figure 25:
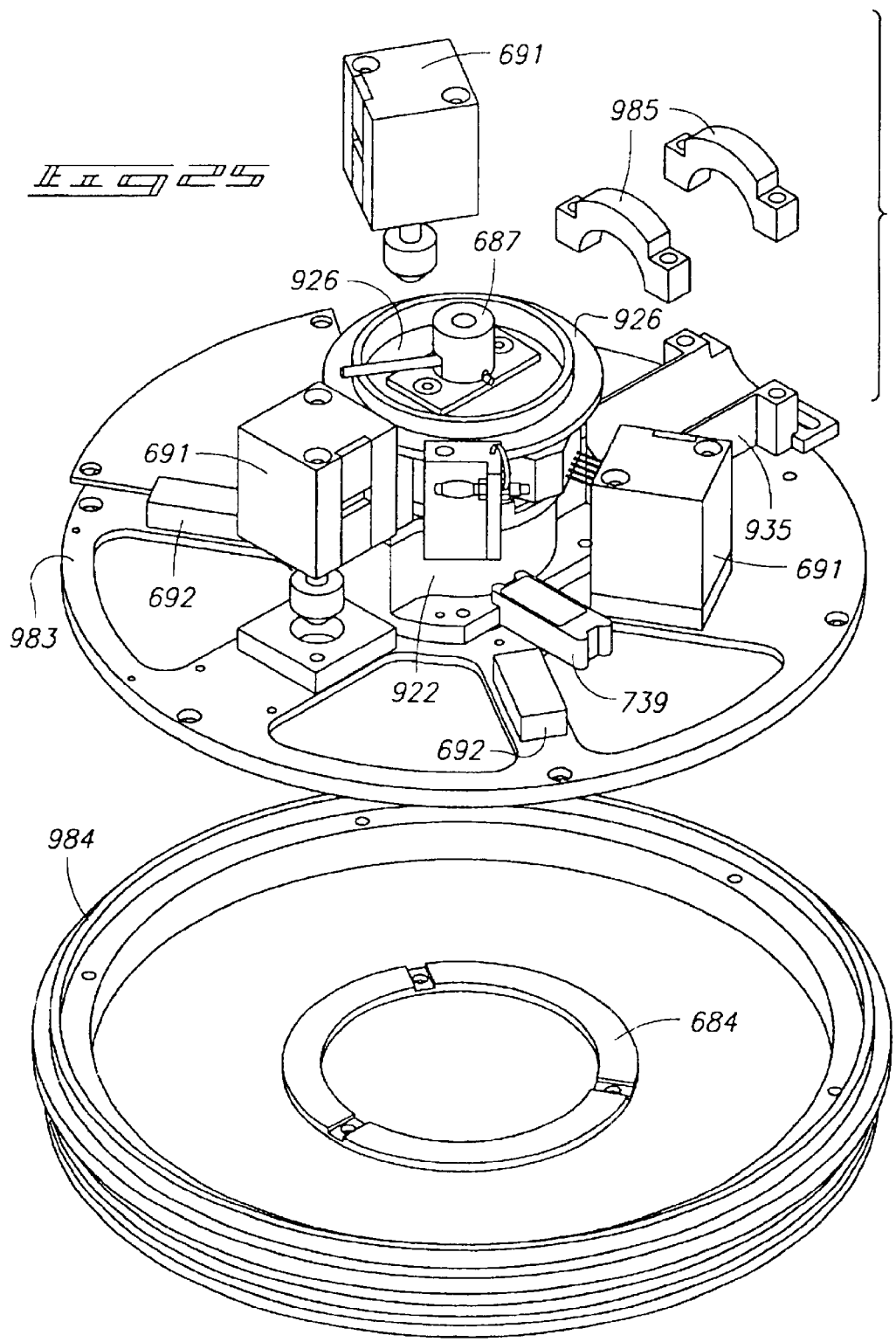
FIG. 25 is an exploded perspective view of portions of the workpiece support shown in FIG. 24.

FIGS. 24 and 25 show additional details of the preferred construction of processing head 906. The processing head includes a main part which moves with and is relatively stationary with respect to the pivot shaft 909. The main part supports a rotating assembly which will be described in greater detail below.

The main part includes a processing head housing 970 and processing head frame 982. The processing head frame 982 includes a door plate 983. A door ring member 984 is joined to plate 983 using suitable fasteners to provide a door assembly which serve as the principal parts covering the upper opening of the processing bowl when the processing head is mated with the bowl.

The processing head frame also includes a frame-pivot shaft connection 985 which includes two mounting rings which receive and securely connect with the processing head pivot shaft 909. FIG. 25 shows that the pivot shaft connection mounting rings are made in two parts and secured by fasteners (not shown). The pivot shaft connection base 935 is secured to the door plate 983 using fasteners.

Processing head 906 is generally round in shape when viewed in plan view. The processing head main part includes a housing 970 which has a first housing part 971 and a second housing part or housing cap 972. The processing head housing 970 encloses a main part enclosure which surrounds a processing head main part mechanism chamber 973. Chamber 973 is used to house additional processing head components, such as the spin motor, the finger actuators, and related service lines, such as discussed more fully below.

The upper surface of the door ring member 984 is provided with a groove which receives the lower edge of the first housing piece 971. The outer periphery of the door ring member also advantageously includes a peripheral groove 986 which mounts an inflatable door seal 987. Seal 987 seals with portions of the processing bowl to form a more fluid-tight processing chamber therewithin.

The lower surface of the door ring member 984 is preferably provided with an annular rotor receiving groove 988 which receives top peripheral portions of the rotor therein in close proximity. This construction allows a gas purge (not shown) to be applied between the door and rotor to help prevent processing vapors from migrating behind the rotor and into to the various mechanisms present in the main part of the processing head. The periphery of the door ring member is further provided with a chamfered lower edge to facilitate mating with the processing bowl.

The processing head also advantageously includes a moving assembly in the form of a workpiece holder 978. The workpiece holder includes fingers 979 for holding a semiconductor workpiece. These features will be more fully described below.

Workpiece Support Rotor Drive

The processing head main part also includes a workpiece holder drive which moves the workpiece holder relative to the main part of the processing head. The preferred action is for the workpiece holder drive to be in the form of a rotor drive which rotates the workpiece holder. The rotor drive can be an electric motor, pneumatic motor or other suitable drive. As shown, the processing head includes an electric workpiece spin motor 980.

The drive motor 980 has stator armatures 916 which drive motor shaft 918 in rotational movement. Drive motor 980 is supported by bottom motor bearing 921 in bottom motor housing 922. Bottom motor housing 922 is secured to the main part of the processing head at a central opening in the door plate 983. Motor 980 is also held in place by a top motor housing 923. Drive motor 980 is rotationally isolated from top motor housing 923 by a top motor being 927, which is disposed between the spin motor shaft 918 and the top motor housing. Both motor housings are secured to the processing head frame 982 using fasteners 924 which extend down through the motor housings and into the door plate 983. The fasteners 924 also extend upwardly through frame extensions 925. Frame extensions 925 support a top frame piece 926. Cap 972 is screwed onto piece 926 at mating threads along the lower interior portion of the cap.

The drive motor is preferably an electric motor provided with a supply of electricity via wiring run through pivot shaft 909 or otherwise extending to the processing head.

Workpiece Support Rotor Assembly

Figure 26:
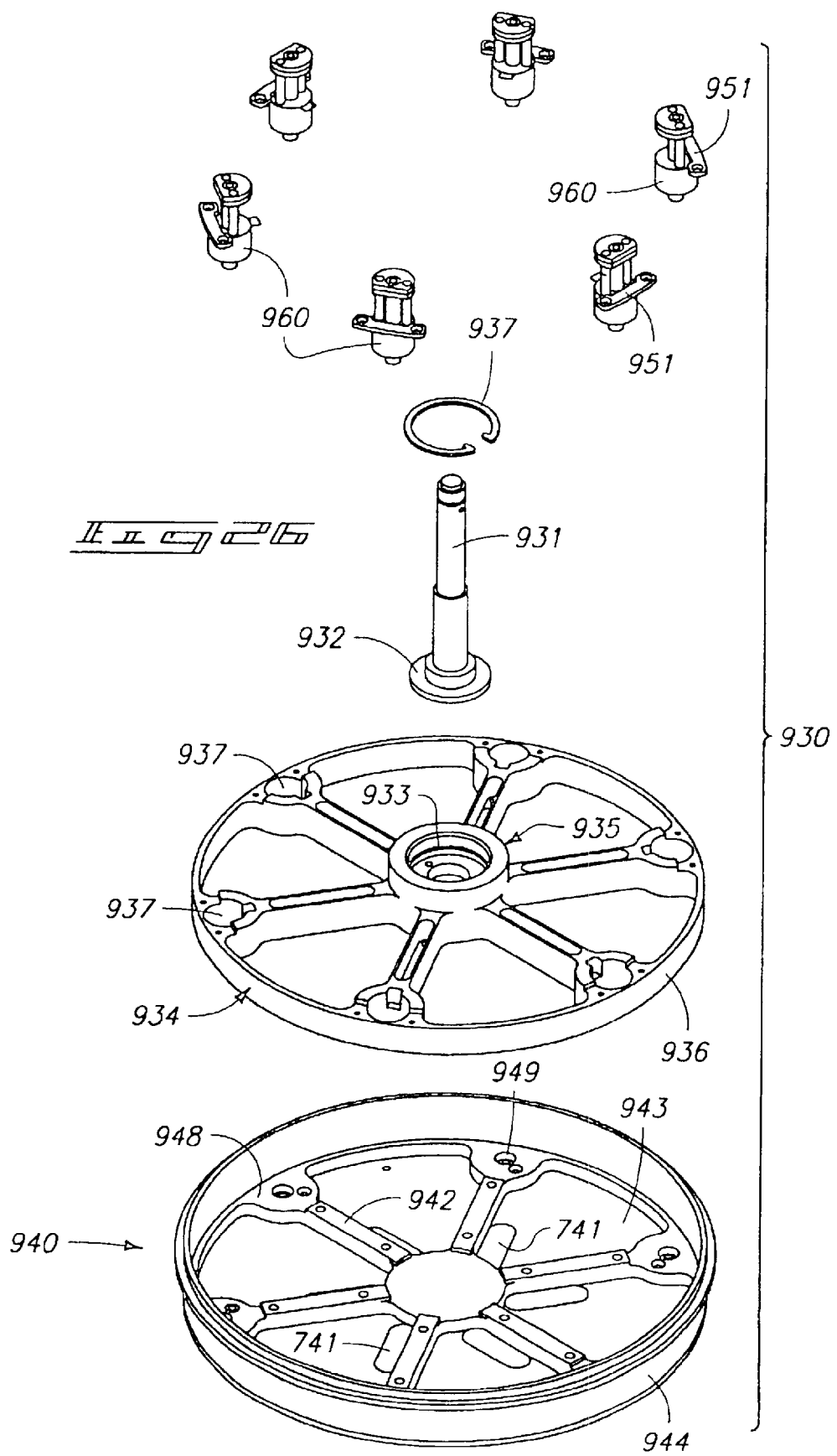
FIG. 26 is an exploded perspective view of portions of a rotor assembly forming part of the workpiece support shown in FIG. 24.

The hollow shaft 918 of the drive motor receives portion of a rotor assembly therein. The rotor assembly is secured to the motor shaft and is rotated therewith. FIG. 26 shows major portions of the rotor assembly in exploded detail. The rotor assembly 930 includes a rotor shaft 931. Rotor shaft 931 has a rotor shaft hub 932 which is held within a shaft hub receptacle 933 formed in an inner rotor part 934. The inner or first rotor part 934, also called an inner rotor drive plate, has a plurality of spokes which extend from the inner rotor part hub 935 outwardly to connect with a peripheral band 936. The shaft hub 932 is held in the hub receptacle 933 using a snap-ring 937.

The inner rotor part 934 also includes a plurality of receptacles 937. Receptacles 937 are used to mount a plurality of actuator transmission assemblies 960. The transmission receptacles 937 receive lower portions of the transmission assemblies. The receptacles have bottom openings through which the finger assemblies 979 (see FIG. 24) extend and are mounted in the transmission assemblies. Additional description is provided below in connection with the finger assembly actuators.

FIG. 26 also shows that the rotor assembly 930 preferably includes a second or outer rotor part 940. The inner and outer rotor parts are secured together by fasteners 941 (see FIG. 24). The outer rotor part 940 includes a rotor face panel 943 which extends across the disk-shaped rotor part to form a barrier to processing fluids.

The front or exposed side of the outer rotor part is provided with apertures 787 through which finger actuator transmission shafts 963 extend in supporting relationship for the fingers 979. Workpiece support standoffs 721 are mounted upon the face of the rotor to support the back side of the workpieces in opposition to the forces exerted by the fingers 979. The face of the rotor can also advantageously be provided with workpiece peripheral guide pins 722 to facilitate proper location of a wafer upon installation upon the face of the rotor.

Along the back side of the outer rotor part are reinforcing ribs 942 which align with the spokes of the inner rotor part 934. The reinforcing ribs 942 receive fasteners 941 and connect the two rotor parts together. At the periphery of the outer rotor part is a side wall 944. The upper or back edge of the peripheral side wall 944 is in close fitting relationship with the door ring 984 at annular groove 988 to resist migration of processing fluids to the back side of the rotor assembly.

The outer rotor part 940 also has an array of bosses 948 at the peripheral end of the reinforcing ribs 942. Within bosses 948 are finger passageways 949 which allow the finger assemblies 979 to mount in the finger actuator transmission assemblies 960. The rotor assembly also includes the transmission assemblies and finger assemblies. Additional details of these components as well as additional parts of the finger actuation mechanisms is described in greater detail below.

The rotor shaft 931 fits inside of motor shaft 918 and protrudes from the top of the shaft and is held by a rotor shaft mounting nut 888. Also mounted near the top of the rotor shaft is an optical tachometer 499. Optical tachometer 499 is securely attached to motor shaft 918 and features, such as notches, formed on the tachometer are optically detected to provide a precise measurement of rotor angular velocity. The optical emitter-detector couplet used with tachometer 499 are not shown, but are mounted on either sides of the wheel to allow selective passage of light therethrough.

The rotor assembly is also advantageously provided with a angular position encoder 498. As shown, encoder 498 is mounted to the top motor housing 923 so as to remain stationary with respect to the main part of the processing head. The angular position encoder 498 and optical tachometer 499 allow the speed, acceleration, and precise rotational position of the motor shaft 918 and rotor assembly to be known and controlled.

In one application of the present invention the workpiece support is used to support a semiconductor workpiece in an electroplating process. To accomplish the electroplating an electric current is provided to the workpiece through an alternate embodiment of the fingers (described more fully below). To provide electric current to the electrode fingers 979, conductive wires (not shown) are run from the transmissions 960 toward the hub of the rotor. Current is supplied to the electrode fingers 979 through the hollow rotor shaft using wires (not shown) connected to a slip ring electrical connector 687 mounted near the upper end of shafts 918 and 931.

Workpiece Detection Subsystem

The processing head also preferably includes a wafer or workpiece detection subsystem. This subsystem allows the processing head to through its control system to determine whether there is a workpiece held in the rotor or not. This is of particular significance if the system experiences a power interruption or otherwise is being started in any situation where workpieces may be present in the machine. Operational safeguards can then be included in the control system to prevent mishandling of wafers or processing stations which may have a workpiece held therein.

As shown in FIG. 25, the processing head frame part 983 is provided with a mounting 738 which is an appropriately shaped recess used to mount a detector 739. Detector 739 is preferably an optical emitter-detector unit which emits a beam which passes downwardly as oriented in FIG. 25. The emitted beam passes through workpiece detector windows 741 (see FIG. 26) formed in the face panel of the outer rotor part. The windows can be discrete inserts, or more preferably, they are thinly dimensioned panel portions of the rotor face panel 943. The rotor face panel is advantageously made of a material which is transmissive of the detector beam being used. For example, the panel can be made from polyvinylidene fluoride polymer which is thinned to a suitably thin dimension, such as in the approximate range from about 1–5 millimeters.

A suitable detector 739 is a Sunx brand model RX-LS200, and other commercially available detectors. The preferred detector uses an infrared beam emitter (not individually shown) which is detected by a pair of beam detectors (not individually shown). The beam emitter and beam detectors are preferably part of the same unit which serves as the workpiece detector. The workpiece detector preferably operated in a trigonometric mode. In the trigonometric mode, the angle of the reflected beam is an important discriminating parameter. Thus any portion of the beam reflected by the detector window 741 is incident upon the pair of detectors at a reflection angle which is outside of the normal detection angel range. Such portions of the beam reflected by the window 741 are thus minimized and the detector is not triggered by such reflectance. Instead, the pair of beam detectors are adjusted to sense a reflected beam which is incident at a reflected angle associated with the wafer or other workpiece surface which is more distant than the window. When there is no workpiece held in the workpiece holder, then the detector senses the absence and this is used by the control system as an indication that there is no wafer present in the wafer support.

In general the emitted infrared beam used in the preferred workpiece detector subsystem is sufficient to detect the presence of a wafer or other semiconductor workpiece held in a stationary position with the rotor positioned so that one of the windows 741 is in position aligned to allow the emitted beam to pass therethrough and be reflected by the workpiece back through the window for detection. The detection system described herein is not sufficient to allow detection during rotation of the rotor and any workpiece held thereon. The invention may also be practiced in a situation where sensing can be accomplished while the rotor rotates.

The workpiece detector arrangement shown has the distinct benefit of being mounted wholly behind the rotor face panel without provision of any openings which might allow processing fluids to enter the space behind the rotor. This reduces maintenance, improves reliability, and simplifies construction costs.

Workpiece Support Finger Actuator

Figure 27:
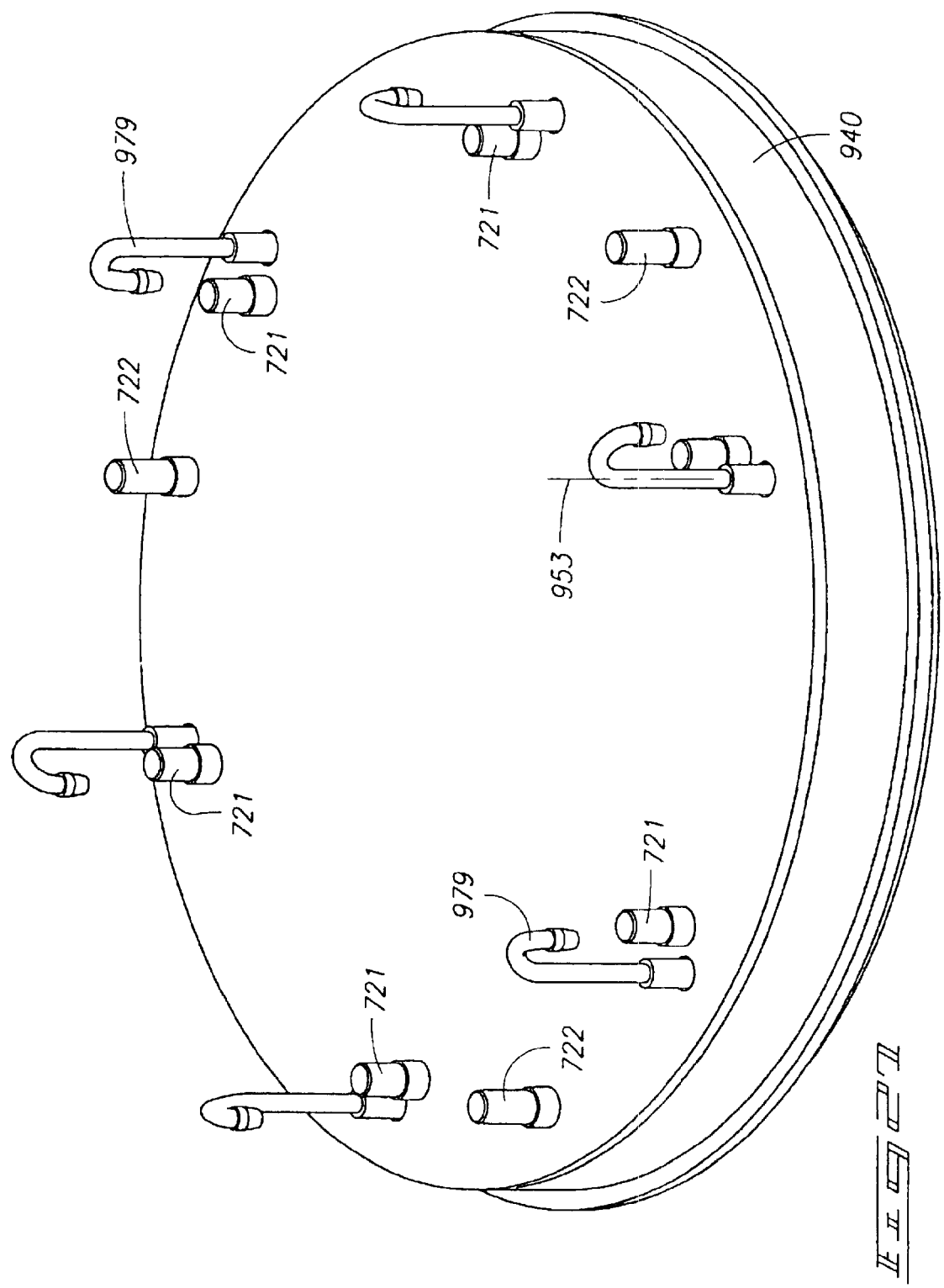
FIG. 27 is a perspective view showing an interior face of the rotor assembly.
Figure 28:
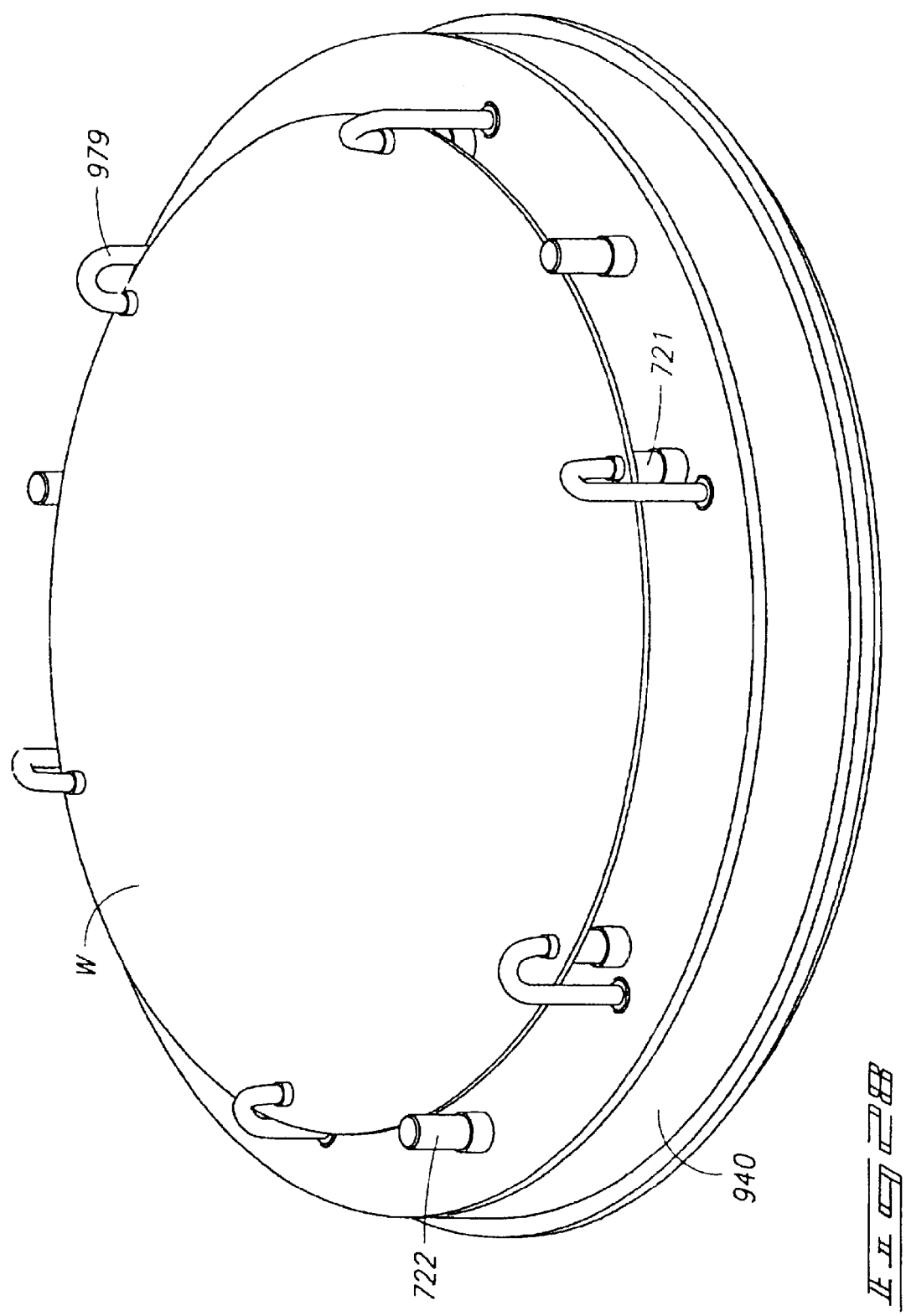
FIG. 28 is a perspective view showing the interior face of the rotor assembly with a wafer supported thereon.

The preferred wafer support also includes a plurality of wafer-engaging fingers 979 positioned about the periphery of the wafer or other workpiece. FIG. 27 shows the front face of the outer rotor part 940 in a face-up orientation with fingers 979 extending therefrom. The preferred fingers are J-shaped and mounted for pivotal action about a finger pivot axes 953. The pivotal action preferably ranges between an outboard position and an in board position. In the outboard position the J-shaped fingers are positioned outwardly and clear of the wafer peripheral edge. A preferred outboard position is illustrated in FIG. 27. In the outboard position the hooked portions of the J-shaped fingers are oriented at approximately 15 angular degrees outward from a line drawn tangent to the periphery of the wafer adjacent to the finger. In the in board position the fingers are positioned inwardly to engage the wafer, as shown in FIG. 28. In the in board position the hooked portions of the J-shaped fingers are oriented at approximately 45 angular degrees inward from a line drawn tangent to the periphery of the wafer adjacent to the finger.

The face of the rotor assembly is provided with workpiece standoff supports 721 which are in complementary position to the engagement ends of the fingers when the fingers are in a retracted position to hold the wafer. This construction securely captures the wafer or other workpiece between the fingers and the standoffs.

In addition to the pivotal action of the engagement fingers, the fingers are also move axially toward and away from the face of the rotor. In the in board position the fingers are retracted toward the wafer to engage the exposed, front face of the wafer along a marginal band adjacent to the periphery of the wafer. In the outboard position the fingers are extended away from the face of the wafer to prevent rubbing action as the fingers pivot away from the wafer. This compound action including both a pivot component and an axial component is accomplished using a finger actuator transmission 960 shown in perspective relationship to the rotor in FIG. 26. Transmissions 960 are mounted within the transmission receptacles 937 of the inner rotor part 934. The transmissions are further mounted by transmission retainers 951 which are secured by fasteners to inner rotor part 934.

Figure 29:
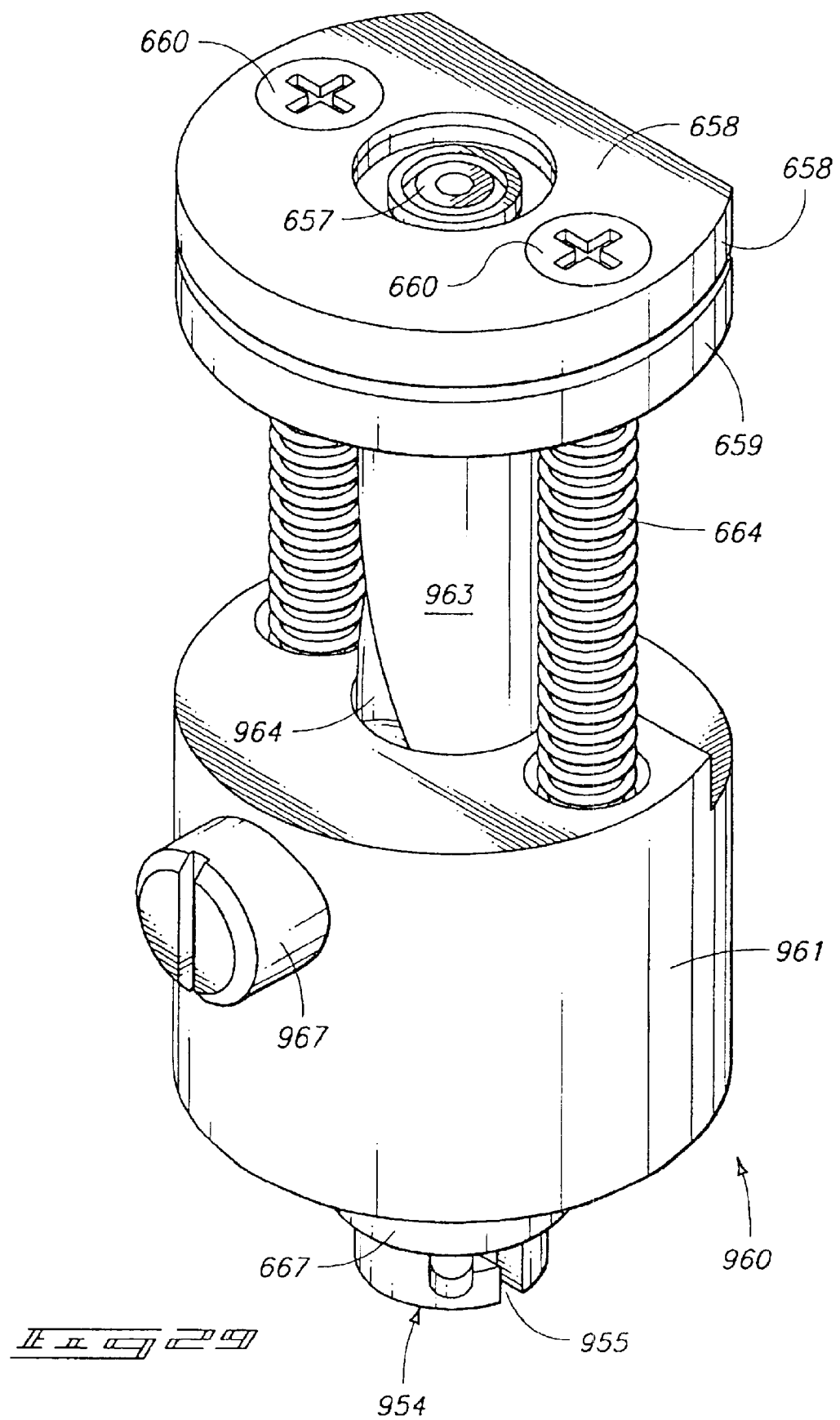
FIG. 29 is an enlarged perspective view showing an actuator transmission which mounts on the rotor assembly and controls motion of workpiece-engaging fingers.

FIG. 29 shows the finger actuator transmission 960 in greater detail. The lower end of transmission 960 includes a finger head mounting receptacle 954. Receptacle 954 is advantageously provided with a locking feature included to secure the fingers in the receptacles. As shown, the receptacle includes a convoluted, bayonet-type, locking pin groove 955. Locking pin groove 955 receives a transversely mounted finger mounting pin 956 (see FIG. 32) which is a rolled or other suitable pin secured in the head of the finger assembly.

Figure 30:
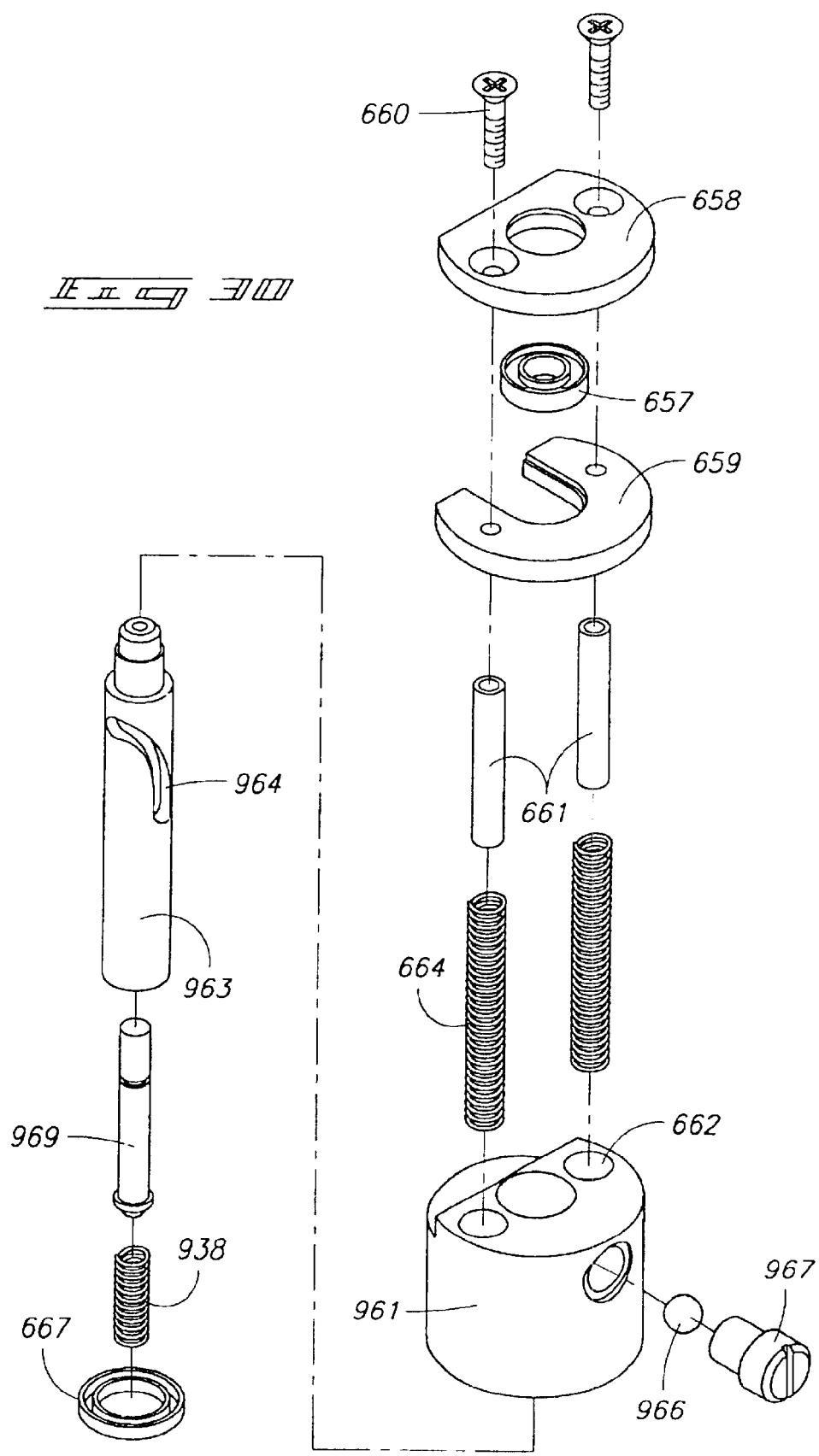
FIG. 30 is an exploded perspective assembly view of the actuator transmission shown in FIG. 29.
Figure 31:
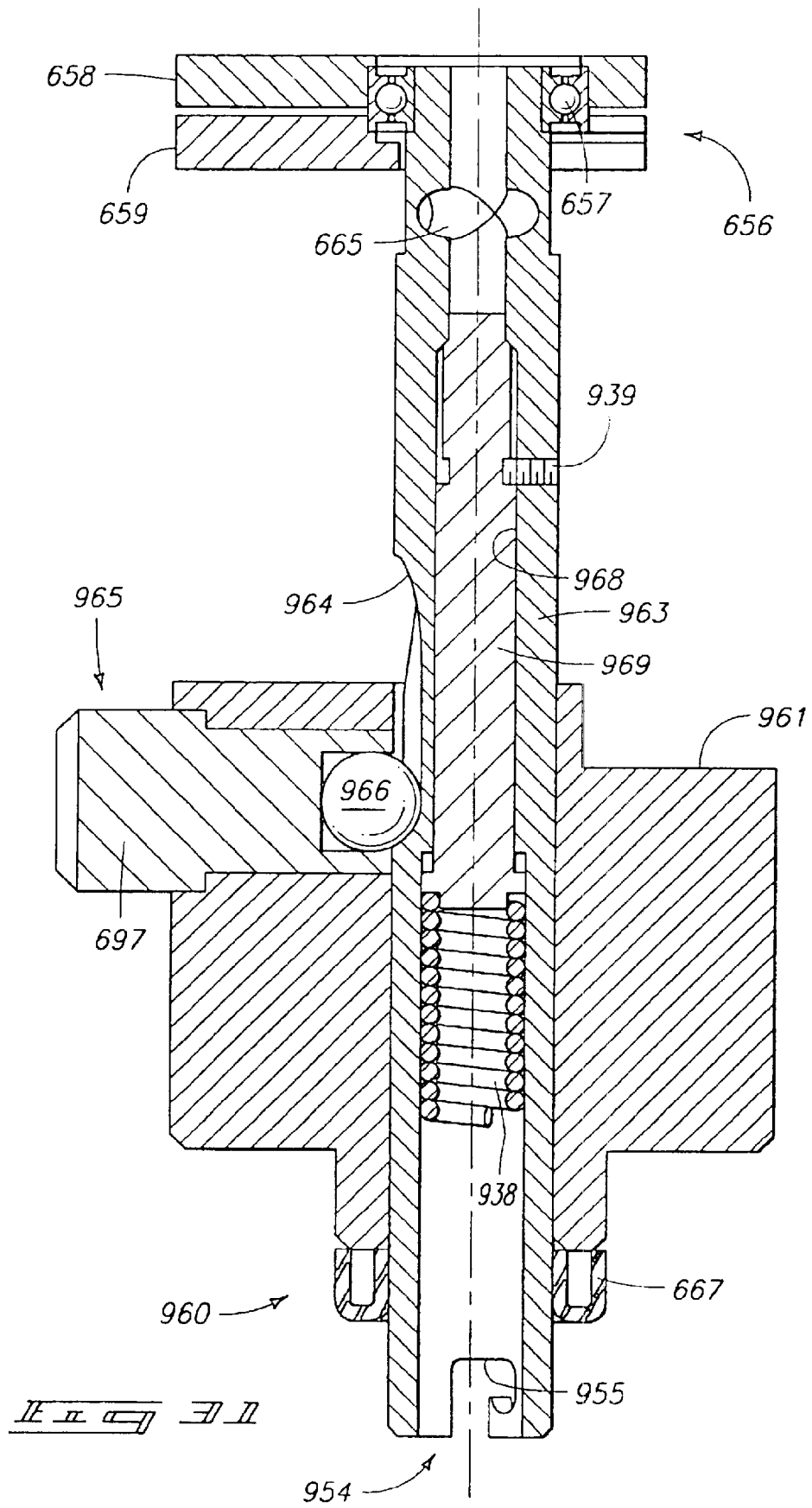
FIG. 31 is a longitudinal sectional view of the actuator transmission shown in FIG. 29.

FIGS. 29, 30, and 31 detail the preferred construction of the actuator transmissions 960. The transmissions include a transmission base 961 which is provided with a mounting cutout 962 which is borne upon by the retainers 951 when installed in the rotor. The base also includes a central passageway within which is received a transmission shaft 963. Shaft 963 can both pivot and move axially within the central passageway. The shaft and base 961 are constructed to interact in a manner which controls the relative motion of the shaft. This is done to provide the compound pivotal and axial movement of the shaft and a finger 979 which is held therein. As shown, the inactive mechanism is provided in the form of a shaft channel or groove 964 which is engaged by a shaft camming control member 965. The camming action of the groove is provide by a helical advance over a pivotal movement range of approximately 60 degrees of rotation. The associate axial travel is in the range of approximately 5–20 millimeters, more preferably about 10–15 millimeters.

The camming control member 965 is advantageously in the form of a ball 966 held into the groove 964 using a ball support fastener 967. Fastener 967 has a ball socket which receives portions of the ball. Fastener 967 also serves as a convenient electrical contact terminal when electricity is supplied to the fingers 979.

The shaft 963 is provided with an interior shaft passageway 968 which receives a spring retainer 969. Spring retainer 969 has an engagement head which mechanically engages with a finger mounting spring 938. The spring 938 serves to bias a finger assembly into a locked position using the locking pin 956 held in biased relationship by groove 955. Spring retainer 969 is secured in the passageway by a set screw 939.

FIG. 31 also shows that the transmission 960 preferably includes a transmission head 656. Transmission head 656 is connected to the upper end of shaft 963 using a bearing 657 which allows the shaft to pivot relative to the head pieces 658 and 659. Head pieces 658 and 659 capture the bearing between them, and are joined by head fasteners 660. The head fasteners 660 thread into a pair of head guide rods 661. Head guide rods 661 are slidably received by two guide passageways 662 formed in the transmission base 961. The head assembly is biased upwardly by two head bias springs 664. Engagement between ball 966 and groove 964 limits the upward movement of the head assembly under action by springs 664.

The lower end of shaft 963 is sealed to the base 961 using a shaft seal 667 which helps to keep any abraded metal within the transmission and prevent contamination toward the fingers 979. Shaft 963 also has a transverse hole 665 which is used as an electrical connection feature that receives a wire (not shown) run from the slip ring down the rotor shaft. The wire is secured in hole 665 by a set screw (not shown).

The transmissions 960 are activated by a transmission head depression ring 683 (see FIG. 24). Depression ring 683 is connected to an operator output connection ring 684 (see FIG. 25). The operator output connection ring is secured by fasteners to the output shafts of pneumatic actuator engines 691. FIG. 25 also shows pneumatic manifolds 692 used to supply the actuator engines. The preferred construction shows three actuator engines 691 which have outputs which move upwardly and downwardly to depress the transmission heads 658 and operate the fingers in the compound axial and pivotal motion already described. The actuator engine outputs are extended to depress rings 683 and 684, and to depress the transmission heads 658 thus causing the fingers 979 to move from the in board retracted positions of FIG. 28 to the outboard extended positions of FIG. 27.

Electrode Fingers with Submerged Conductive Current Transfer Areas

Figure 32:
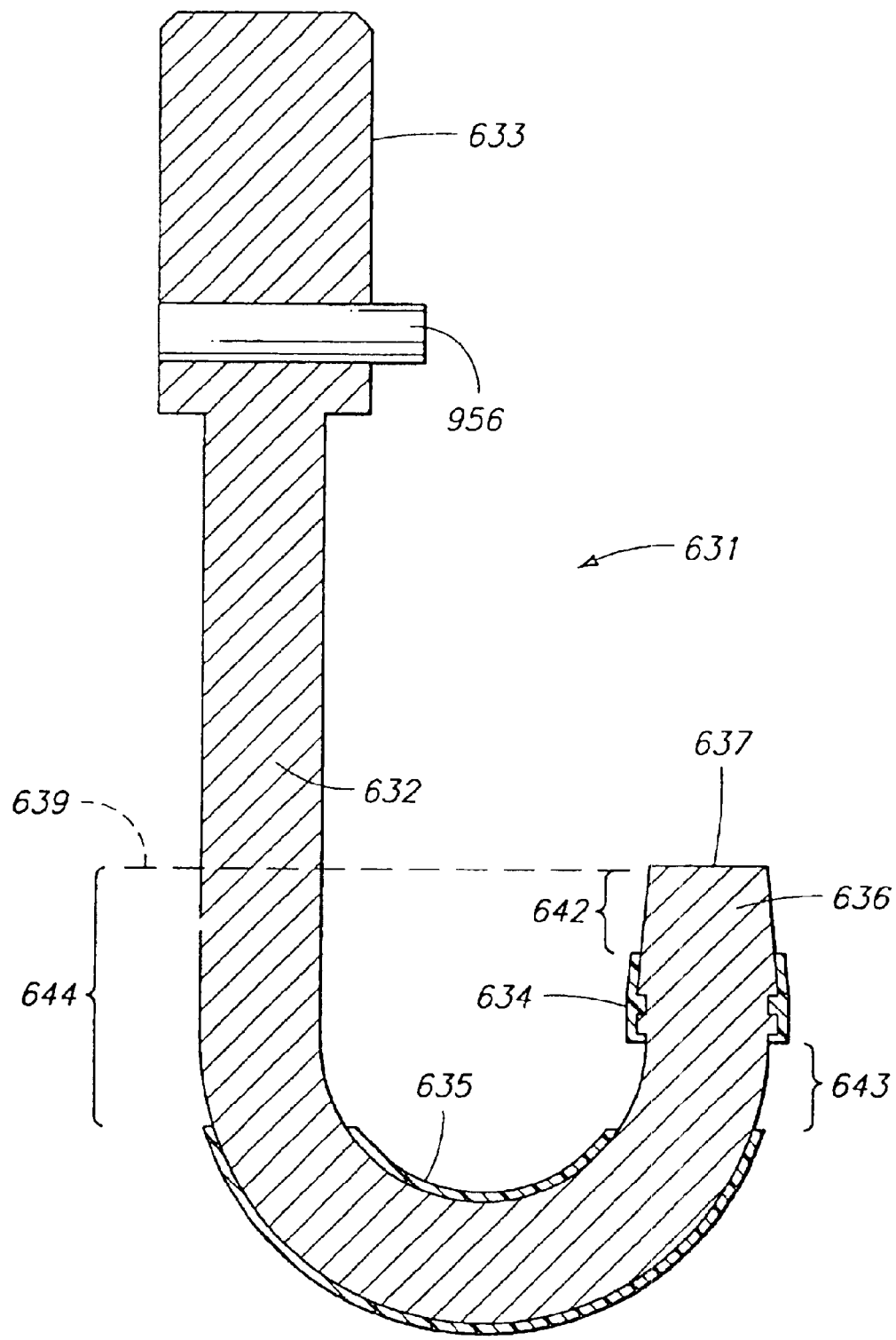
FIG. 32 is a longitudinal sectional view of one preferred form of electrode assembly which can be used in the second embodiment processing system.

FIGS. 32–39 show a number of different electrode finger constructions. The different constructions shown have particular application to differing applications. FIG. 32 shows a finger assembly 631 having intended application for contacting a semiconductor wafer during blanket plating of copper. Finger assembly 631 includes a finger shaft 632 which is formed in a J-shape and made from an electrically conductive material, such as stainless steel or tungsten. The finger assembly also preferably includes an integral finger head 633 which is received into the receptacle 954 of the actuator transmission 960. The head has a pin aperture which receives the locking pin 956 therein for engagement with the locking groove 955 formed in the receptacle of the actuator transmission.

Finger assembly 631 also preferably includes dielectric sheathing 634 and 635. Dielectric sheathing 634 and 635 is advantageously made from a polyvinylidene fluoride coating or layer applied to the shaft of the finger. The dielectric sheathing is preferably provided upon only limited portions of the electrode shaft and adjacent the contact head 636. The contact head has a contact face 637 which directly bears upon the wafer to pass electrical current between the electrode and wafer. The contact face 637 is approximately equal to a fluid submersion boundary 639. The submersion boundary indicates the approximate level of the plating liquid during processing.

The limited coverage of the dielectric sheathing is for the purpose of improving the uniformity of plating performed upon semiconductor workpieces held in the wafer support. It is believed that the submersible surfaces of the electrode finger are best provided with dielectric sheathing segments which comprise between approximately 25 percent and 75 percent of the submersible area of the electrode. These amounts do not consider the contact face as part of the areas. FIG. 32 show two segments 634 and 635 which cover about 50 percent of the electrode finger shaft exterior surfaces from the submersion line 639 downward, as positioned in a plating liquid bath during processing. The first dielectric segment 634 is adjacent to the contact face 637, a first electrically conductive segment 642 exists between the dielectric segment 634 and the contact face 637. A second electrically conductive segment 643 exists between first and second dielectric segments 634 and 635. A third electrically conductive segment 644 exists between the second dielectric segment 635 and submersion line 639. The electrically conductive segments 642–644 provide current transfer areas which cause plating current that is supplied through the finger head 633 to be directly passed to the plating liquid contained in a plating bath. This is believed to provide a more uniform current density and more uniform voltage profile across the surface of a wafer which is being blanket plated with copper or other plating metals.

Figure 33:
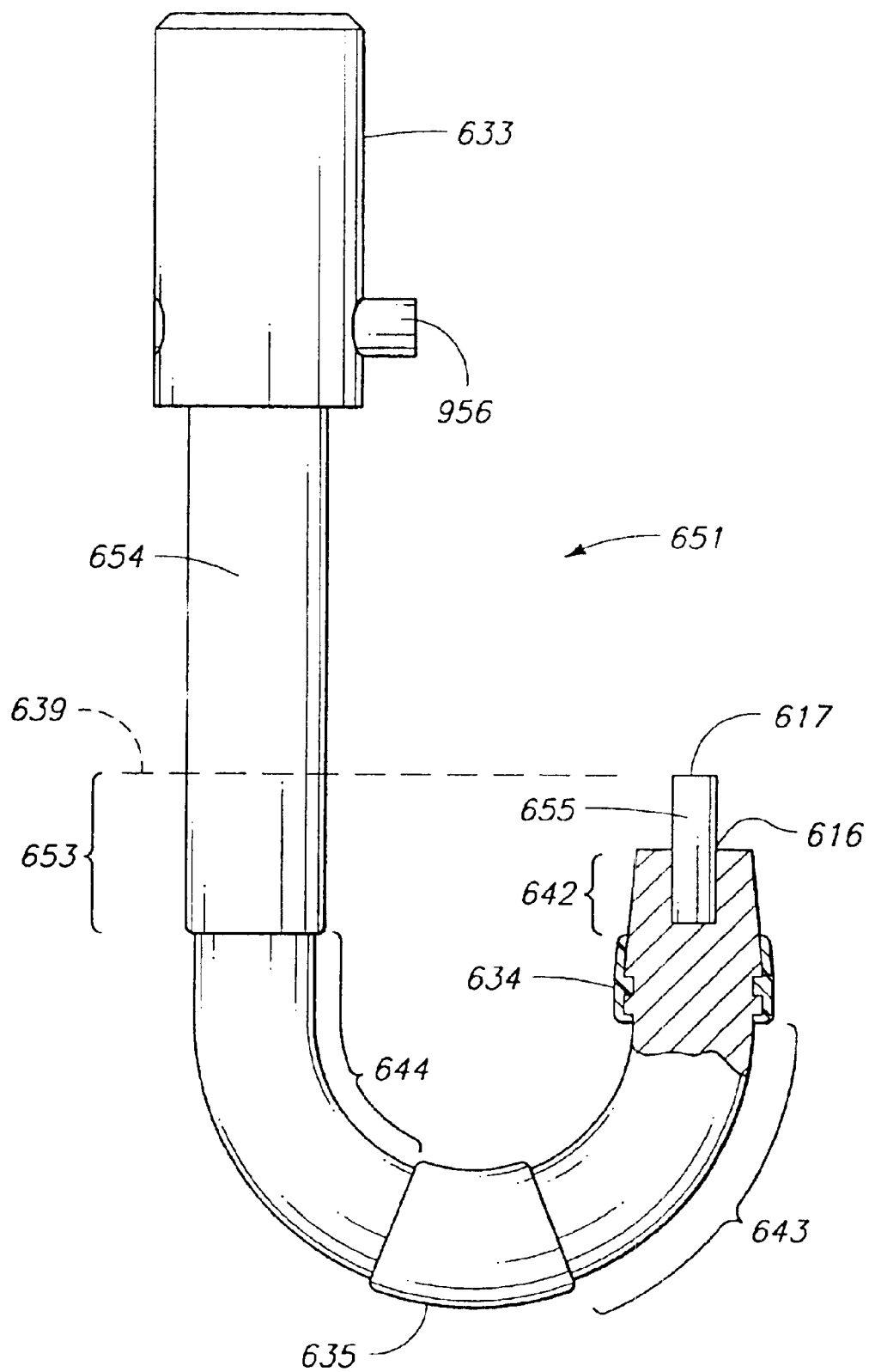
FIG. 33 is a longitudinal sectional view of one preferred form of electrode assembly which can be used in the second embodiment processing system.

FIG. 33 shows another plating system workpiece support electrode 651 having many of the same features as electrode 631 described immediately above. The same reference numerals have been used to designate similar parts. Differences between finger electrodes 651 and 631 will now be described. Electrode 651 has three current transfer areas 642–644. The size and shape of areas 642–644 are somewhat different from the corresponding areas of electrode 631. More specifically, the second and third current transfer areas 643 and 644 are elongated along the shaft. The second dielectric sheath segment 635 is shortened. A third dielectric segment 653 has been included. The third dielectric sheath 654 forms the submerged dielectric segment 653 and also extends above the submersion line 639 to head 633. The area of the submerged current transfer segments is between 25 and 75 percent of the submerged surface area, more particularly, about 50 percent.

Electrode 651 is also provided with a distal contact insert part 655. Insert part 655 is received within an insert receptacle 616 formed in the distal end of the electrode shaft. The insert contact tip 655 defines a contact face 617 which bears upon a wafer being held. The insert contact part is made from a conductive material which is preferably non-corrosive material, such as platinum or stainless steel.

Figure 34:
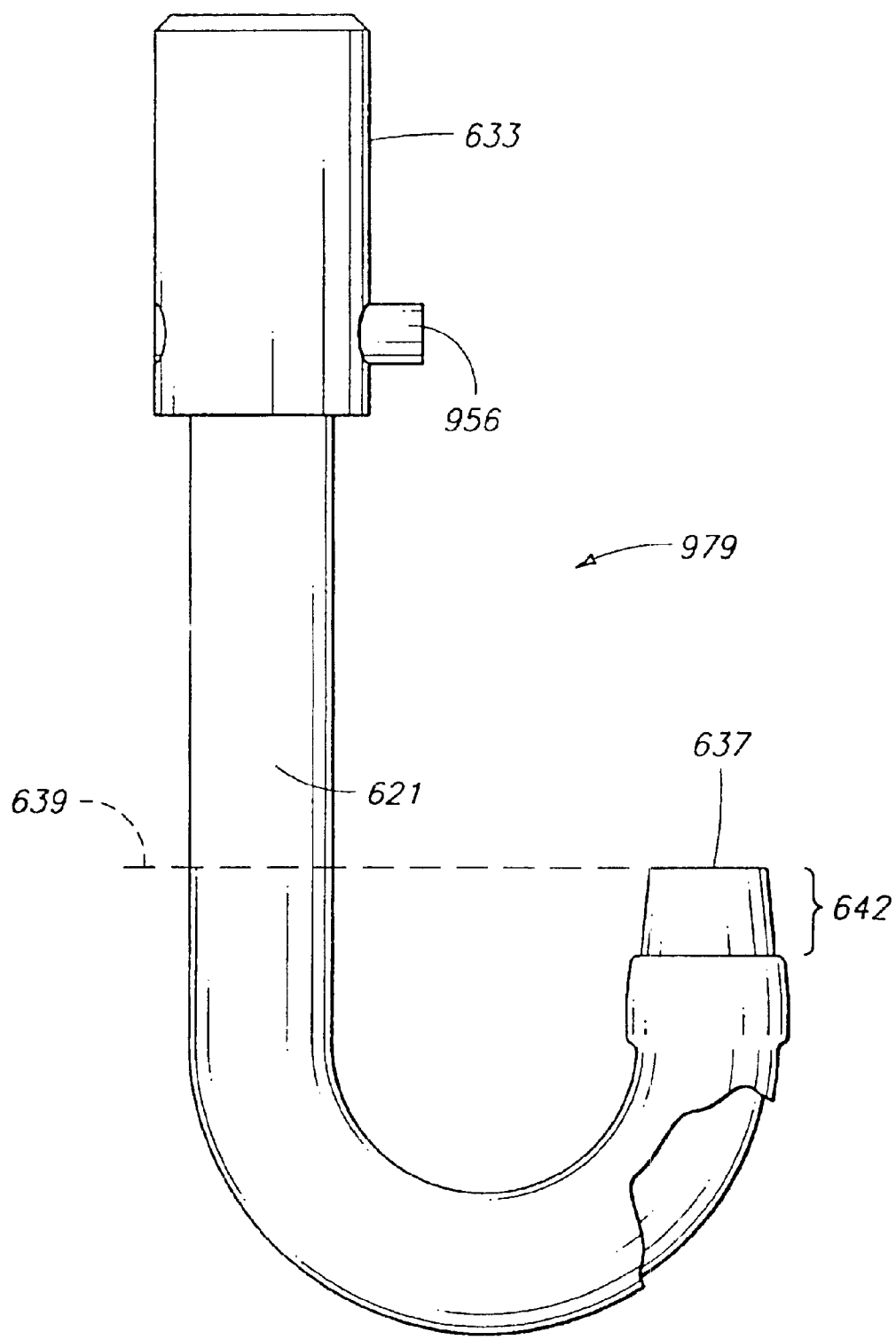
FIG. 34 is a longitudinal sectional view of one preferred form of electrode assembly which can be used in the second embodiment processing system.

FIG. 34 shows a further electrode finger construction in the form of electrode finger 979. Similar parts to electrode fingers 631 and 651 are similarly numbered in this figure. The electrode shaft is covered by a dielectric sheath 621 which largely covers the electrode shaft and leaves only a first current conductive area 642 which is immediately adjacent to the contact face 637. This construction is contrasted to the electrodes 631 and 651 because electrode finger 979 does not have current transfer areas which comprise 25 percent of the submerged portion of the electrode. It also does not have current transfer areas which are exposed in a manner which is separated by a dielectric segment interpositioned between the contact face 637 and the removed or remote current conductive segment.

Figure 35:
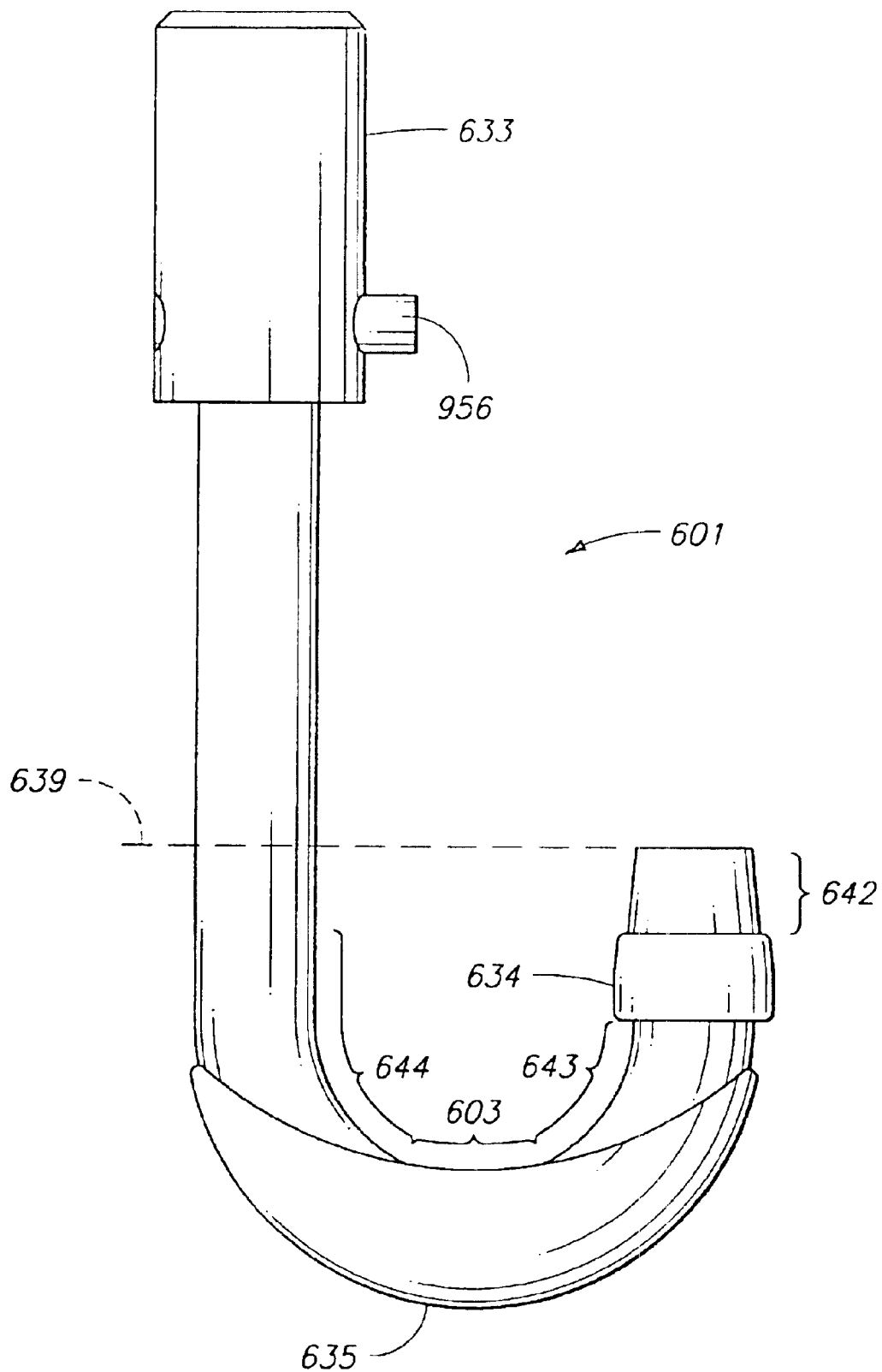
FIG. 35 is a longitudinal sectional view of one preferred form of electrode assembly which can be used in the second embodiment processing system.

FIG. 35 shows a further electrode finger 601 which has submerged current transfer areas 642–644. It also has dielectric segments 634 and 635. Dielectric segment 635 of this figure has a differing shape and coverage area as compared to the other electrodes discussed above. In this construction the dielectric sheath extends along the outer curvature of the electrode J-bend. Curved upper edges extend so as to provide an overlying web portion 603 which covers the inner curvature of the J-bend. Performance in terms of plating uniformity has been found to be superior in some processes which employed the electrode of this figure.

The electrodes 631, 651 and 601 are preferably used in novel processes according to this invention. These processes include contacting a surface of the semiconductor article or workpiece with an electrode at a contact face thereof. The methods also include submersing a portion or portions of the electrode into a plating bath containing a plating liquid which is typically a solution and mixture have various components known in the art. The methods also preferably include wetting a processed surface of the semiconductor article with the plating bath. Further included is the step of moving or conducting electrical current through the electrode and plating bath to perform an electroplating action to occur upon at least the processed surface of the wafer or other article. The methods further advantageously include diverting a portion of the electrical current directly between the electrode and the plating bath along at least one electrically conductive segment of the electrode. The electrically conductive segment is preferably spaced from the contact face a substantial distance, such as greater than 5 millimeters, and preferably is spaced therefrom by an intervening dielectric sheath.

Electrode Fingers with Dielectric Sheaths Covering Submerged Areas

Figure 36:
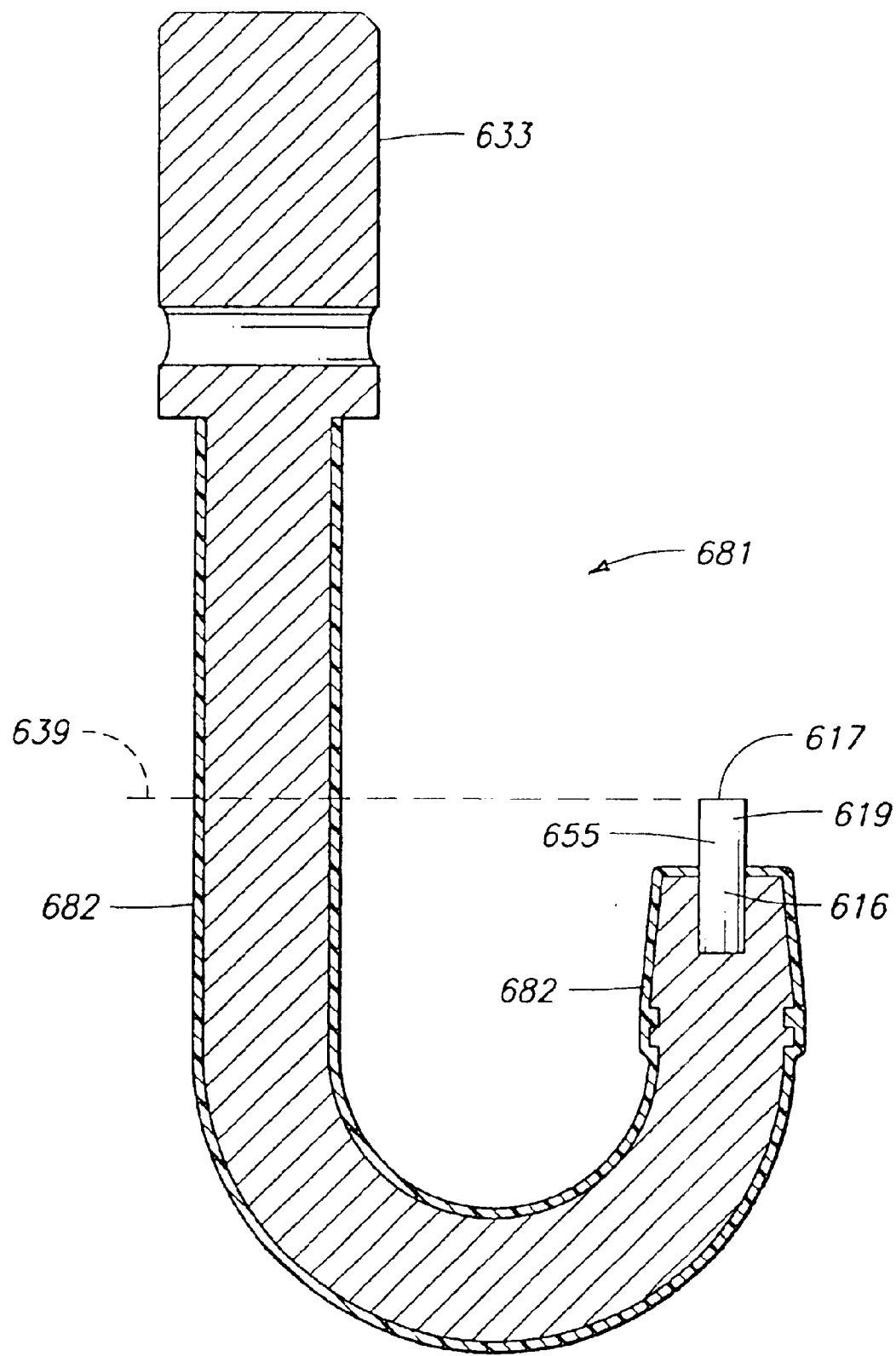
FIG. 36 is a longitudinal sectional view of one preferred form of electrode assembly which can be used in the second embodiment processing system.

FIG. 36 shows another electrode finger 681 which is similar to electrode finger 651. Finger 681 is similar to finger 651 except it includes a full dielectric sheath 682 which extends from above submersion line 639 to contact insert side walls 619. This construction preferably uses a coating layer 682, such as from polyvinylidene fluoride, which can be applied by dipping or otherwise forming the layer over the shaft of the electrode. This construction includes the dielectric layer over the distal end of the electrode shaft and into sealing relationship with the side walls of the insert contact part or tip 655. The dielectric coating or other layer 682 excludes corrosive processing fluids. Since the contact tip is preferably made from a non-corrosive material, such as platinum, the only material of the electrode which is exposed to direct corrosive action is the non-corrosive tip which is able to maintain good service despite the difficult operating environment.

Additionally, the construction of electrode 681 is particularly advantageous because the joint formed between the inserted contact tip 655 and receptacle 616 is covered and protected from direct exposure to the corrosive plating liquid and fumes present in the processing chamber.

The invention further includes methods for plating metals onto the surface of a semiconductor workpiece using electrode finger 681. The methods include contacting a surface of the workpiece with an electrode assembly using a contact face, such as face 617, on a contact part, such as contact insert part 655. The contact insert is mounted on the distal end of the electrode shaft. It is further preferably provided with a dielectric layer formed about the distal end in sealing relationship against the contact part. The methods further preferably include submersing or otherwise wetting a processed surface of the workpiece, such as in a plating bath liquid used to plate the workpiece with a plating material. The methods also preferably include excluding the plating bath liquefied from the contact part joint, such as the joint formed between the contact part 655 and receptacle 616. The methods further include electroplating the workpiece with plating material by passing electrical current through the contact part and between the semiconductor workpiece and electrode assembly. The contact face plating layer is more preferably formed from the plating material as is described below in additional detail. The method is most preferably used to plate copper onto the surface of semiconductor materials, such as silicon or oxides thereof.

Pre-Conditioning of Electrode Contact Faces

FIGS. 37 and 38 illustrates a further electrode construction in accordance with further inventive aspects of the workpiece support systems and methods described herein. FIG. 37 shows distal end portions of an electrode 614. Electrode 614 is otherwise similar to electrode 681 described above. At the distal end of electrode finger 614 is a distal exposed surface 615 is made from a suitable material, such as stainless steel or tungsten. A dielectric sheath 616 is advantageously provided along the exterior portions of the electrode adjacent to the distal exposed surface 615.

FIG. 38 shows the electrode 614 with a deposited contact face plating layer 618 formed thereon. The layer 618 is preferably a layer made from the same or a very similar material as is being plated onto the semiconductor workpieces with which electrode 614 is to be used. For example, if copper is being plated onto the semiconductor device, then the layer 618 is a layer plated from the same plating bath or from a plating bath which will provide a layer 618 which is the same or very similar to the constituency of the copper deposited onto the semiconductor device being plated. In a preferred manner of carrying out this invention, the exposed distal surfaces 615 are placed into a plating bath and electrical current is conducted through the bath and distal end of the electrode 614. This causes a plating action to occur which deposits the layer 618. The resulting layer is preferably at least 1 micron in thickness, more preferably in the approximate range of 1–100 microns thick.

This method and resulting construction results in a pre-conditioned electrode contact surface which is of the same or very similar material as plated onto the semiconductor device during the later plating operation. The use of the same or similar materials prevents galvanic or other types of chemical reactions from developing due to dissimilarity of the metals involved.

The invention further includes additional methods for plating metals onto the surface of a semiconductor workpiece. The preferred methods include contacting a surface of the semiconductor workpiece with an electrode at a contact face forming a part of the electrode. The contact face is covered or substantially covered by a contact face plating layer. The contact face plating layer is formed from a contact face plating material which is the same or chemically similar to thee plating material which is to be plated onto the semiconductor workpiece during processing. The methods also preferably include submersing or otherwise wetting a processed surface of the workpiece into a plating bath or using a plating liquid or fluid. Other means for depositing the plating material as a contact face layer may alternatively be used. The methods further include electroplating workpiece plating material onto the semiconductor workpiece by passing electrical current between the workpiece and the electrode having such contact face plating layer. The methods are of particular advantage in the plating of copper onto semiconductors using a copper contact face plating layer.

Methods Using Workpiece-Engaging Electrode Assembly with Sealing Boot

Figure 39:
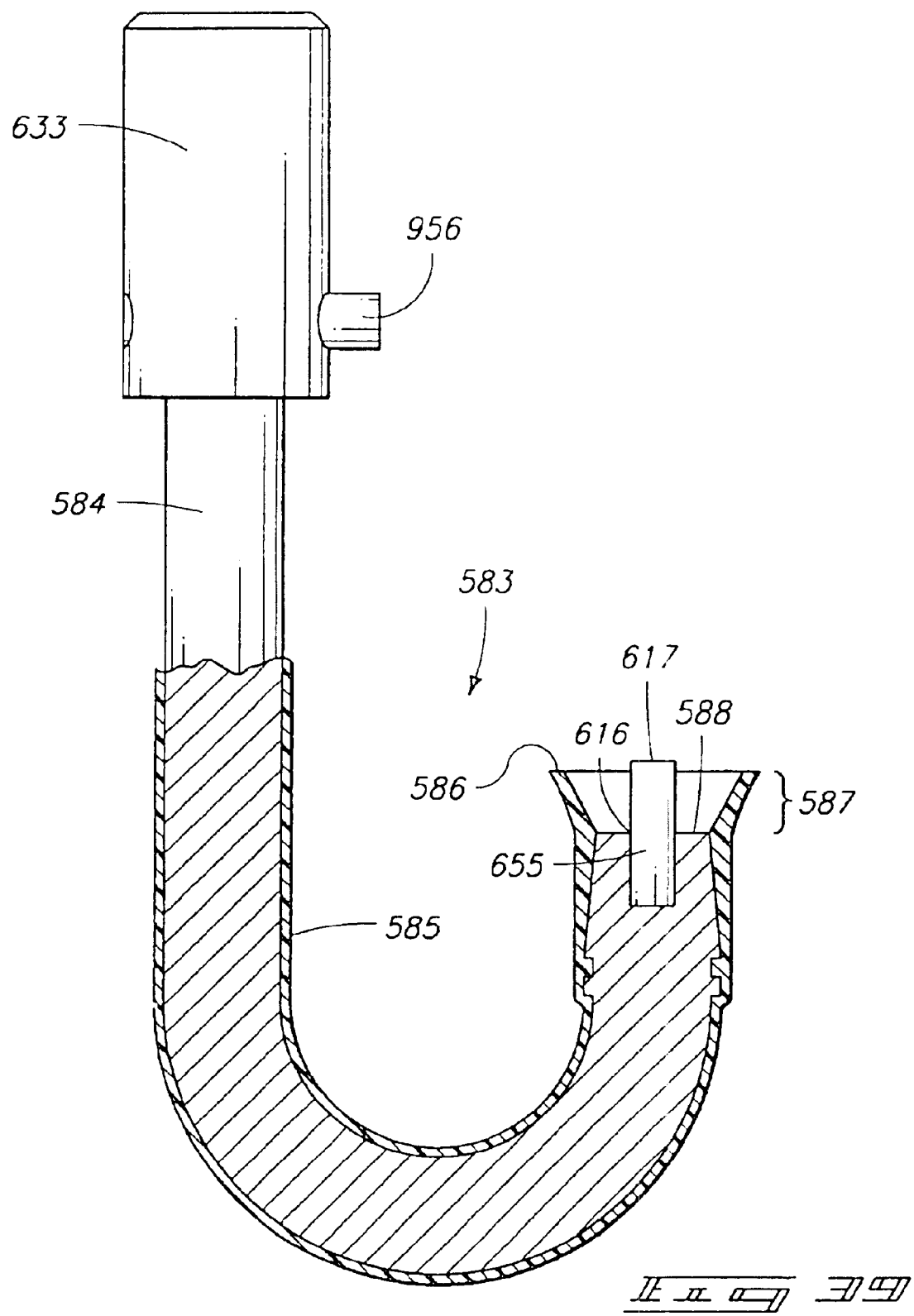
FIG. 39 is a longitudinal sectional view of one preferred form of electrode assembly which can be used in the second embodiment processing system.

FIG. 39 shows a further electrode finger 583 which has features similar to 651 and such similar features are identified with the same reference numbers. Electrode finger 583 differs from finger 651 in that the electrode shaft 584 is covered between the head 633 to the distal end of the electrode shaft with a cover or boot 585. Boot 585 is preferably made in a manner which provides a continuous cover from near the electrode head 633 to a distal contact lip 586. The boot includes additional features adjacent the contact insert part 655. More specifically, the boot includes a skirt portion 587 which extends above the electrode shaft distal end surface 588. The contact face 617 of the insert part 655 is preferably about even with the distal contact lip 586 which is formed upon the end of the skirt portion 587. The skirt portion serves as a deformable seal which comes into contact with a surface of a wafer or other semiconductor workpiece being contacted.

Figure 40:
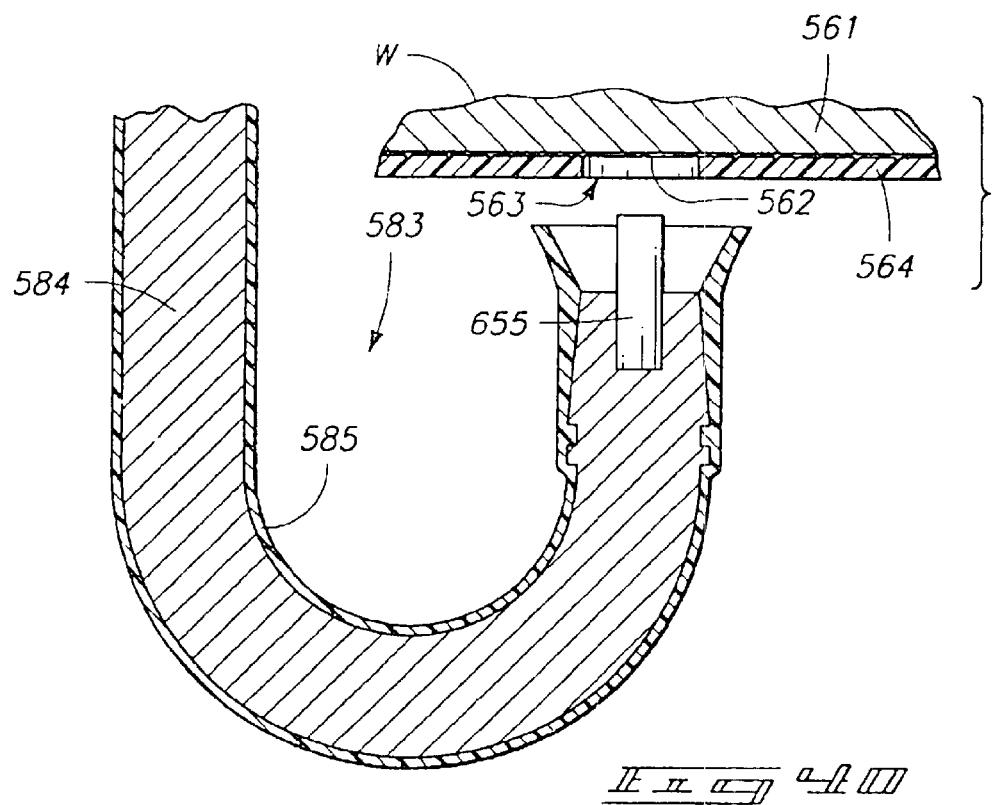
FIG. 40 is a sectional view showing the electrode assembly of FIG. 39 in position ready to engage a semiconductor workpiece.
Figure 41:
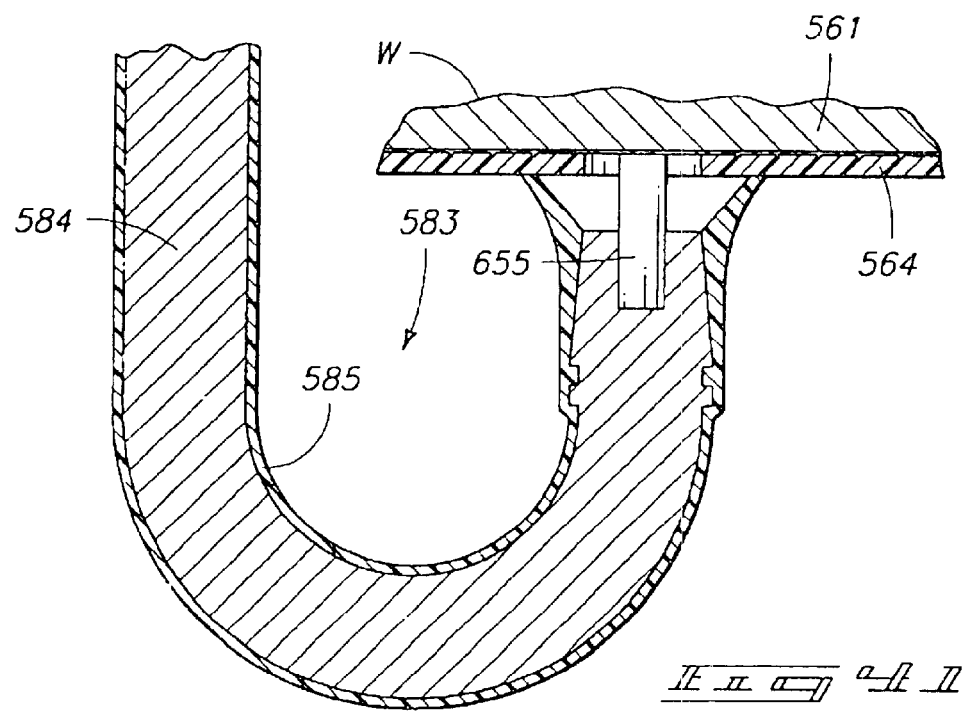
FIG. 41 is a sectional view showing the electrode assembly of FIG. 39 in an engaged position with a semiconductor workpiece.

FIGS. 40 and 41 illustrate novel methods which advantageously utilize the improved features of electrode finger 583. The methods involve plating metals onto the surface of semiconductor workpieces, specifically onto a semiconductor wafer W which has a substrate or other subjacent layer 561 which has been previously provided with a thin metallic seed layer 562 which is shown by a heavy black line in that figure. A via or other opening 563 exists in a photoresist layer 564 which overlies the substrate and seed layers.

FIG. 40 shows the electrode 583 poised in a disengaged position in preparation for contact with the surface. FIG. 41 shows the electrode 583 retracted against the surface of the workpiece. In the engaged position the contact face 617 is extended through the opening 563 and into direct electrical contact with exposed areas of the seed layer 562 which are not covered by the layer of photoresist or other covering layer. A seal is formed by depressing the skirt 587 and attached lip 586 against the outer surface of the photoresist layer 564.

The novel methods include selecting an electrode assembly having desired features, such the features of electrode finger 583. More specifically, the selecting step preferably includes selecting an electrode assembly having an electrode contact which is surrounded by an electrode boot or other sealing member. The methods also include engaging coated surface portions, such as photoresist layer 564, with the sealing member or boot. The sealing can occur about a continuous peripheral sealing line, such as defined by the engagement of lip 586 against the photoresist surface. It is important to engage the lip against the photoresist surface and not against the seed layer 562 because sealing against the seed layer can cause erosive or corrosive effects to occur at or near the line or area of engagement of the boot with the seed layer. Such erosive or corrosive actions can cause the seed layer to become discontinuous or even totally isolated. A discontinuous or isolated contact region will lead to electroplating failure because the needed current will not be communicated in an even manner to the areas adjacent to the electrode which need current to accomplish plating. The engagement of the seal against the coating causes a sealed space to be enclosed within the seal by the electrode boot and the processed surface of the workpiece.

The novel methods further include enclosing a via or other opening within the seal. The via is present on the processed surface and has associated exposed seed layer portions therein for allowing electrical contact to be made. The via is needed to allow direct contact between the contact face of the electrode finger assembly and the seed layer which is used to communicate electrical current across the wafer for electroplating a metal thereonto. Thus, the methods further include contacting the seed layer through the via with the electrode contact to form an electrically conductive connection between the electrode assembly and the seed layer. This contacting step is advantageously performed using a contact face which bears upon the seed layer and is enclosed with the sealed space. Other desirable attributes explained hereinabove in connection with other electrodes can also be utilized to advantage in performing this process.

The methods still further include wetting the processed surface of the workpiece with a plating or other processing liquid. This is typically done by lowering the wafer holder into position to bring the outer, processed surface of the wafer into direct contact with a plating liquid held in a plating bath, such as described elsewhere herein in additional detail.

The methods also preferably include passing electrical current through the electrode and plating bath to cause electroplating to occur upon exposed seed layer areas of the processed surface. Such exposed seed layer areas may be trenches, vias or other features where the photoresist layer 564 is not, present to cover the seed layer 562. The electrical current causes electroplating to occur on such exposed seed layer areas.

Still further, the methods preferably include excluding plating or other processing liquid from the sealed space to substantially reduce or eliminate plating or other action in the area immediate adjacent to the contact with the electrode.

The methods described above are of particular relevance to plating copper onto semiconductors.

Plating Bowl Assembly

FIG. 42 shows an electroplating bowl assembly 303. The process bowl assembly consists of a process bowl or plating vessel 316 having an outer bowl side wall 617, bowl bottom 319, and bowl rim assembly 314. The process bowl is preferably circular in horizontal cross-section and generally cylindrical in shape although other shapes of process bowl may be possible.

The invention further advantageously includes a cup assembly 320 which is disposed within process bowl vessel 316. Cup assembly 320 includes a fluid cup portion 321 having a cup side 322 and a cup bottom 323. As with the outer process bowl, the fluid cup 321 is preferably circular in horizontal cross-section and cylindrical in shape. The cup assembly also has a depending skirt 371 which extends below the cup bottom 323 and has flutes 372 open therethrough for fluid communication and release of any gas that might collect as the chamber below fills with liquid. The cup assembly can be made using upper and lower portions which couple together at a cup main joint 387. The cup is preferably made from polypropylene or other suitable material, which is advantageously dielectric.

The lower opening in the cup bottom wall is connected to a riser tube 361 which is adjustable in height relative thereto by a threaded connection. The riser tube seals between the bottom wall 319 of the process bowl and the cup bottom 323. The riser tube is preferably made from polypropylene or other suitable dielectric material. A fitting 362 connects the riser tube 361 and the fluid inlet line 325 to allow adjustment of the anode vertical position. The fitting 362 can accommodate height adjustment of both the riser tube and inlet line 325. The inlet line is made from a conductive material, such as titanium and is used to conduct electrical current to the anode 324, as well as supply fluid to the cup.

Process fluid is provided to the cup through fluid inlet line 325. The fluid inlet line rises through riser tube 361 and bowl bottom opening 327 and through cup fluid inlet openings 324. Plating fluid fills the cup portion 321 through opening 324 as supplied by a plating fluid pump (not shown) or other suitable supply which provides the fluid under at least some pressure for delivery.

The upper edge of the cup side wall 322 forms a weir which determines the level of plating liquid within the cup. Excess fluid pours over this top edge surface into the overflow chamber 345. The fluid held in the overflow chamber 345 is sensed by two level detectors 351 and 352. One level detector is used to sense a desired high level and the other is used to sense an overfull condition. The level of liquid is preferably maintained within a desired range for stability of operation. This can be done using several different outflow configurations. A preferred configuration is to sense the high level using detector 351 and then drain fluid through a drain line as controlled by a control valve. It is also possible to use a standpipe arrangement (not illustrate), and such is used as a final overflow protection device in the preferred plating station 303. More complex level controls are also possible.

The outflow liquid from chamber 345 is preferably returned to a suitable reservoir. The liquid can then be treated with additional plating chemicals or other constituents of the plating or other process liquid and used again.

The plating bowl assembly 303 further includes an anode 334. In the preferred uses according to this invention, the anode is a consumable anode used in connection with the plating of copper or other metals onto semiconductor materials. The specific anode will vary depending upon the metal being plated and other specifics of the plating liquid being used. A number of different consumable anodes which are commercially available may be used as anode 334.

FIG. 42 also shows a diffusion plate 375 provide above the anode 334 for rendering the fluid plating bath above the diffusion plate with less turbulence. Fluid passages are provided over all or a portion of the diffusion plate to allow fluid communication therethrough. The height of the diffusion plate is adjustable using three diffuser height adjustment mechanisms 386 and secured by three mounting fasteners 389.

Plating Anode Shield

The invention also includes an anode shield 393 which can be secured to the consumable anode 334 using anode shield fasteners 394. The anode shield and anode shield fasteners are preferably made from a dielectric material, such as polyvinylidene fluoride or polypropylene. The anode shield is advantageously about 2–5 millimeters thick, more preferably about 3 millimeters thick.

The anode shield serves to electrically isolate and physically protect the back side of the anode. It also reduces the consumption of organic plating liquid additives consumed. Although the exact mechanism may not be known at this time, the anode shield is believed to prevent disruption of certain materials which develop over time on the back side of the anode. If the anode is left unshielded the organic chemical plating additives are consumed at a significantly greater rate. With the shield in place these additive are consumed less. The shield is preferably positioned on the anode so as to shield it from direct impingement by the incoming plating liquid.

The invention thus also include methods for plating which include other method steps described herein in combination with shielding a consumable anode from direct flow of plating liquids using a dielectric anode shield.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An apparatus for electroplating a metal onto a surface of a wafer pursuant to fabricating microelectronic components on the wafer, the apparatus comprising:

a reactor comprising
   a chamber adapted to hold an electrolyte, and
   one or more contacts arranged to conduct electroplating power to the wafer through a respective wafer contact portion of each of the one or more contacts;
the reactor including at least first and second modes of operation,
   the wafer contact portion of each of the one or more contacts being electroplated with a metal layer using the electrolyte in the first mode of operation, the wafer contact portion being electroplated in the absence of wafer contact,
   the wafer contact portion conducting electroplating power to the wafer to electroplate a metal from the electrolyte onto the surface of the wafer in the second mode of operation.

2. The apparatus of claim 1 wherein the electrolyte is used to electroplate a metal that principally comprises copper during the first and second modes of operation.

3. A method for electroplating a metal onto a surface of a wafer pursuant to fabricating microelectronic components on the wafer, the method comprising:

providing a reactor comprising
   a chamber adapted to hold an electrolyte, and
   one or more contacts arranged to conduct electroplating power to the wafer through a respective wafer contact portion of each of the one or more contacts;
operating the reactor in at least first and second modes of operation,
   the wafer contact portion of each of the one or more contacts being electroplated with a metal layer using the electrolyte in the first mode of operation, the wafer contact portion being electroplated in the absence of wafer contact,
   the wafer contact portion conducting electroplating power to the wafer to electroplate a metal from the electrolyte onto the surface of the wafer in the second mode of operation.

4. The method of claim 3 wherein the electrolyte is used to electroplate a metal that principally comprises copper during the first and second modes of operation.

* * * * *

UNITED STATES PATENT AND TRADEMARK OFFICE
CERTIFICATE OF CORRECTION

PATENT NO. : 6,776,892 B1
DATED : August 17, 2004
INVENTOR(S) : Thomas L. Ritzdorf et al.

It is certified that error appears in the above-identified patent and that said Letters Patent is hereby corrected as shown below:

Column 17,
Line 5, "describes" should be -- described --;
Line 55, "in" should be -- on --;

Column 18,
Line 42, "Read" should be -- Head --;

Column 19,
Line 11, "ad" should be -- and --;

Column 25,
Line 64, "General" should be -- Generally --;

Column 27,
Line 45, "being" should be -- bearing --;

Column 37,
Line 22, "overfull" should be -- overfill --;

Signed and Sealed this

Twenty-fourth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,776,892 B1
DATED : August 17, 2004
INVENTOR(S) : Thomas L. Rizdrof et al.

It is certified that error appears in the above-identified patent and that said Letters Patent is hereby corrected as shown below:

Column 17,
Line 5, "describes" should be -- described --;
Line 55, "in" should be -- on --;

Column 18,
Line 42, "Read" should be -- Head --;

Column 19,
Line 11, "ad" should be -- and --;

Column 25,
Line 64, "General" should be -- Generally --;

Column 27,
Line 45, "being" should be -- bearing --;

Column 37,
Line 22, "overfull" should be -- overfill --;

Signed and Sealed this

Thirty-first Day of May, 2005

JON W. DUDAS
*Director of the United States Patent and Trademark Office*